(12) United States Patent
Asakura et al.

(10) Patent No.: US 6,198,128 B1
(45) Date of Patent: Mar. 6, 2001

(54) METHOD OF MANUFACTURING A SEMICONDUCTOR DEVICE, AND SEMICONDUCTOR DEVICE

(75) Inventors: Hisao Asakura, Ome; Yoshitaka Tadaki, Hannou; Toshihiro Sekiguchi, Hidaka; Ryo Nagai, Mizuho-machi; Masafumi Miyamoto, Tachikawa; Masayuki Nakamura; Shinichi Miyatake, both of Ome; Tsuyuki Suzuki, Akishima; Masahiro Hyoma, Kodaira, all of (JP)

(73) Assignees: Hitachi, Ltd., Tokto; Hitachi ULSI Systems Co., Ltd., Tokyo, both of (JP)

( * ) Notice: Subject to any disclaimer, the term of this patent is extended or adjusted under 35 U.S.C. 154(b) by 0 days.

(21) Appl. No.: 09/390,662

(22) Filed: Sep. 7, 1999

(30) Foreign Application Priority Data

Sep. 4, 1998 (JP) .................................. 10-250865

(51) Int. Cl.$^7$ .................................. H01L 29/72
(52) U.S. Cl. .......... 257/337; 257/346; 257/365; 257/401; 438/163; 438/180; 438/217; 438/525

(58) Field of Search .................. 257/337, 346, 257/365, 401; 438/163, 180, 217, 525

(56) References Cited

U.S. PATENT DOCUMENTS 5,780,328 * 7/1998 Fukuda .................................. 257/337

FOREIGN PATENT DOCUMENTS 6350040  12/1994 (JP) .

* cited by examiner

Primary Examiner—Edward Wojciechowicz
(74) Attorney, Agent, or Firm—Antonelli, Terry, Stout & Kraus, LLP

(57) ABSTRACT

In a case where an impurity for suppressing the short channel effect of MISFETs is introduced into a semiconductor substrate obliquely to the principal surface thereof, gate electrodes adjacent to each other are arranged so that the impurity to be introduced in directions crossing the gate electrodes may not be introduced into the part of the semiconductor substrate lying between the gate electrodes, and the source region of the MISFETs is arranged in the part between the gate electrodes.

26 Claims, 59 Drawing Sheets

METHOD OF MANUFACTURING A SEMICONDUCTOR DEVICE, AND SEMICONDUCTOR DEVICE

FIELD OF THE INVENTION

The present invention relates to a method of manufacturing a semiconductor device, and semiconductor device technology. More particularly, it relates to techniques which are effective when applied to a method of manufacturing a semiconductor device and semiconductor device technology wherein field effect transistors are provided on a semiconductor substrate.

BACKGROUND OF THE INVENTION

It is effective to reduce the dimensions of field effect transistors, for enhancing the packaging density and driving capabilities thereof. In recent years, therefore, the microfabrication of the field effect transistors has been rapidly promoted. On the other hand, however, a supply voltage to each of the field effect transistors remains constant, and hence, the intensity of an electric field within the element increases. This has resulted in the occurrence of problems exerting bad influences on the characteristics of the element, such as a short channel effect. The short channel effect is a phenomenon in which, due to reduction in the channel length of the field effect transistor, the drain voltage of the transistor affects even a part lying directly under the gate electrode thereof, so that the potential of the surface of a semiconductor substrate is lowered to incur various evil effects such as fluctuation (fall) in the threshold voltage of the transistor and decrease in the effective channel length thereof. When the short channel effect has intensified more, so-called "punch-through" in which the drain current of the transistor fails to be controlled by the gate voltage thereof takes place to pose the problem of increase in the leakage current between the source and drain of the transistor. It has been known that the punch-through gives rise to degradation in the retention of storage in, for example, the transfer gate of a DRAM (Dynamic Random Access Memory). A technique which has been studied for avoiding the problems is, for example, one wherein in order to suppress the short channel effect, heavily-doped semiconductor regions (hereinbelow, termed "pocket regions") of the same conductivity type as that of the impurity of the channel of a field effect transistor are provided at those end parts of the source region and drain region of the transistor which are near to the channel. Incidentally, a technique for providing the pocket regions is stated in, for example, U.S. Pat. No. 5,780,328.

SUMMARY OF THE INVENTION

As stated above, the provision of pocket regions is generally effective for ensuring the operating reliability of a micro field effect transistor. The inventors, however, have found out the problem that the adoption of such a structure hinders the highly dense arrangement of elements and wiring lines due to packaging densities heightened more and more or the change of the structure of a gate electrode.

Concretely, when the interval of adjacent elements is very narrow in the case of providing the pocket regions, an impurity for suppressing the short channel effect, which is to be introduced into a region for forming a field effect transistor between the adjacent elements is hampered by the gate electrode of another field effect transistor adjoining the first-mentioned transistor, and it fails to reach that part of a semiconductor substrate which underlies the end part of the gate electrode of the first-mentioned field effect transistor.

With the technique for introducing the short-channel-effect suppressing impurity, accordingly, the interval of the gate electrodes adjacent to each other must be widened to some extent. In particular, a structure wherein each gate electrode is constituted by a plurality of conductor films or is overlaid with a cap insulator film has been adopted in recent years. In that case, the gate electrode (including the cap insulator film) becomes higher, and hence, the interval of the gate electrodes adjacent to each other is inevitably widened more. Besides, the layout of direct peripheral circuits, for example, sense amplifiers in a DRAM is determined by the layout pitch of memory cells. Therefore, the machining dimensions and layout intervals of the direct peripheral circuits must be set smaller than those of other peripheral circuits and logic circuits formed on the identical semiconductor substrate. Accordingly, the implantation of impurity ions for forming the pocket regions becomes difficult, and the further microfabrication of the elements is hindered.

Besides, the inventors made investigation into known examples of a technique for introducing an impurity for the suppression of the short channel effect, on the basis of the result of the present invention. Then, it has been found that the technique of this sort is stated in, for example, the official gazette of Japanese Patent Laid-open No. 350040/1994. The technique disclosed here is such that, before the impurity for suppressing the short channel effect is introduced into a semiconductor substrate, a photoresist film having openings by which gate electrodes and the surroundings are denuded is provided so as to prevent the short-channel-effect suppressing impurity from being introduced into the regions of the semiconductor substrate within predetermined ranges from the gate electrodes, owing to the photoresist film and the gate electrodes. In this way, transistors each having pocket layers and transistors each having no pocket layers are formed to endow the transistors with different threshold voltages in accordance with the presence or absence of the pocket layers.

An object of the present invention is to provide a technique which can enhance the packaging density of elements without incurring degradation in the performances of field effect transistors.

The above and other objects and novel features of the present invention will become apparent from the description of this specification when read in conjunction with the accompanying drawings.

Fundamental and typical aspects of performance of the present invention are briefly summarized as follows:

A method of manufacturing a semiconductor device according to the present invention consists in that, owing to the shadowing effect of gate electrodes adjacent to each other, an impurity for suppressing the short channel effect of field effect transistors is prevented from being introduced into the part of a semiconductor substrate as lies between the gate electrodes adjacent to each other.

According to the present invention, a method of manufacturing a semiconductor device wherein a semiconductor substrate is provided with a plurality of field effect transistors, comprises the steps of:

(a) forming gate electrodes of the plurality of field effect transistors on the semiconductor substrate, the gate electrodes including a first gate electrode which has a first side as well as a second side crossing the first side, and a second gate electrode which has a third side as well as a fourth side crossing the third side; and (b) thereafter introducing an impurity into and aslant said semiconductor substrate, the impurity serving to suppress a short channel effect of said field effect transistors;

said first gate electrode and said second gate electrode being formed in a state where they are adjacent to each other with the first side and the third side confronting each other, in order that said impurity for suppressing the short channel effect, which is entered into said semiconductor substrate in first directions crossing said first side and said third side when viewed in plan, may be hindered by said first gate electrode and said second gate electrode from being introduced into a first region of said semiconductor substrate as lies between said first gate electrode and said second gate electrode.

In addition, according to the present invention, a method of manufacturing a semiconductor device wherein a semiconductor substrate is provided with a plurality of field effect transistors, comprises the steps of:

(a) forming gate electrodes of the plurality of field effect transistors on the semiconductor substrate, the gate electrodes including a first gate electrode which has a first side as well as a second side crossing the first side, and a second gate electrode which has a third side as well as a fourth side crossing the third side; and (b) thereafter introducing an impurity into and aslant said semiconductor substrate, the impurity serving to suppress a short channel effect of said field effect transistors;

said first gate electrode and said second gate electrode being formed in a state where they are adjacent to each other with the first side and the third side confronting each other, in order that said impurity for suppressing the short channel effect, which is entered into said semiconductor substrate in first directions crossing said first side and said third side when viewed in plan, may be hindered by said first gate electrode and said second gate electrode from being introduced into a first region of said semiconductor substrate as lies between said first gate electrode and said second gate electrode, and that said impurity may be introduced into a second region of said semiconductor substrate as interposes said first gate electrode between it and said first region when viewed in plan, and a third region of said semiconductor substrate as interposes said second gate electrode between it and said first region when viewed in plan.

Besides, in a method of manufacturing a semiconductor device according to the present invention, the semiconductor regions which are doped with said impurity for suppressing said short channel effect are not formed between respective channels of the first field effect transistor having said first gate electrode and the second field effect transistor having said second gate electrode and a source region which is common to said first field effect transistor and said second field effect transistor, and said semiconductor regions which are doped with said impurity for suppressing said short channel effect are formed between the respective channels and respective drain regions of said first field effect transistor and said second field effect transistor.

DESCRIPTION OF THE PREFERRED EMBODIMENTS

Now, the embodiments of the present invention will be described in detail with reference to the drawings. Throughout the drawings illustrative of the embodiments, the same symbols are assigned to parts having the same functions, which shall be omitted from repeated description.

Besides, in the ensuing description, semiconductor regions formed in a semiconductor substrate for the purpose of suppressing the short channel effect shall be termed "pocket regions". Also, a MISFET (Metal Insulator Semiconductor Field Effect Transistor) of n-channel type shall be abbreviated to "nMISFET", and a MISFET of p-channel type to "pMISFET".

(Embodiment 1)

Before elucidating the technical idea of the present invention, a technique for forming MISFETs as was studied by the inventors will be explained in conjunction with FIGS. 60(a) and 60(b) and FIGS. 61(a) and 61(b). By the way, in FIGS. 60(a) and 61(a), respective regions doped with impurities are hatched with different net patterns. This is intended to readily understand the drawings, and the net patterns do not indicate the levels of impurity concentrations.

Figure 60A:
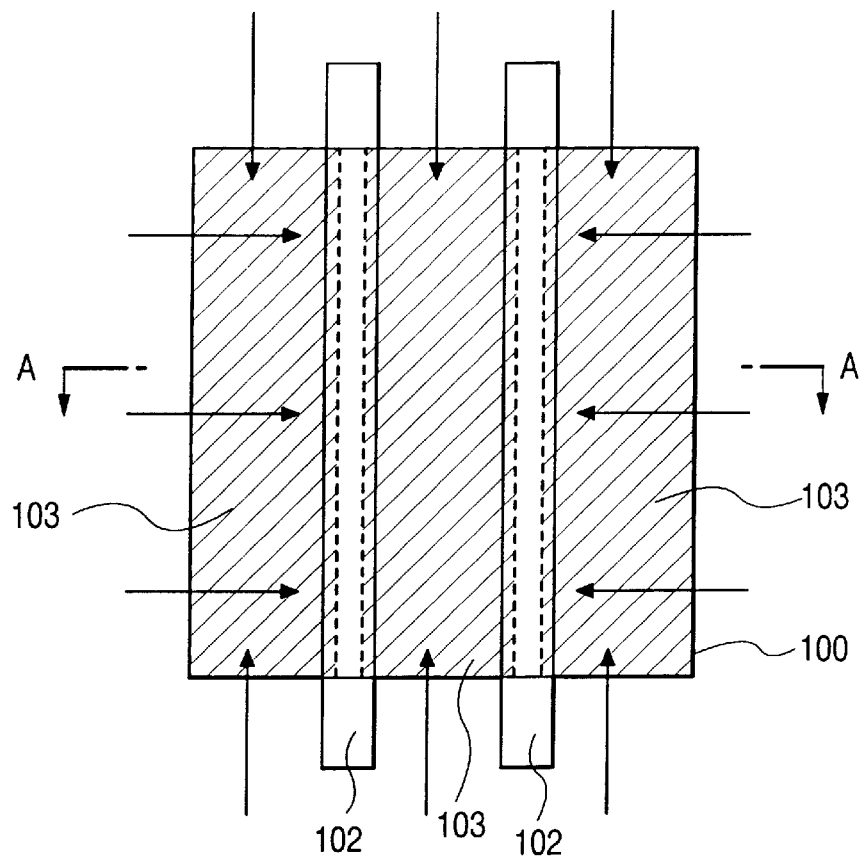
FIG. 60(*a*) is a plan view of essential portions at the step of manufacturing a semiconductor device as was studied by the inventors, while FIG. 60(*b*) is a sectional view taken along line A—A indicated in FIG. 60(*a*)
Figure 60B:
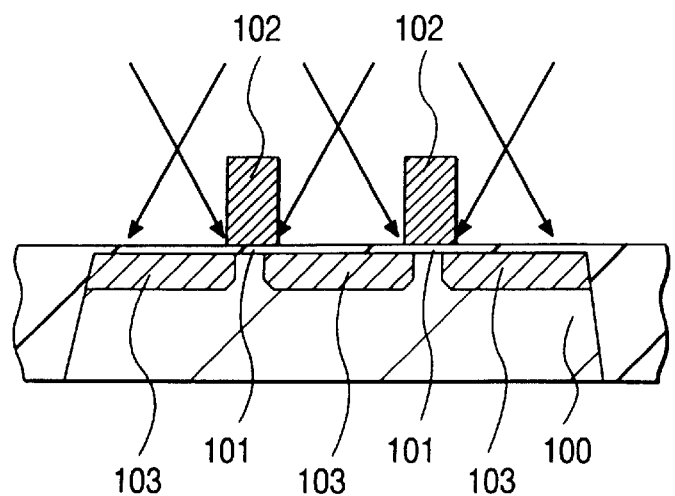

First, FIGS. 60(a) and 60(b) illustrate a plan view of a semiconductor substrate 100 at the step of introducing an impurity for suppressing the short channel effect, and a sectional view taken along line A—A indicated in FIG. 60(a), respectively. Two gate electrodes 102, each of which is patterned in the shape of a belt when viewed in plan, are arranged in parallel with each other on the semiconductor substrate 100 through a gate insulator film 101. At the step of introducing the impurity, this impurity is introduced in four directions crossing to each other in plan as indicated by arrows in FIG. 60(a) (in directions parallel to the extending directions of the gate electrodes 102, and directions across the extending directions), and besides, obliquely to the principal surface of the semiconductor substrate 100 (namely, aslant the semiconductor substrate 100) in. section as indicated by arrows in FIG. 60(b). Thus, pocket regions 103 are formed in the semiconductor substrate 100. Since the impurity is introduced obliquely to the principal surface of the semiconductor substrate 100, the pocket regions 103 are formed so that their end parts may come under the end parts of the gate electrodes 102. When viewed in plan, the patterns of the pocket regions 103 underlap those of the gate electrodes 102.

Figure 61A:
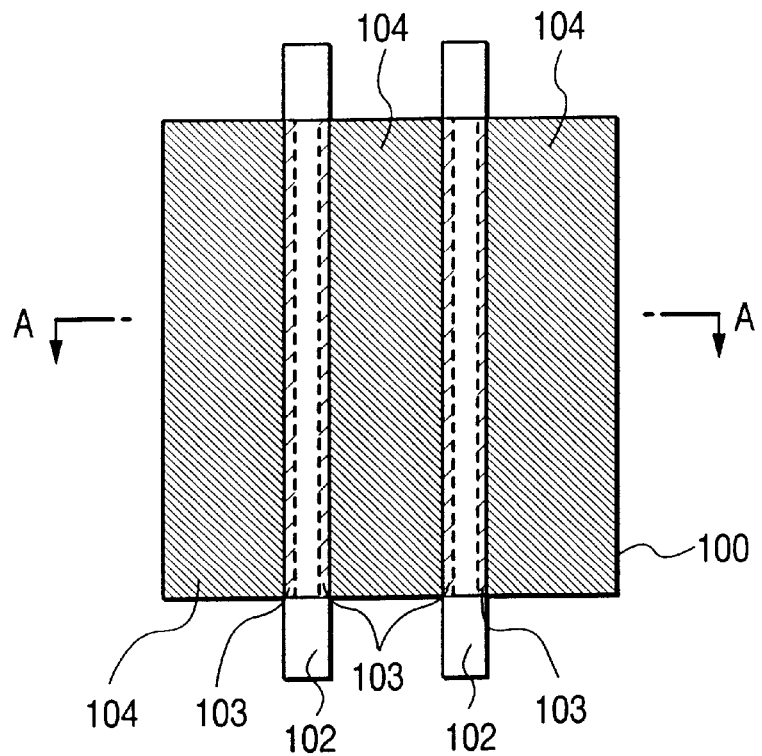
FIG. 61(*a*) is a plan view of essential portions at the step of manufacturing the semiconductor device, subsequent to the step shown in FIGS. 60(*a*) and 60(*b*), as was studied by the inventors, while FIG. 61(*b*) is a sectional view taken along line A—A indicated in FIG. 61(*a*).
Figure 61B:
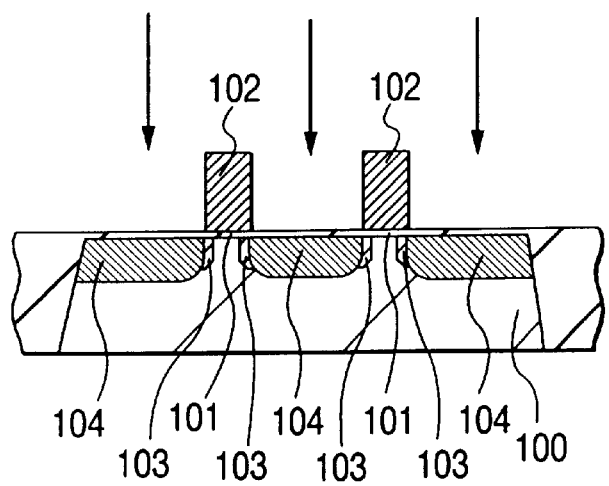

FIGS. 61(a) and 61(b) illustrate a partial plan view of the semiconductor substrate 100 at the subsequent step of introducing an impurity for forming the sources and drains of MISFETs, and a sectional view taken along line A—A indicated in FIG. 61(a), respectively. At the step of introducing the impurity, this impurity is introduced by employing the gate electrodes 102 as a mask, and besides, perpendicularly to the principal surface of the semiconductor substrate 100 as indicated by arrows in FIG. 61(b). Thus, semiconductor regions 104 for the sources and drains are formed in the semiconductor substrate 100 in self-alignment with the gate electrodes 102. Since the gate electrodes 102 are used as the mask, the semiconductor regions 104 for the sources and drains can be formed into a state where their end parts do not underlie the end parts of the gate electrodes 102 and where the pocket regions 103 are left behind at those end parts of the semiconductor regions 104 for both the sources and drains which are near to the channels of the MISFETs (alternatively, the semiconductor regions 104 can be formed to the extent that the pocket regions 103 are left behind even when the impurity of the regions 104 has been somewhat diffused under the end parts of the gate electrodes 102 by a later heat treatment). Thus, the short channel effect attendant upon the microfabrication of the MISFETs can be suppressed to enhance the operating reliability of the MISFETs.

Meanwhile, at the step of introducing the impurity for suppressing the short channel effect, the impurity is introduced obliquely to the principal surface of the semiconductor substrate 100 so that the pocket regions 103 may be formed at the channel-side end parts of the semiconductor regions 104 for the sources and drains of the MISFETs. For this purpose, however, the interval of the gate electrodes 102 adjacent to each other cannot set very narrow. The reason therefor is that, when the interval is very narrow, the short-channel-effect suppressing impurity to be introduced into the region for forming one MISFET between the adjacent gate electrodes 102 is hampered by the gate electrode 102 of the other MISFET adjoining one MISFET, and it fails to reach that part of the semiconductor substrate 100 which underlies the end part of the gate electrode 102 of one MISFET. With the technique for introducing the short-channel-effect suppressing impurity, accordingly, the interval of the gate electrodes 102 adjacent to each other must be widened to some extent, considering that the gate electrodes 102 might be shadowed (due to a shadowing effect). In particular, a structure wherein each gate electrode 102 is constituted by a plurality of conductor films or is overlaid with a cap insulator film has been adopted in recent years. In that case, the gate electrode 102 (including the cap insulator film) becomes higher, and hence, the interval of the gate electrodes 102 adjacent to each other is inevitably widened more. In short, the inventors have found out the problem that the structure intended to ensure the operating reliability of the micro MISFETs hinders the highly dense arrangement of the elements and wiring lines as apparently seems to have quite no relation with the structure, on account of the smaller dimensions of the MISFETs, the change of the gate electrode structure, etc.

The inventors accordingly studied on the contradictory conditions that, when the operating reliability of the micro MISFETs is intended to be ensured, the highly dense arrangement of the elements is hindered, and that, when a preference is afforded to the highly dense arrangement of the elements and wiring lines, the operating reliability sometimes degrades. As a result, the technical idea of the present invention to be elucidated below has been reached. It will be described in conjunction with FIGS. 1(a) thru 3. By the way, in FIGS. 1(a) and 2(a), respective regions doped with impurities are hatched with different net patterns. This is intended to readily understand the drawings, and the net patterns do not indicate the levels of impurity concentrations.

Figure 1A:
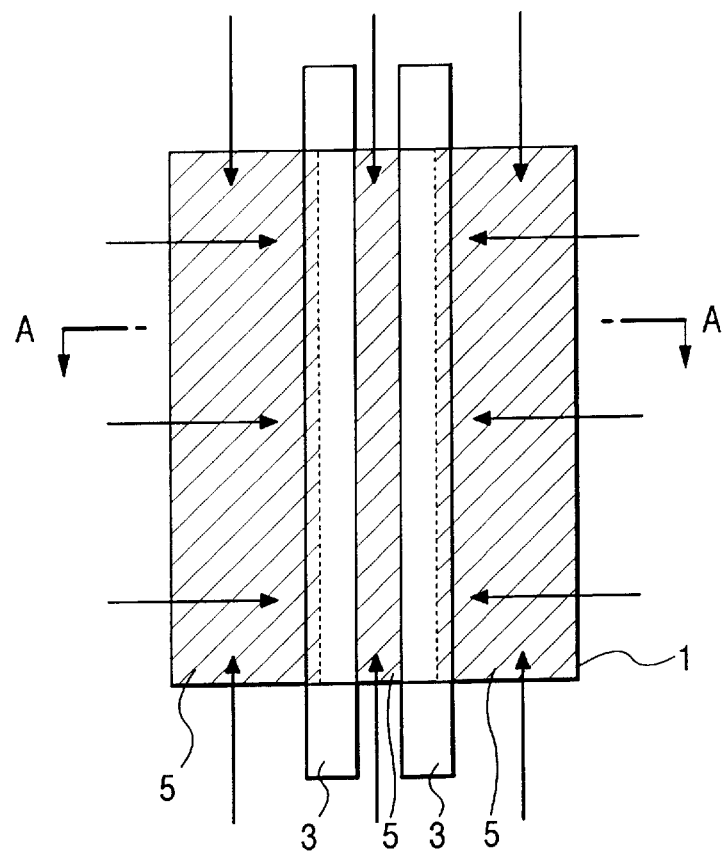
FIG. 1(*a*) is a plan view of the essential portions of a semiconductor substrate for elucidating the technical idea of the present invention, while FIG. 1(*b*) is a sectional view taken along line A—A indicated in FIG. 1(*a*)
Figure 1B:
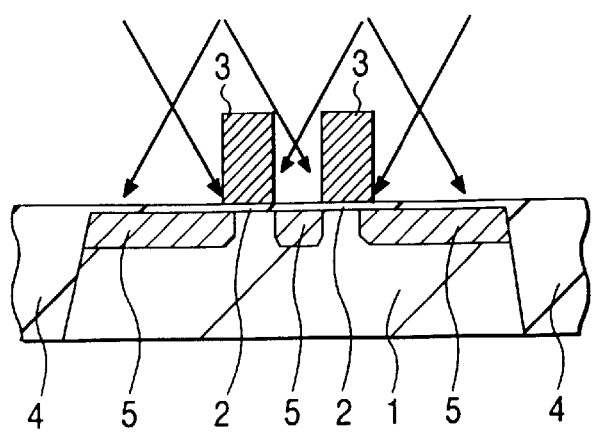

First, FIGS. 1(a) and 1(b) illustrate a plan view of the MISFET forming region of a semiconductor substrate 1 at the step of introducing an impurity for suppressing the short channel effect, and a sectional view taken along line A—A indicated in FIG. 1(a), respectively. Two gate electrodes 3, each of which is a patterned in the shape of a belt when viewed in plan, are arranged in parallel with each other on the semiconductor substrate 1 through a gate insulator film 2. Here, the interval of the gate electrodes 3 adjacent to each other is narrower than in the case illustrated in FIGS. 60(a)–61(b). That is, MISFETs are in the highly dense arrangement. In addition, the source forming region of the MISFETs is arranged between the adjacent gate electrodes 3, 3. That is, the two MISFETs adjoining each other are arranged so as to share the single source region. Incidentally, the drain forming regions of the respective MISFETs are separate from each other. Besides, numerals 4 in FIG. 1(b) indicate trench isolation portions.

Also at the step of introducing the impurity for the suppression of the short channel effect, the impurity is introduced in four directions in plan as indicated by arrows in FIG. 1(a), for example, in two directions crossing the extending directions (gate width directions) of the gate electrodes 3 (hereinbelow, termed "first directions") and in two directions parallel to the extending directions of the gate electrodes 3 (hereinbelow, termed "second directions"), and besides, obliquely to the principal surface of the semiconductor substrate 1 in section as indicated by arrows in FIG. 1(b). Thus, pocket regions 5 are formed in the semiconductor substrate 1. On this occasion, in the drain forming regions of the MISFETs, the end parts of the pocket regions 5 (the end parts in the directions of the channels of the MISFETs) come even under the end parts of the gate electrodes 3 (the end parts in the directions of the channels) in the gate width directions of the gate electrodes 3, as in the foregoing case depicted in FIG. 60(b). On the other hand, in the common source forming region of the MISFETs, the end parts of the pocket region 5 do not come under the end parts of the gate electrodes 3, unlike in the foregoing case. That is, the pattern of the pocket region 5 in the source forming region does not overlap those of the gate electrodes 3 in plan. Granted that the end parts of the pocket region 5 have come under the end parts of the gate electrodes 3, they underlie these end parts only to the extent of being cancelled by impurity diffusion from semiconductor regions for the sources and drains of the MISFETs to be explained later. The reason therefor is that, on the side of the source forming region, the impurity given in the second directions is introduced into the semiconductor substrate 1, whereas the impurity given in the first directions (the directions crossing the extending directions (gate width directions) of the gate electrodes 3) is shaded by the gate electrodes 3, failing to reach the semiconductor substrate 1 (refer to FIG. 1(b)). In other words, the pocket region 5 which is formed in the source forming region of the MISFETs at this stage has its widthwise dimensions determined by the interval of the gate electrodes 3, 3 adjacent to each other.

Figure 2A:
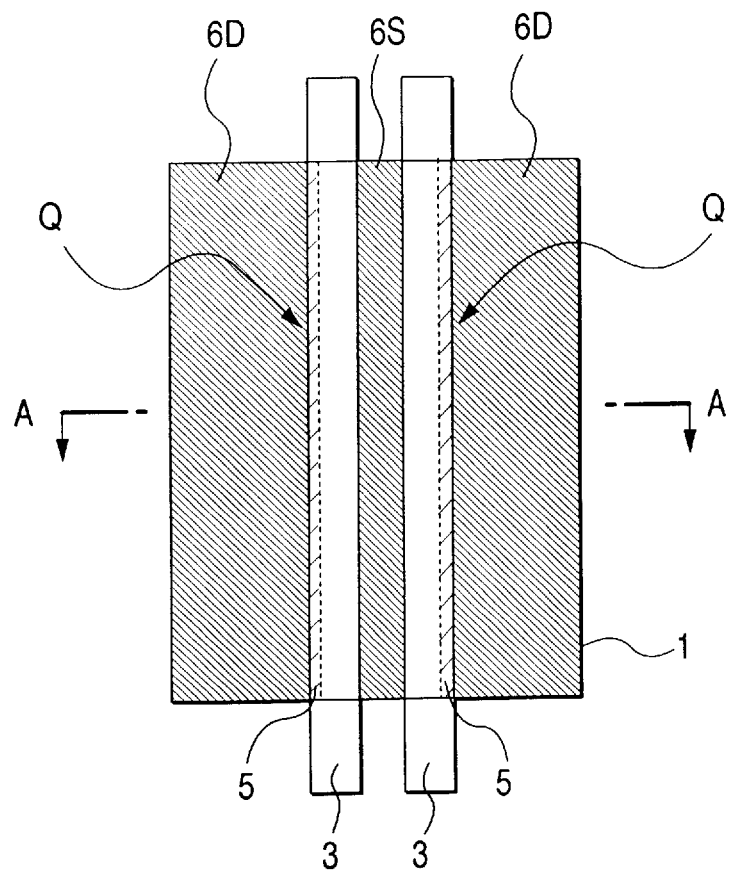
FIG. 2(*a*) is a plan view of the essential portions of the semiconductor substrate at a step subsequent to the step of FIGS. 1(*a*) and 1(*b*), for elucidating the technical idea of the present invention, while FIG. 2(*b*) is a sectional view taken along line A—A indicated in FIG. 2(*a*)
Figure 2B:
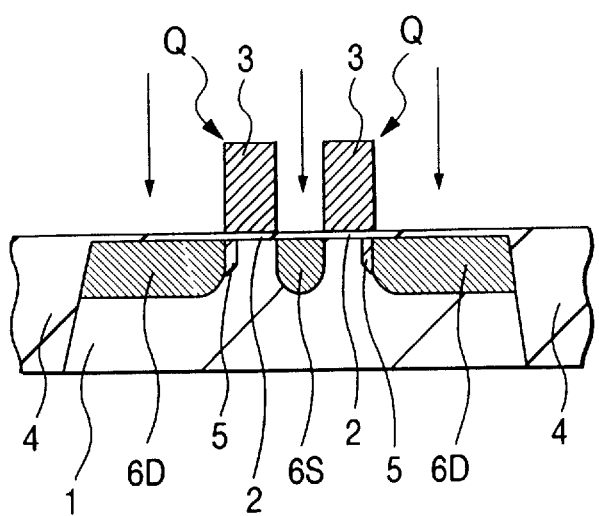

FIGS. 2(a) and 2(b) illustrate a plan view of the MISFET forming region of the semiconductor substrate 1 at the subsequent step of introducing an impurity for forming the sources and drains of MISFETs, and a sectional view taken along line A—A indicated in FIG. 2(a), respectively. At the step of introducing the impurity, this impurity is introduced by employing the gate electrodes 3 as a mask, and besides, perpendicularly to the principal surface of the semiconductor substrate 1 as indicated by arrows in FIG. 2(b). Thus, a semiconductor region 6S for the sources of the MISFETs Q and semiconductor regions 6D for the drains thereof are formed in the semiconductor substrate 1 at good positioning in self-alignment with the gate electrodes 3. Since, also on this occasion, the gate electrodes 3 are used as the mask, the end parts of the source semiconductor region 6S and the drain semiconductor regions 6D are prevented from coming under the end parts of the gate electrodes 3.

The semiconductor region 6S for the sources is common to both the MISFETs Q. In addition, the conductivity type of the pocket region formed in the source forming region is cancelled by the conductivity type of the impurity for forming the sources and drains as has been introduced into the source forming region. That is, the pocket region 5 is not left behind at those end parts of the source semiconductor region 6S which are near to the channels of the MISFETs Q. The reason therefor is that, on the side of the source forming region, the impurity for suppressing the short channel effect is not introduced under the end parts of the gate electrodes 3 at the step of introducing this impurity.

On the other hand, the pocket regions 5 are left behind at those end parts of the drain semiconductor regions 6D which are near to the channels of the MISFETs Q (alternatively, the drain semiconductor regions 6D can be formed to the extent that the pocket regions 5 are left behind even when the impurity of the regions 6D has been somewhat diffused under the end parts of the gate electrodes 3 by a later heat treatment). Accordingly, even when the pocket regions 5 are not provided on the side of the source semiconductor region 6S, depletion layers can be restrained from spreading from the sides of the drain semiconductor regions 6D, and hence, the operating reliability of the MISFETs Q is not spoilt. That is, according to the technical idea of the present invention, the adjacency interval of the gate electrodes 3 can be narrowed without spoiling the reliability of the operations of the MISFETs. Moreover, it is unnecessary to especially add any manufacturing step or adopt any complicated manufacturing step.

Figure 3:
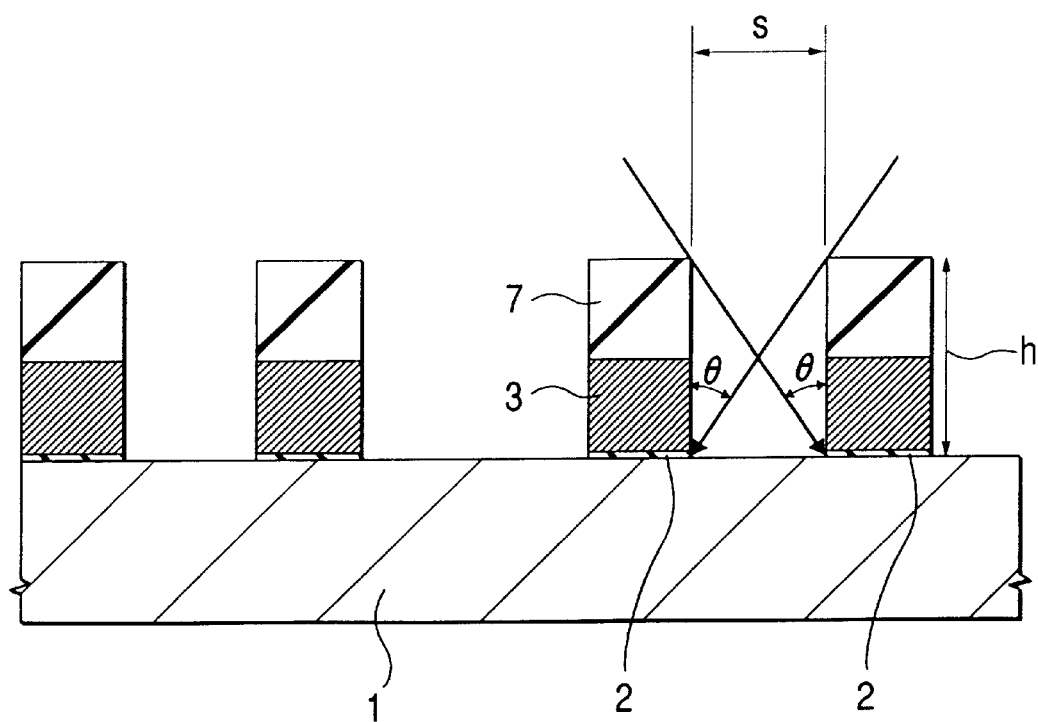
FIG. 3 is a schematic sectional view for explaining the relationship among the angle of introduction of an impurity, the height of a gate and the adjacency interval of gates in the technical idea of the present invention.

FIG. 3 illustrates the relationship among the angle of introduction θ of an impurity for suppressing the short channel effect, a gate electrode height h and the least adjacent gate interval a in the technical idea of the present invention. Here, the "angle of introduction θ of an impurity" signifies the angle of incidence of an impurity ion relative to an axis which is perpendicular to the principal surface of a semiconductor substrate 1. Besides, the "gate electrode height h" signifies a height from the principal surface of the semiconductor substrate 1 to the upper surface of a cap insulator film 7 by taking as an example a case where the cap insulator film 7 is formed on a gate electrode 3. Further, the "least adjacent gate interval s" signifies that smallest possible interval of the gate electrodes adjacent to each other at which the impurity for suppressing the short channel effect can be introduced into the parts of the semiconductor substrate 1 underlying the end parts of the gate electrodes 3.

The least adjacent gate interval a in the case where the impurity for the suppression of the short channel effect is implanted into the semiconductor substrate 1, can be expressed as s=h×tanθ in terms of the gate electrode height h and the angle of introduction θ of the impurity for suppressing the short channel effect. Accordingly, when the adjacency interval of the gate electrodes 3 adjacent to each other is set smaller than the least adjacent gate interval s, the impurity for suppressing the short channel effect is prevented from being introduced into the parts of the semiconductor substrate 1 under the end parts of the gate electrodes 3, by the gate electrodes 3 adjacent to each other. That is, with the technical idea of the present invention, the gate electrodes of MISFETs adjoining each other may be so arranged that the adjacency interval of the gate electrodes becomes smaller than the least adjacent gate interval s.

Next, there will be described a case where the technical idea of the present invention is applied to a method of manufacturing a semiconductor device which has, for example, a CMIS (Complementary MIS) circuit including an nMISFET and a PMISFET. In FIG. 4–FIG. 18 which are to be referred to here in the description, symbol "nMISFET" denotes a region for forming the nMISFETs, while symbol "pMISFET" denotes a region for forming the pMISFETs. Besides, symbols "JNW" and "PW" indicate an n-well feeding (electric power feeding) region and a p-well feeding region, respectively. As will be stated later, the intervals of gate electrodes and the structures of sources and drains are different between in the nMISFET and pMISFET forming regions (B) on the left side of each of the figures and in the nMISFET and pMISFET forming regions (A) on the right side.

Figure 4:
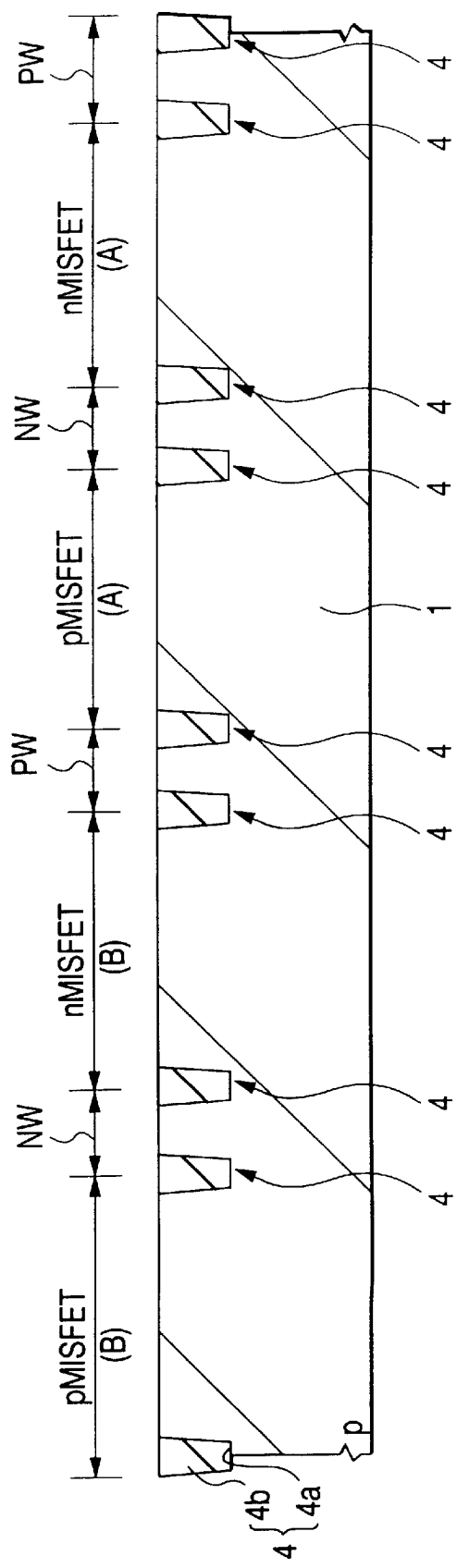
FIG. 4 is a sectional view of essential portions during the manufacturing process of a semiconductor device in an embodiment in which the technical idea of the present invention is applied.

A semiconductor substrate (at this stage, a semiconductor wafer which integrally has regions for forming a plurality of semiconductor chips) 1 shown in FIG. 4 is made of, for example, a silicon single crystal of p⁻-type and is formed with trench isolation portions 4 in its principal surface. The isolation portions 4 are formed in such a way that isolation trenches 4a are formed in the thickness direction of the semiconductor substrate 1, that an isolation film 4b made of, for example, a silicon oxide film is thereafter deposited by CVD (Chemical Vapor Deposition) or the like, and that the isolation film 4b is subsequently cut by CMP (Chemical Mechanical Polishing) or the like so as to be left behind in the isolation trenches 4a only.

Figure 5:
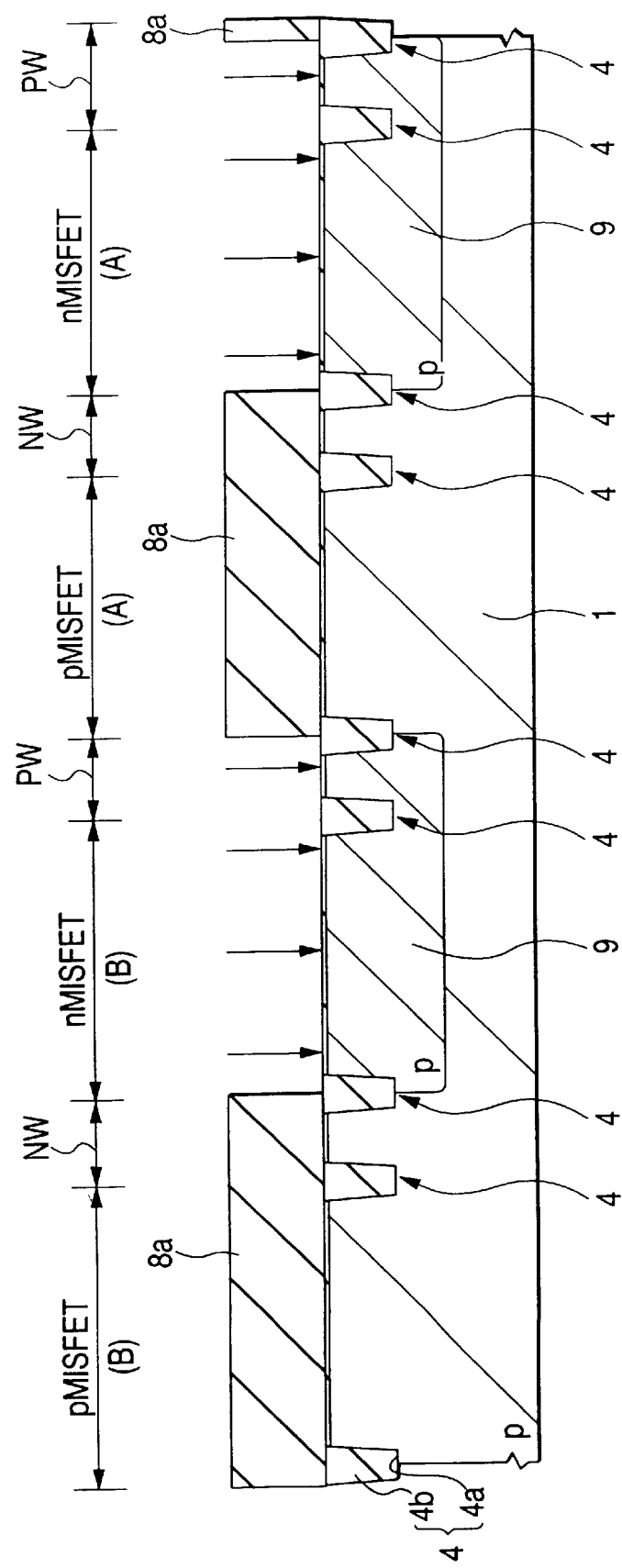
FIG. 5 is a sectional view of essential portions during the manufacturing process of the semiconductor device as succeeds to the process shown in FIG. 4.

First, as shown in FIG. 5, a photoresist film 8a which denudes p-well forming regions and which covers the other regions is formed on the principal surface of the semiconductor substrate 1. Using the photoresist film 8a as a mask, the ions of boron (B) or boron difluoride ($BF_2$), for example, are implanted into the principal surface of the semiconductor substrate 1 perpendicularly or nearly perpendicularly. Thus, p-wells 9 are formed in the semiconductor substrate 1.

Thereafter, the photoresist film 8a is removed, and the resulting semiconductor substrate 1 is subjected to a heat treatment. Thus, the impurity introduced into the semiconductor substrate 1 is electrically activated.

Figure 6:
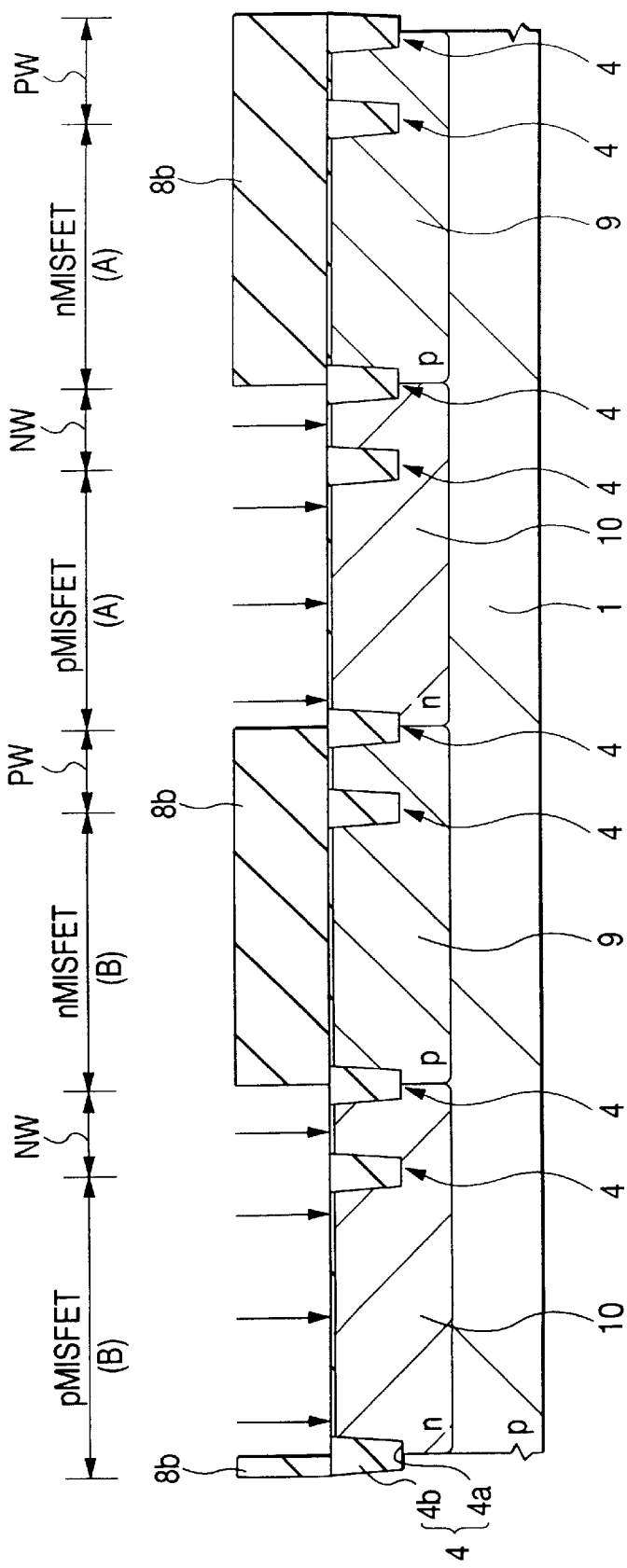
FIG. 6 is a sectional view of essential portions during the manufacturing process of the semiconductor device as succeeds to the process shown in FIG. 5.

Subsequently, as shown in FIG. 6, a photoresist film 8b which denudes n-well forming regions and which covers the other regions is formed on the principal surface of the semiconductor substrate 1. Using the photoresist film 8b as a mask, the ions of phosphorus (P) or arsenic (As), for example, are implanted into the principal surface of the semiconductor substrate 1 perpendicularly or nearly perpendicularly. Thus, n-wells 10 are formed in the semiconductor substrate 1. Besides, using the same photoresist film 8b as a mask, the ions of boron or boron difluoride, for example, are implanted into the semiconductor substrate 1 in order to adjust the threshold voltages of pMISFETS.

Figure 7:
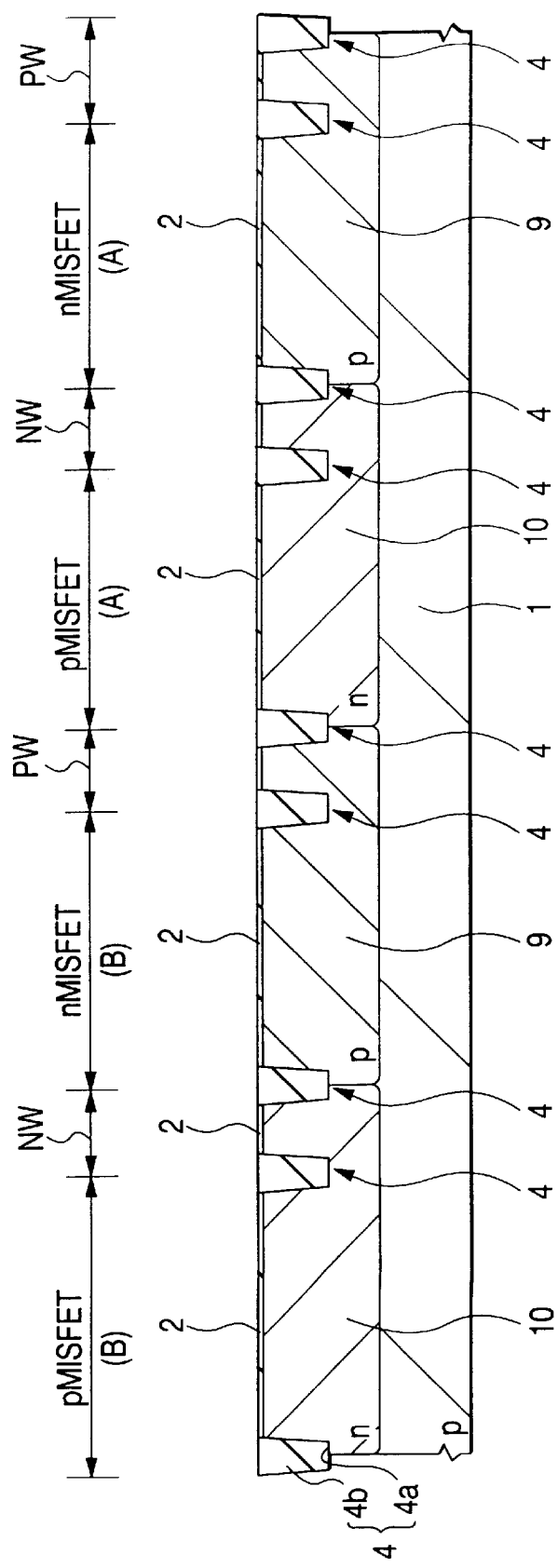
FIG. 7 is a sectional view of essential portions during the manufacturing process of the semiconductor device as succeeds to the process shown in FIG. 6.

The resulting semiconductor substrate 1 is subjected to a gate oxidation treatment, whereby a gate insulator film 2 made of, for example, a silicon oxide film is formed on the principal surface of the semiconductor substrate 1 as shown in FIG. 7. Although no special restriction is intended, the semiconductor substrate 1 may well be heat-treated in an atmosphere of NO (nitrogen oxide) or $N_2O$ (nitrous oxide) after the formation of the gate insulator film 2, thereby to segregate nitrogen at the interface between the gate insulator film 2 and the semiconductor substrate 1 (as an oxidizing-nitriding treatment). When the gate insulator film 2 is thinned down to about 7 nm, a distortion develops at the interface between the gate insulator film 2 and the semiconductor substrate 1 on account of the difference of the thermal expansion coefficient of the film 2 from that of the substrate 1, and it induces the creation of hot carriers. Since the nitrogen segregated at the interface of the gate insulator film 2 with the semiconductor substrate 1 relieves the distortion, the oxidizing-nitriding treatment can enhance the reliability of MISFETs each having the very thin gate insulator film 2.

Figure 8:
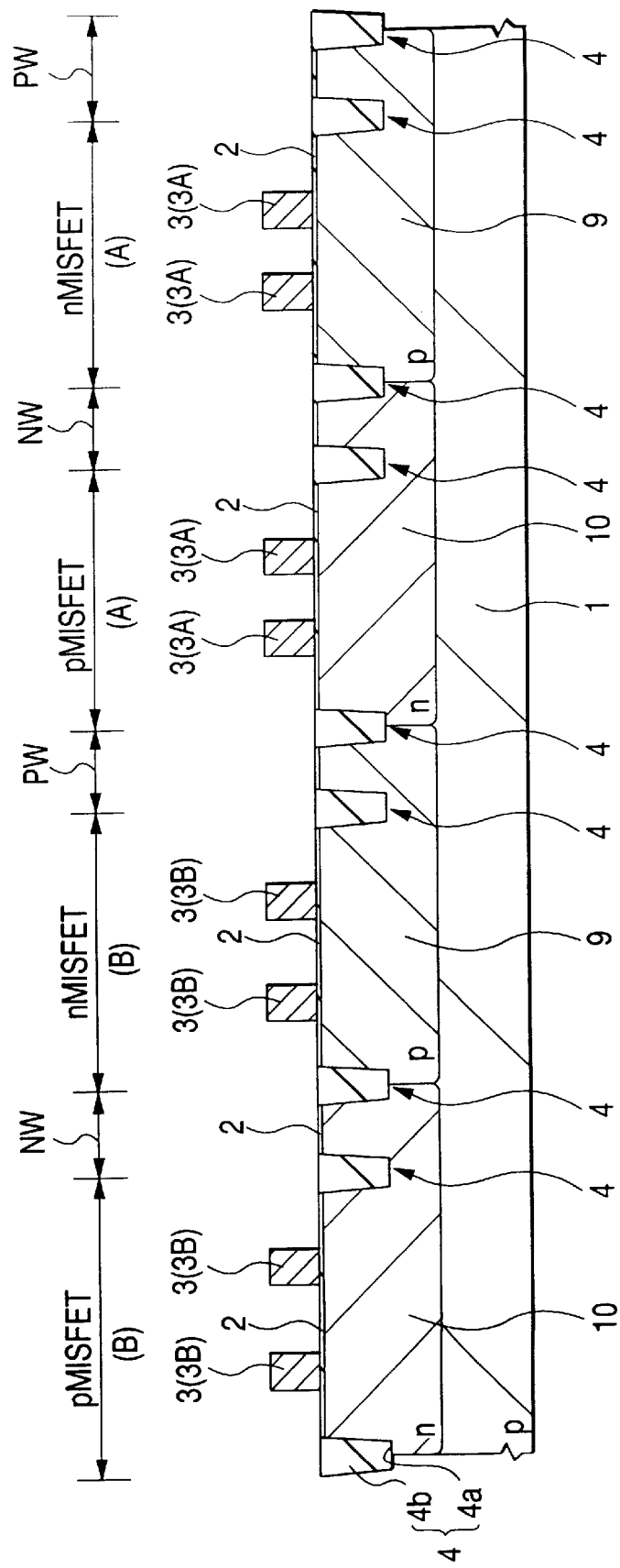
FIG. 8 is a sectional view of essential portions during the manufacturing process of the semiconductor device as succeeds to the process shown in FIG. 7.

Subsequently, a conductor film for forming gate electrodes, which is made of low-resistance polycrystal silicon by way of example, is formed on the gate insulator film 2 by CVD or the like. Thereafter, the conductor film is patterned by a photoresist pattern technique and a dry etching technique. Thus, the gate electrodes 3 (3A, 3B) are formed as shown in FIG. 8. However, the conductor film for forming the gate electrodes is not restricted to the single-layer film of low-resistance polycrystal silicon, but it is variously alterable. By way of example, the conductor film may well be constructed by overlaying the low-resistance polycrystal silicon film with a tungsten silicide film or the like, or by overlaying the low-resistance polycrystal silicon film with a metal film of tungsten or the like through a barrier metal film of tungsten nitride, titanium nitride or the like. Alternatively, a cap insulator film made of, for example, a silicon nitride film may well be formed on such a conductor film by CVD or the like. In this case, the cap insulator film may well be patterned at the step of patterning the gate electrodes. Further, the gate electrodes 3 may well be formed in such a way that, after the cap insulator film has been patterned, a photoresist film used as an etching mask at the time of the patterning is removed, and that the conductor film for forming the gate electrodes is subsequently patterned using the patterned cap insulator film as an etching mask.

Illustrated here is a case where two MISFETs are formed in one MISFET forming region. Accordingly, two gate electrodes 3 are arranged in adjacency to each other within one MISFET forming region. In each of pMISFET and nMISFET forming regions (B) on the left side of FIG. 8, among such MISFET forming regions, the adjacency interval of the gate electrodes 3B, 3B adjacent to each other is set to be larger than the least adjacent gate interval defined before. Regarding the pMISFETs and nMISFETs in the regions (B), the arrangement of source forming regions and drain forming regions is not especially designated. on the other hand, in each of pMISFET and nMISFET forming regions (A) on the right side of FIG. 8, the adjacency interval of the gate electrodes (first gate electrode and second gate electrode) 3A, 3A adjacent to each other is set to be smaller than the least adjacent gate interval. In this embodiment, the interval of the gate electrodes 3A, 3A is, for example, 0.3 μm or so. Besides, in each of the pMISFET and nMISFET forming regions (A), that part of the semiconductor substrate 1 which lies between the gate electrodes 3A, 3A adjacent to each other becomes a source region which is shared by the MISFETs adjoining each other.

Figure 9:
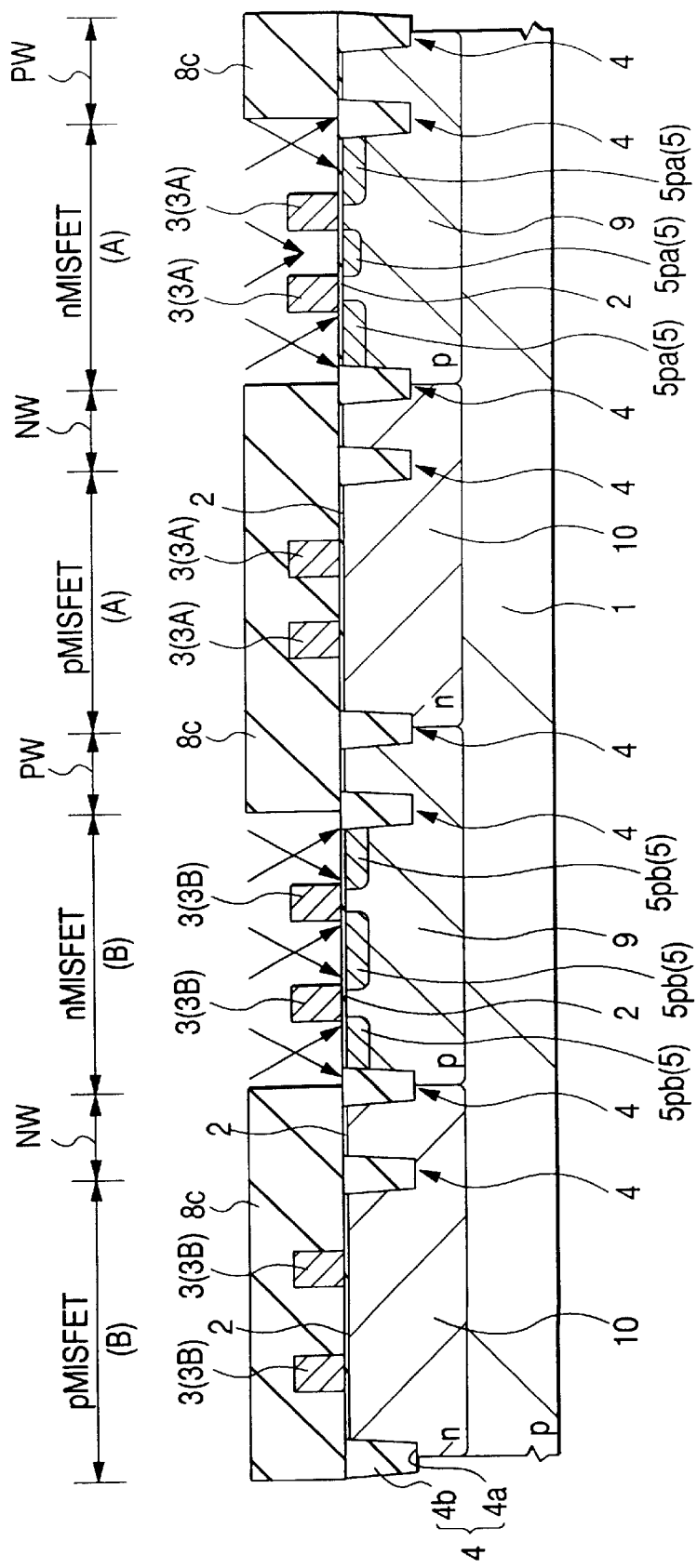
FIG. 9 is a sectional view of essential portions during the manufacturing process of the semiconductor device as succeeds to the process shown in FIG. 8.

Thereafter, as shown in FIG. 9, a photoresist film 8c which denudes the nMISFET forming regions and which covers the other regions is formed on the principal surface of the semiconductor substrate 1. Using the photoresist film 8c as a mask, the ions of an impurity, for example, boron for suppressing the short channel effect of the nMISFETs are implanted to form pocket regions 5pa(5), 5pb(5) each of which is constructed of a p⁻-type semiconductor region. On this occasion, the impurity ions may be introduced, for example, in the four directions (in the first directions and in the second directions) as viewed in plan and obliquely to the principal surface of the semiconductor substrate 1 as viewed in section, as explained in relation to the technical idea of the present invention, etc. The angle of introduction of the impurity in this case is, for example, about 30 degrees relative to a plane which is perpendicular to the semiconductor substrate (semiconductor wafer) 1.

In the case of performing the above step, the situation of the side on which the gate electrodes 3A, 3A adjacent to each other are arranged is such that, as explained in relation to the technical idea of the present invention, the impurity in the first directions is hindered by the gate electrodes 3A, 3A adjacent to each other from being introduced into the part of the semiconductor substrate 1 lying between the adjacent gate electrodes 3A, 3A. That is, the impurity is not introduced under the end parts of the gate electrodes 3A, 3A adjacent to each other. For this reason, the end parts of the pocket region 5pa between the gate electrodes 3A, 3A do not underlie the end parts of these gate electrodes 3A, 3A. In other words, the pattern of the pocket region 5pa does not overlap those of the gate electrodes 3A, 3A in plan. Granted that the end parts of the pocket region 5pa have come under the end parts of the gate electrodes 3A, 3A, they underlie these end parts only to the extent of being cancelled by impurity diffusion from semiconductor regions for the sources and drains of the MISFETs. Incidentally, even on the side on which the gate electrodes 3A, 3A are arranged, the pocket a region 5pa formed on the side of the drain forming region of each MISFET does not form any special hindrance at the introduction of the impurity for the drain forming region, and hence, the end part thereof somewhat underlies the end part of the corresponding gate electrode 3A. In other words, the pattern of the pocket region 5pa overlaps that of the gate electrode 3A in plan. On the other hand, on the side on which the gate electrodes 3B, 3B adjacent to each other are arranged, the end parts of all of the pocket region 5pb formed between these gate electrodes 3B, 3B and the pocket regions 5pb formed on both the sides thereof somewhat underlie the end parts thereof. In other words, the patterns of the pocket regions 5pb overlap those of the gate electrodes 3B, 3B in plan.

Figure 10:
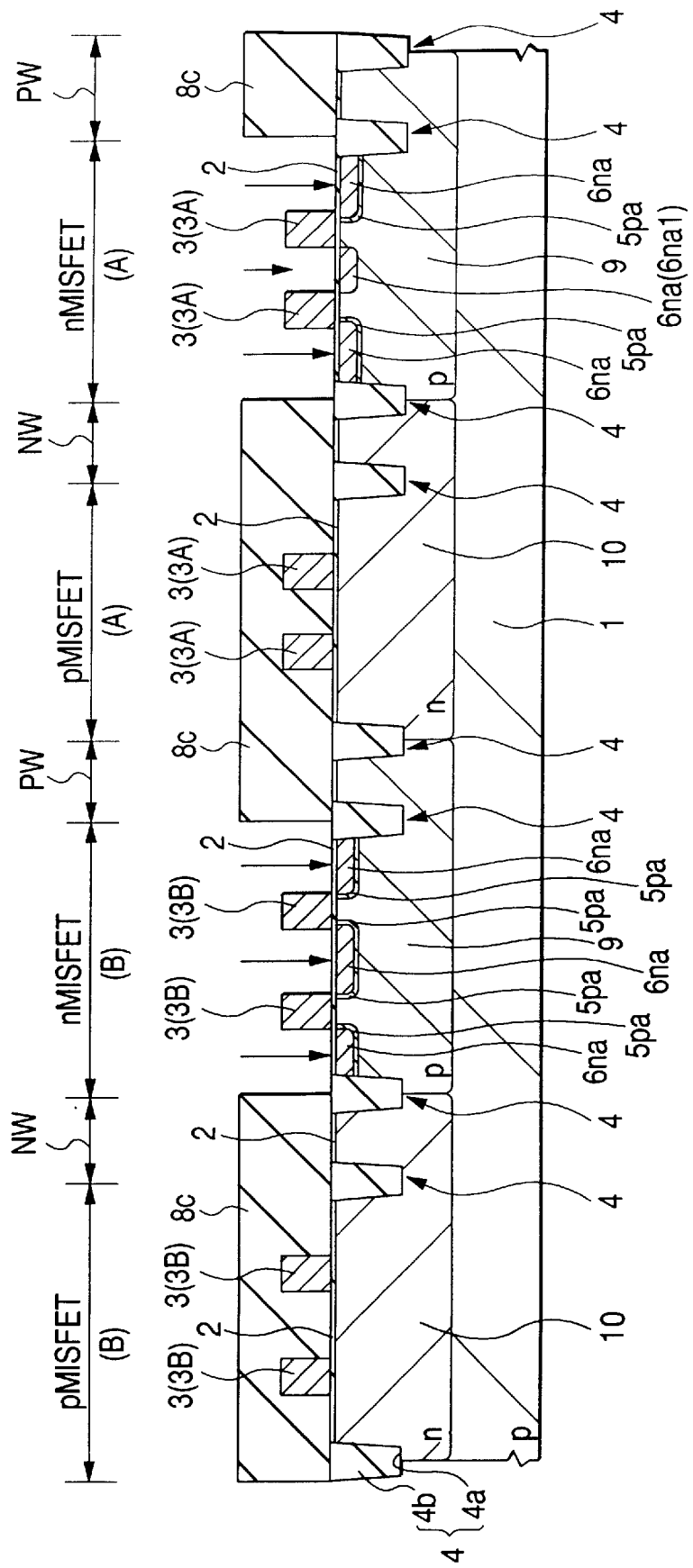
FIG. 10 is a sectional view of essential portions during the manufacturing process of the semiconductor device as succeeds to the process shown in FIG. 9.

Next, as shown in FIG. 10, phosphorus or arsenic, for example, is introduced into the semiconductor substrate 1 perpendicularly or nearly perpendicularly to the principal surface thereof by ion implantation or the like, using as a mask the photoresist film 8c employed at the preceding step of introducing the impurity for the suppression of the short channel effect. Thus, semiconductor regions 6na (6na1) of n⁻-type are formed in the semiconductor substrate 1. The n⁻-type semiconductor region 6na1 has the functions of suppressing the hot electron effect of, for example, the nMISFETs and lowering the parasitic resistance thereof. When the impurity introducing step here has been performed, the conductivity type of the pocket region 5pa formed between the gate electrodes 3A, 3A is cancelled by the n⁻-type semiconductor region 6na1, but the other pocket regions 5pa, 5pb are left behind at the end parts of the n⁻-type semiconductor regions 6na near to the channels and at the lower parts of the n⁻-type semiconductor regions 6na. Incidentally, the n⁻-type semiconductor regions 6na are formed so as to have an impurity concentration which is higher than that of the pocket regions 5pa, 5pb and lower than that of semiconductor regions of n⁺-type to be explained later.

Figure 11:
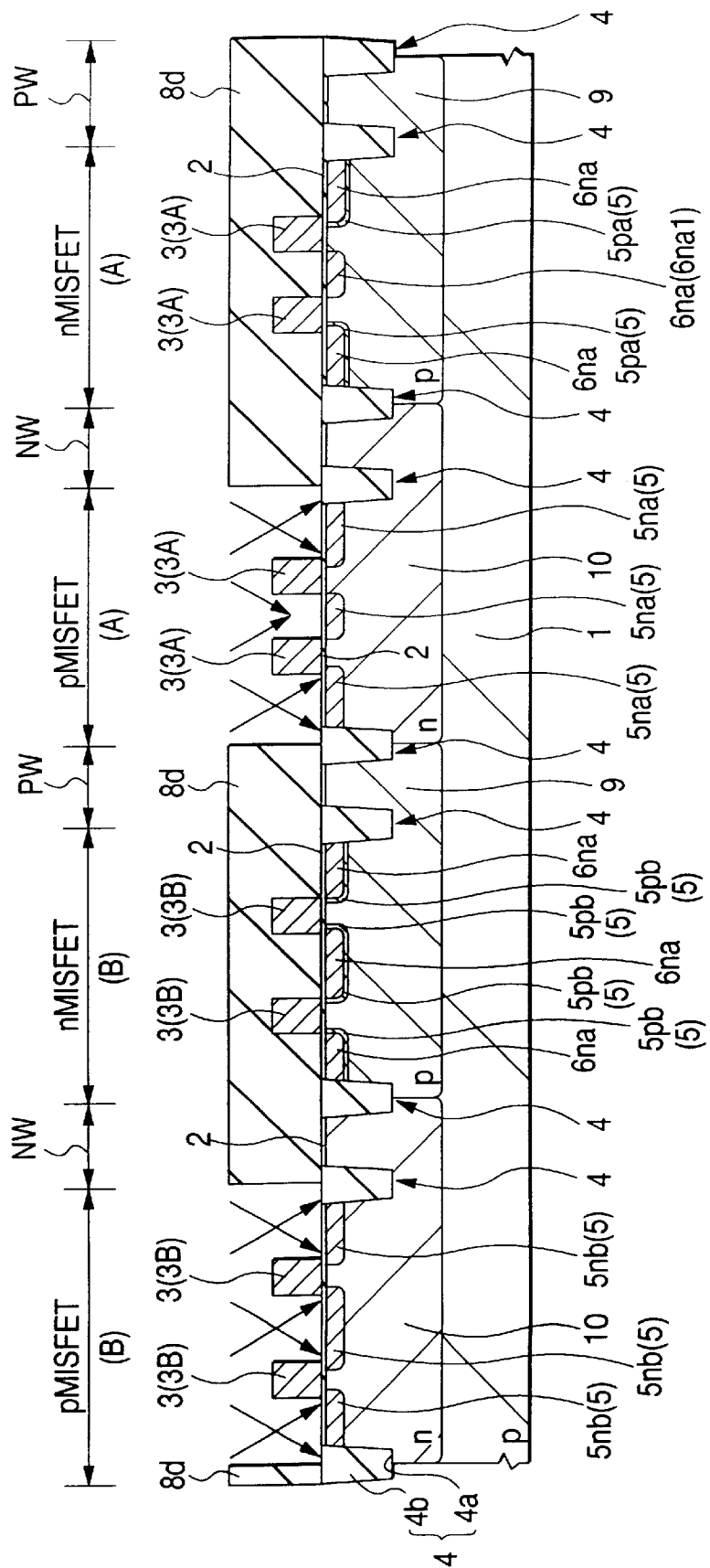
FIG. 11 is a sectional view of essential portions during the manufacturing process of the semiconductor device as succeeds to the process shown in FIG. 10.

Subsequently, as shown in FIG. 11, a photoresist film 8d which denudes the pMISFET forming regions and which covers the other regions is formed on the principal surface of the semiconductor substrate 1. Using the photoresist film 8d as a mask, the ions of an impurity, for example, phosphorus for suppressing the short channel effect of the pMISFETs are implanted under the same conditions as in the foregoing ion implantation of the impurity for suppressing the short channel effect of the nMISFETs. Thus, pocket regions 5na(5), 5nb(5) each of which is constructed of an n⁻-type semiconductor region are formed.

In this case, as explained on the introduction of the impurity for suppressing the short channel effect of the nMISFETs, the end parts of the pocket region 5na between the gate electrodes 3A, 3A adjacent to each other in the pMISFET forming region do not underlie the end parts of these gate electrodes 3A, 3A. Granted that the end parts of the pocket region 5na have come under the end parts of the gate electrodes 3A, 3A, they underlie these end parts only to the extent of being cancelled by impurity diffusion from semiconductor regions for the sources and drains of the MISFETs. Incidentally, even on the side on which the gate electrodes 3A, 3A are arranged, the end part of the pocket region 5na formed on the side of the drain forming region of each MISFET somewhat underlies the end part of the corresponding gate electrode 3A. on the other hand, on the side on which the gate electrodes 3B, 3B adjacent to each other in the pMISFET forming region are arranged, the end parts of all of the pocket region 5nb formed between these gate electrodes 3B, 3B and the pocket regions 5nb formed on both the sides thereof somewhat underlie the end parts thereof.

After the above step, the step of introducing an impurity for forming semiconductor regions of ps-type may well be carried out using the same photoresist film 8d as a mask, as in the case of the ne-type semiconductor regions 6na of the nMISFETs. Boron or boron difluoride, for example, is employed as the impurity on that occasion, and the p⁻-type semiconductor regions are set at an impurity concentration which is higher than semiconductor regions of p⁺-type to be explained later. Besides, the conductivity type of the pocket region 5na between the gate electrodes 3A, 3A may well be cancelled in this way. The operating reliability of the pMISFETs can be enhanced by providing such p⁻-type semiconductor regions.

Figure 12:
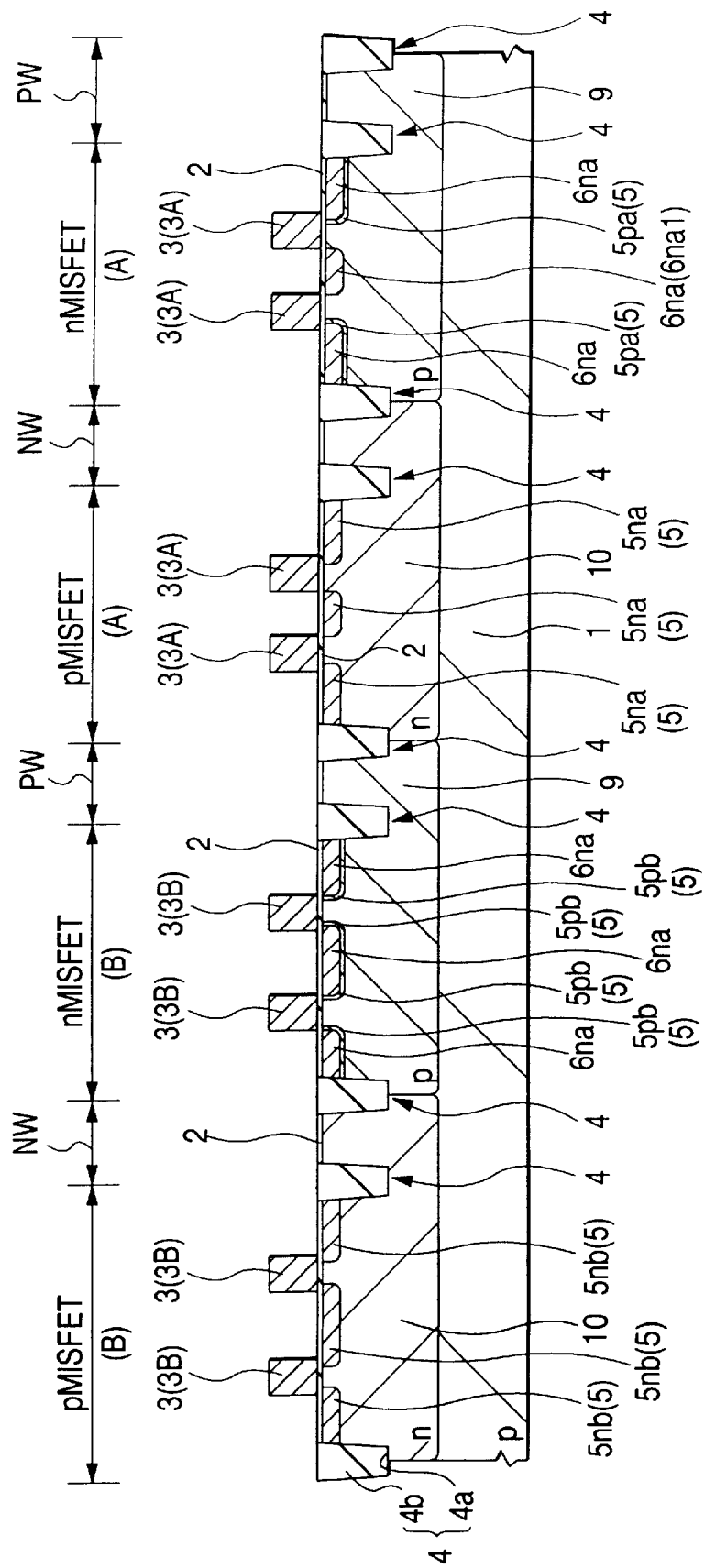
FIG. 12 is a sectional view of essential portions during the manufacturing process of the semiconductor device as succeeds to the process shown in FIG. 11.
Figure 13:
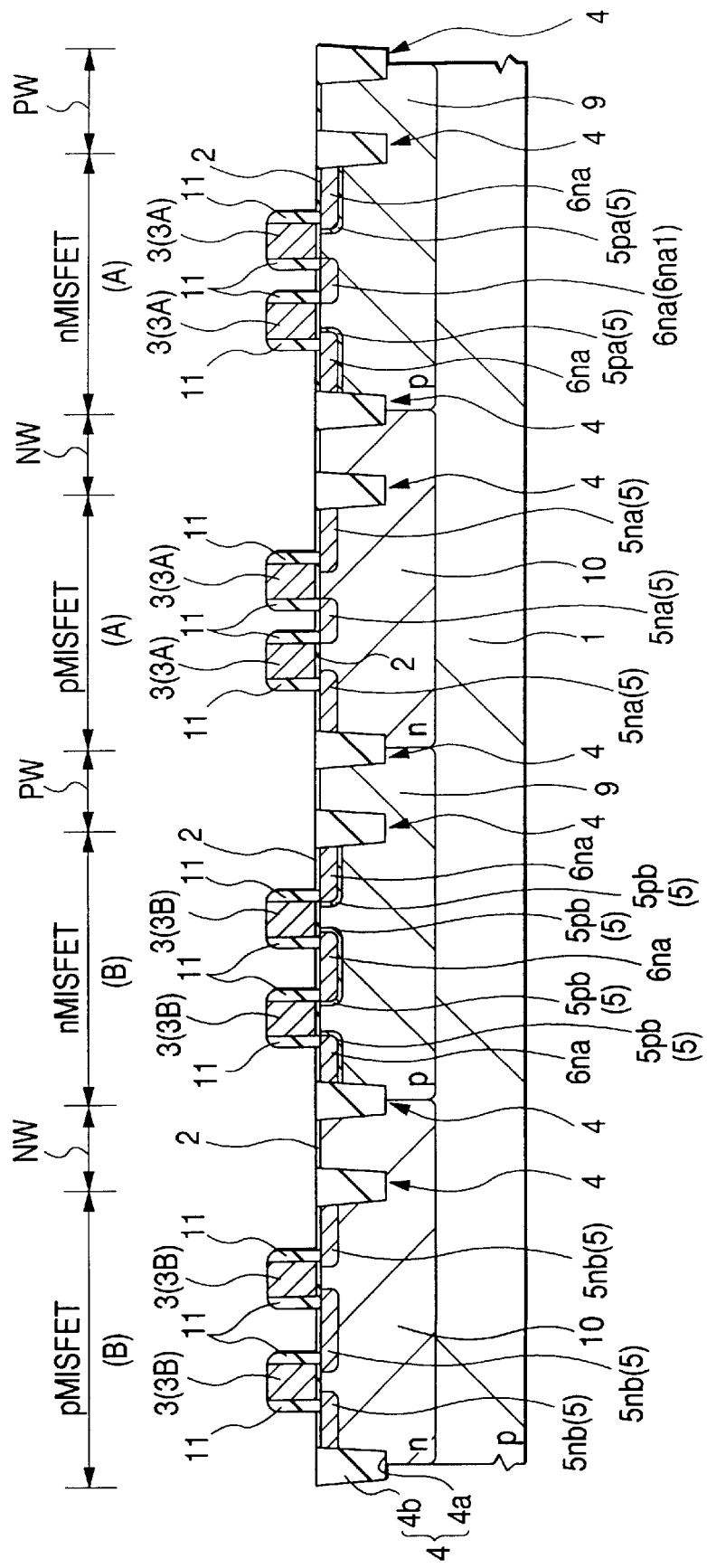
FIG. 13 is a sectional view of essential portions during the manufacturing process of the semiconductor device as succeeds to the process shown in FIG. 12.

Thereafter, the photoresist film 8d is removed to obtain a structure shown in FIG. 12. The resulting semiconductor substrate 1 is heat-treated to activate the impurities introduced into this semiconductor substrate 1. Subsequently, an insulator film made of, for example, a silicon oxide film is deposited on the principal surface of the semiconductor substrate 1 by CVD or the like so as to cover the surfaces of the gate electrodes 3 (3A, 3B). Further, the insulator film is etched back by anisotropic dry etching or the like. Thus, side walls 11 are formed on the side surfaces of the gate electrodes 3 as shown in FIG. 13. By the way, in the case where each gate electrode 3 is overlaid with the cap insulator film, the side walls 11 are formed on the side surfaces of the gate electrode 3 and the cap insulator film.

Figure 14:
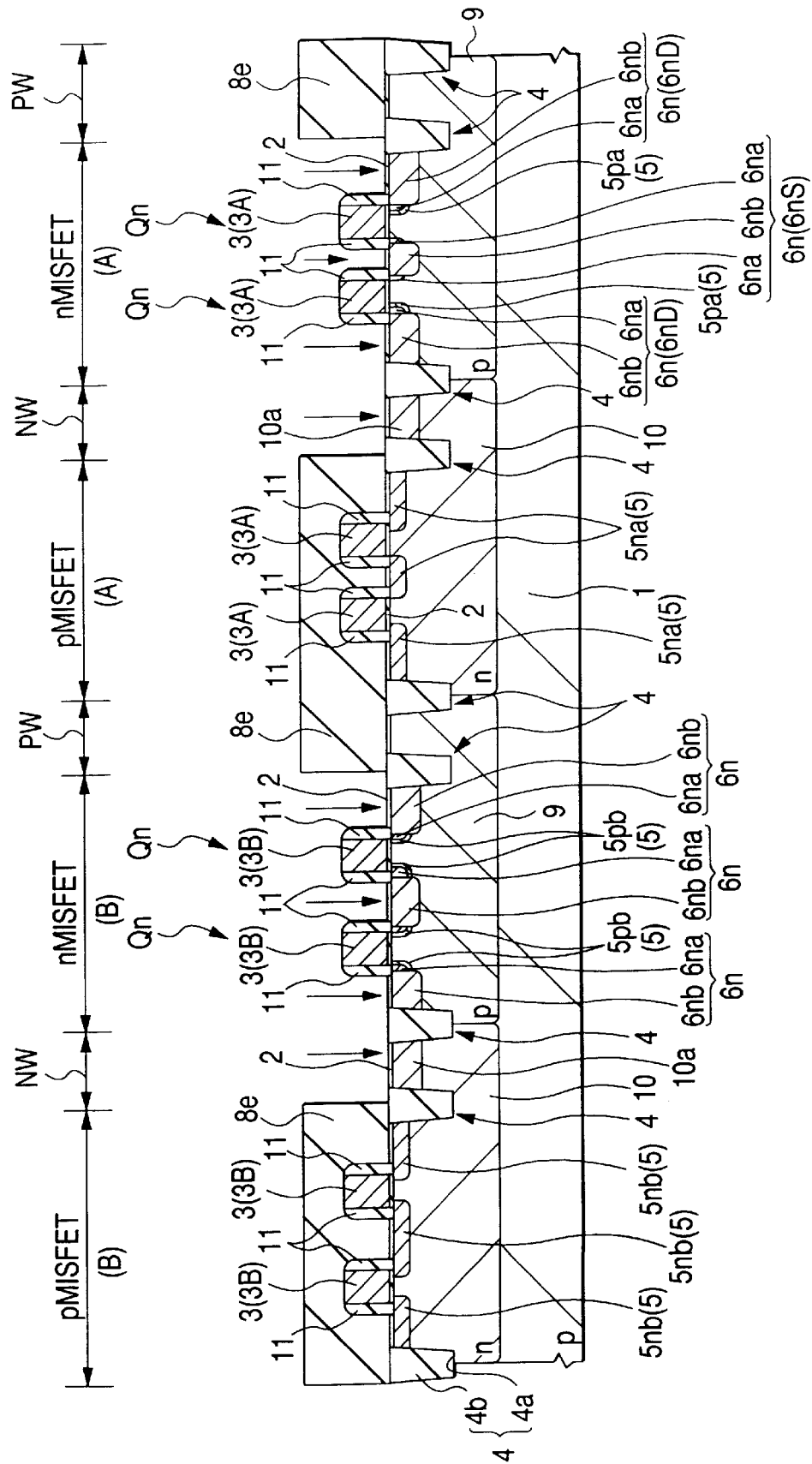
FIG. 14 is a sectional view of essential portions during the manufacturing process of the semiconductor device as succeeds to the process shown in FIG. 13.

Thereafter, as shown in FIG. 14, a photoresist film 8e which denudes the nMISFET forming regions and n-well feeding regions NW and which covers the other regions is formed on the principal surface of the semiconductor substrate 1. Using the photoresist film 8e as a mask, the ions of, for example, phosphorus or arsenic for forming the sources and drains of the nMISFETs are implanted into the semiconductor substrate 1 perpendicularly or nearly perpendicularly to the principal surface thereof. Thus, semiconductor regions 6nb of n⁺-type for the nMISFETs Qn and semiconductor regions 10a of n⁺-type for the n-well feeding regions NW are formed in the semiconductor substrate 1.

The nMISFETs Qn are formed via such steps. In the nMISFETs Qn, Qn having the gate electrodes 3A, 3A, the semiconductor region 6n between these gate electrodes 3A, 3A is used as a semiconductor region 6nS for a shared source, and the other semiconductor regions 6n are used as semiconductor regions 6nD for drains. Each of the semiconductor region 6nS for the source and the semiconductor regions 6nD for the drains has the n⁻-type semiconductor region (or regions) 6n and the n⁺-type semiconductor region 6nb. The pocket region 5pa(5) is formed on the side of the semiconductor region 6nD for the drain, but it is not formed on the side of the semiconductor region 6nS for the source. On the other hand, each of the nMISFETs Qn, Qn having the gate electrodes 3B, 3B includes pairs of semiconductor regions 6n, and the semiconductor region 6n between the gate electrodes 3B, 3B is used as a shared region. Each of the pairs of semiconductor regions 6n includes a semiconductor region 6na of n⁻-type and a semiconductor region 6nb of n⁺-type. In this case, pocket regions 5pb(5) are formed in the vicinities of those end parts of the pair of semiconductor regions 6n (both the semiconductor regions 6n) which are near to the channels.

Figure 15:
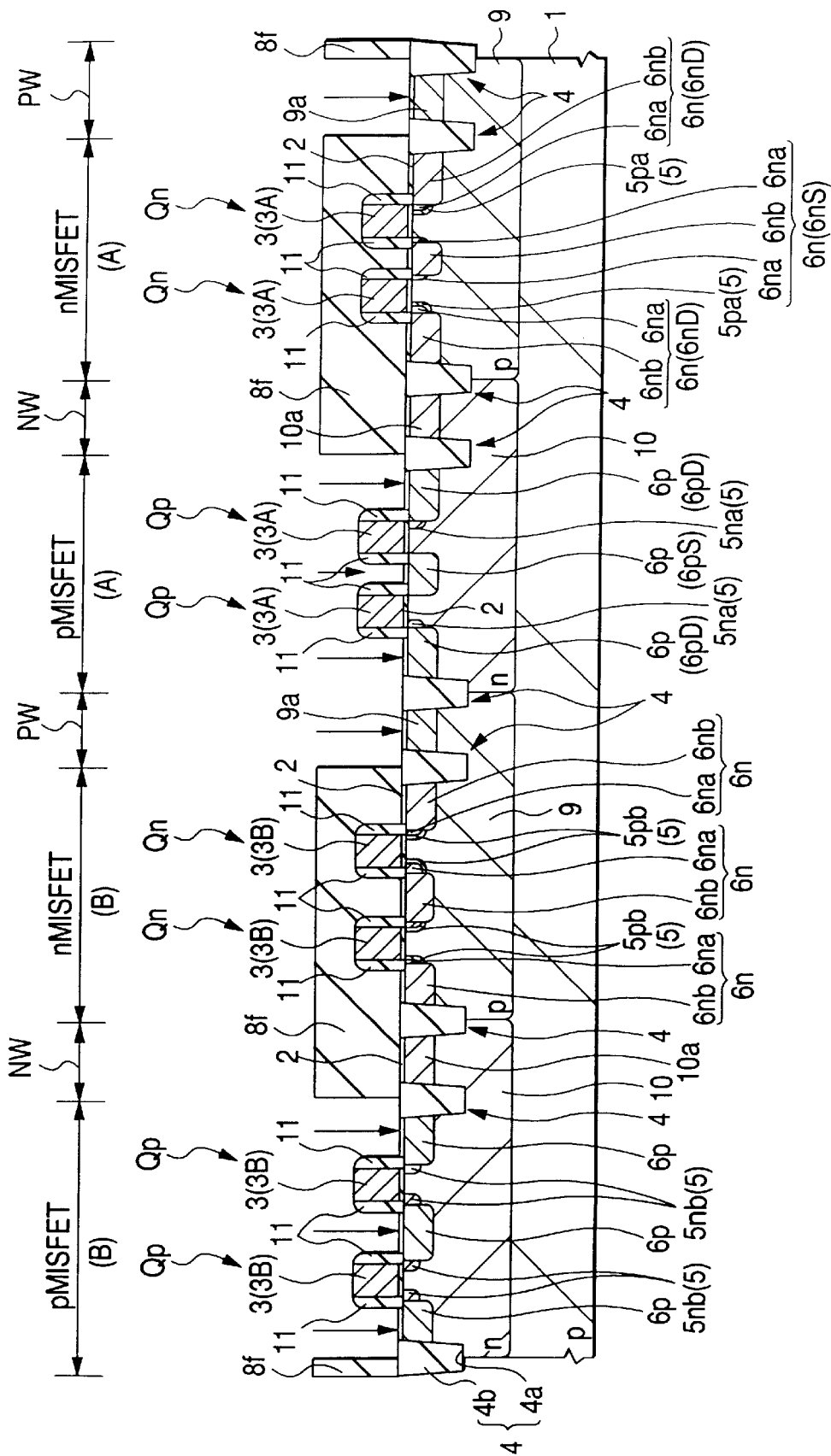
FIG. 15 is a sectional view of essential portions during the manufacturing process of the semiconductor device as succeeds to the process shown in FIG. 14.

Subsequently, as shown in FIG. 15, a photoresist film 8f which denudes the pMISFET forming regions and p-well feeding regions PW and which covers the other regions is formed on the principal surface of the semiconductor substrate 1. Using the photoresist film 8f as a mask, the ions of, for example, boron for forming the sources and drains of the pMISFETs are implanted into the semiconductor substrate 1 perpendicularly or nearly perpendicularly to the principal surface thereof. Thus, semiconductor regions 6p of $p^+$-type for the pMISFETs Qp and semiconductor regions 9a of $p^+$-type for the p-well feeding regions PW are formed in the semiconductor substrate 1. On this occasion, the conductivity type of the pocket region 5na formed between the gate electrodes 3A, 3A is cancelled by the $p^+$-type semiconductor region 6p, but the other pocket regions 5na, 5nb are left behind in the vicinities of those end parts of the $p^+$-type semiconductor regions 6p which are near to the channels.

The pMISFETs Qp are formed via such steps. In the pMISFETs Qp, Qp having the gate electrodes 3A, 3A, the $p^+$-type semiconductor region 6p between these gate electrodes 3A, 3A is used as a semiconductor region 6pS for a shared source, and the other semiconductor regions 6p are used as semiconductor regions 6pD for drains. Any pocket region is not formed on the side of the semiconductor region 6pS for the source, but the pocket region 5na(5) is formed on the side of the semiconductor region 6pD for the drain. On the other hand, each of the pMISFETs Qp, Qp having the gate electrodes 3B, 3B includes pairs of $p^+$-type semiconductor regions 6p, and the $p^+$-type semiconductor region 6p between the gate electrodes 3B, 3B is used as a shared region. Pocket regions 5nb(5) are formed in the vicinities of those end parts of the pair of $p^+$-type semiconductor regions 6p (both the semiconductor regions 6p) which are near to the channels.

Figure 16:
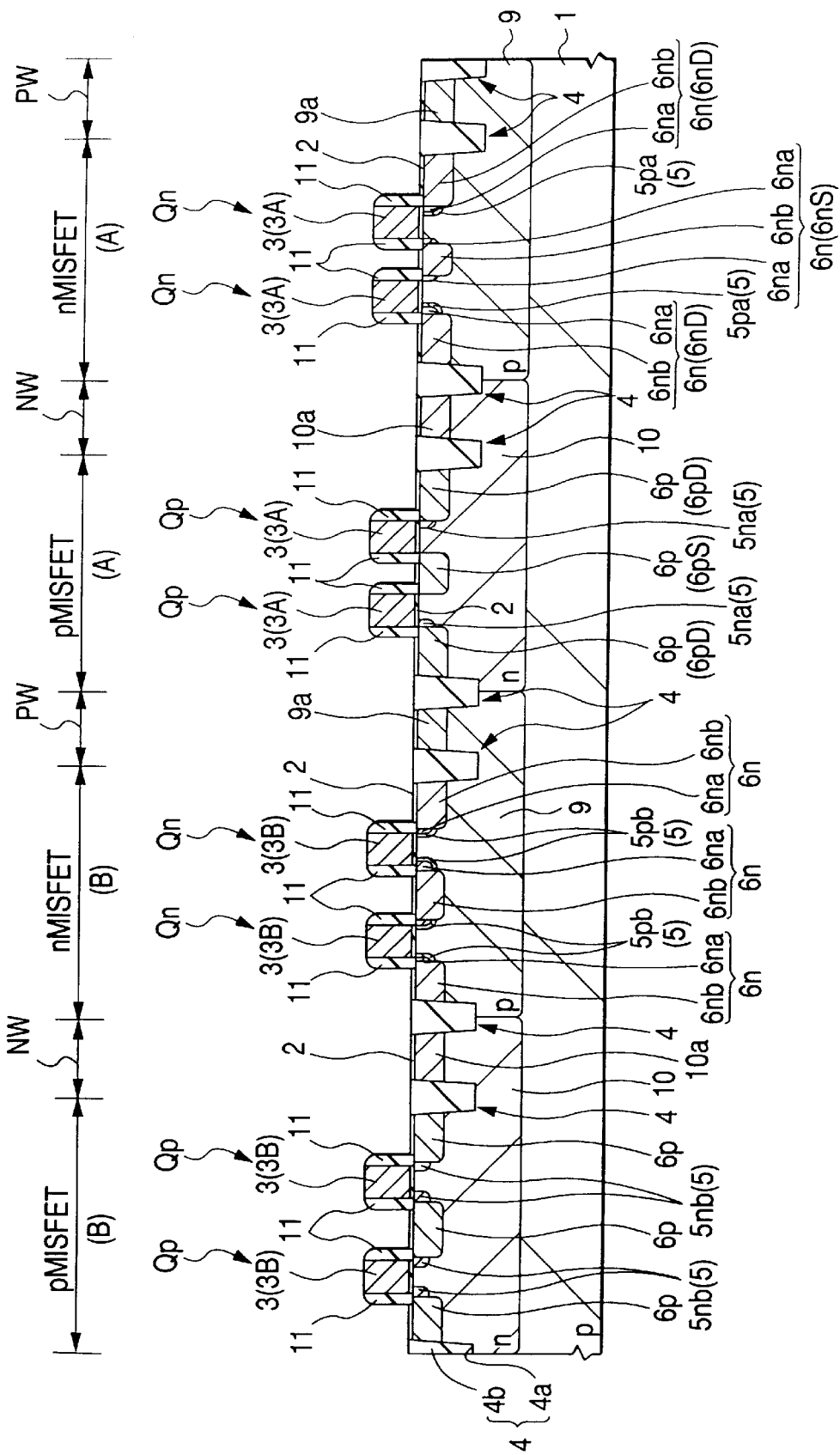
FIG. 16 is a sectional view of essential portions during the manufacturing process of the semiconductor device as succeeds to the process shown in FIG. 15.

Thereafter, the photoresist film 8f is removed, and the resulting semiconductor substrate 1 is heat-treated to electrically activate the impurities introduced into this semiconductor substrate 1. Then, the nMISFETs Qn and pMISFETs Qp are formed on the semiconductor substrate 1 as shown in FIG. 16. Here, the MISFET formed with the pocket region 5 on only the side of the semiconductor region for the drain, and the MISFET formed with the pocket regions 5 on both the sides of the semiconductor regions for the source and drain have different threshold voltages. The threshold voltage in the case where the pocket region 5 exists on only the drain side becomes lower as compared with that in the case where the pocket regions 5 exist on both the source and drain sides. The threshold voltage for each MISFET may well be set by utilizing this fact. More specifically, the MISFETs whose threshold voltages are to be relatively low may have their gate electrodes arranged like the gate electrodes 3A, 3A, while the MISFETs whose threshold voltages are to be relatively high may have their gate electrodes arranged like the gate electrodes 3B, 3B. Thus, it is permitted to adjust the threshold voltages of the MISFETs.

Figure 17:
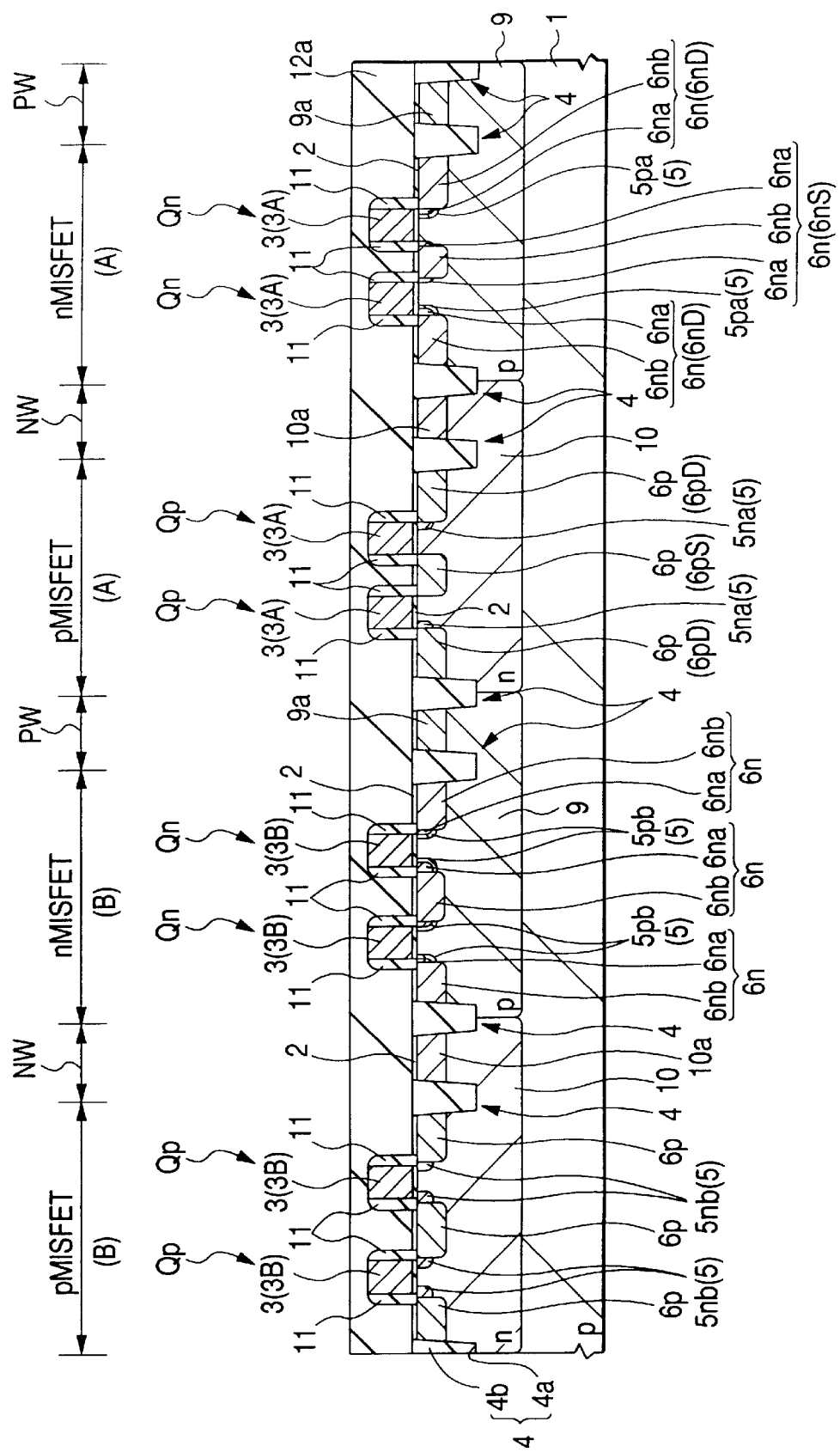
FIG. 17 is a sectional view of essential portions during the manufacturing process of the semiconductor device as succeeds to the process shown in FIG. 16.
Figure 18:
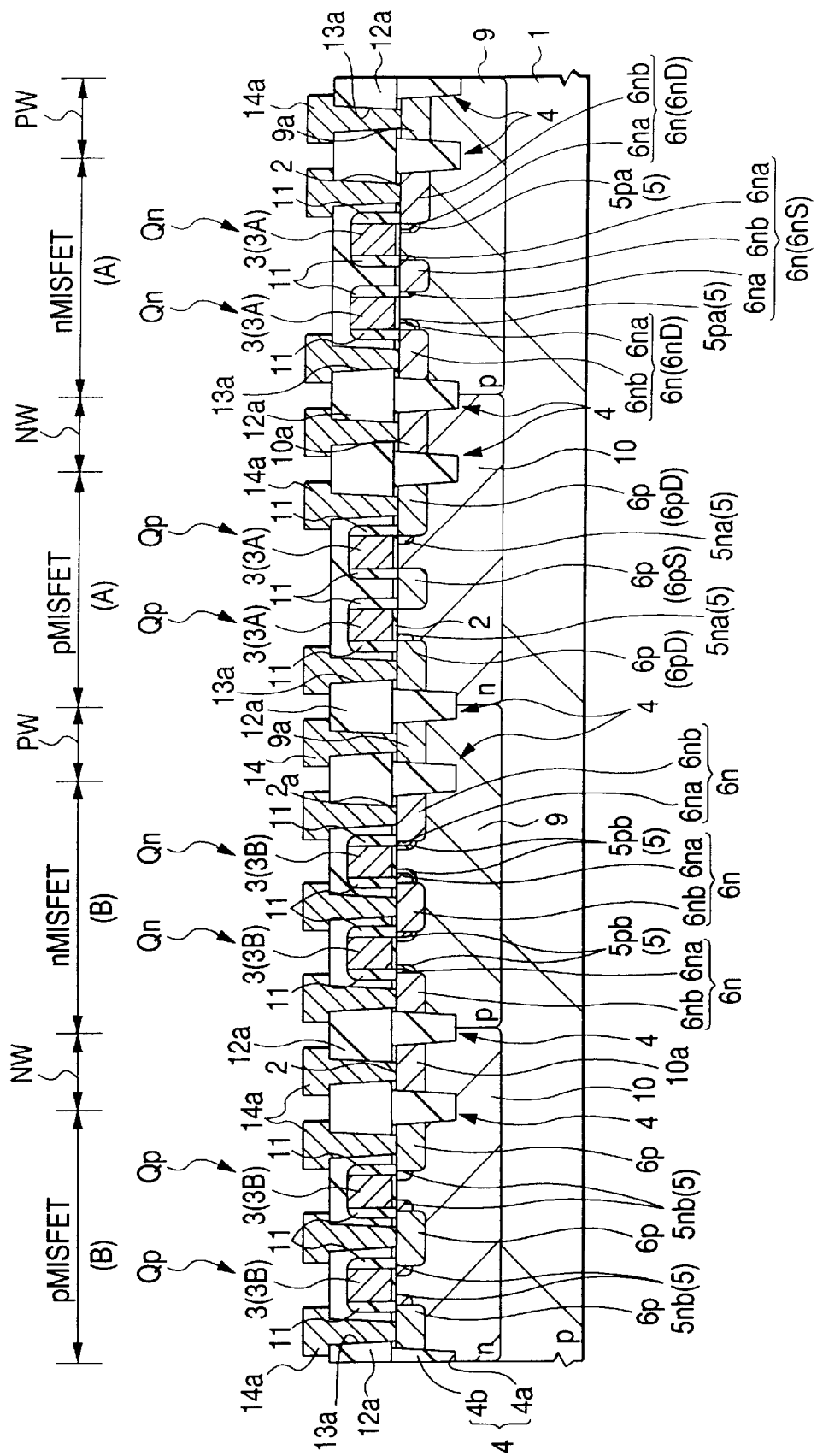
FIG. 18 is a sectional view of essential portions during the manufacturing process of the semiconductor device as succeeds to the process shown in FIG. 17.

Next, as shown in FIG. 17, an insulator film 12a made of, for example, a silicon oxide film is deposited on the principal surface of the semiconductor substrate 1 by CVD or the like, and it is polished by CMP or the like. Subsequently, as shown in FIG. 18, the insulator film 12a is formed with contact holes 13a by which the semiconductor regions 6n, 6p are denuded. A conductor film made of aluminum or an aluminum alloy, or a titanium-based metal film and aluminum in this order, for example, is/are deposited on the resulting insulator film 12a and in the contact holes 13a by sputtering or the like. Further, the deposited constituent is patterned by a photolithographic technique and a dry etching technique. Thus, first-layer wiring lines 14a are laid. Thereafter, conventional processes for manufacturing a semiconductor device are performed to produce the semiconductor device in which the semiconductor substrate 1 is provided with the nMISFETs Qn and the pMISFETs Qp.

As thus far described, according to this embodiment, the arrangement intervals of the elements and the wiring lines can be narrowed without spoiling the operating reliability of the pMISFETs Qp and nMISFETs Qn and without adding any manufacturing process or adopting any complicated manufacturing technique. It is therefore possible to provide a small-sized and high-performance semiconductor device at low cost.

(Embodiment 2)

Before describing another embodiment of the present invention, the technical idea of the present invention concerning this embodiment will be elucidated in conjunction with FIG. 19–FIG. 22(b). By the way, in FIG. 19, gate electrodes are hatched in order to readily understand the drawing. Besides, FIGS. 20(a), 21(a) and 22(a) correspond to a section of line A—A indicated in FIG. 19, while FIGS. 20(b), 21(b) and 22(b) correspond to a section of line B—B indicated in FIG. 19.

Figure 19:
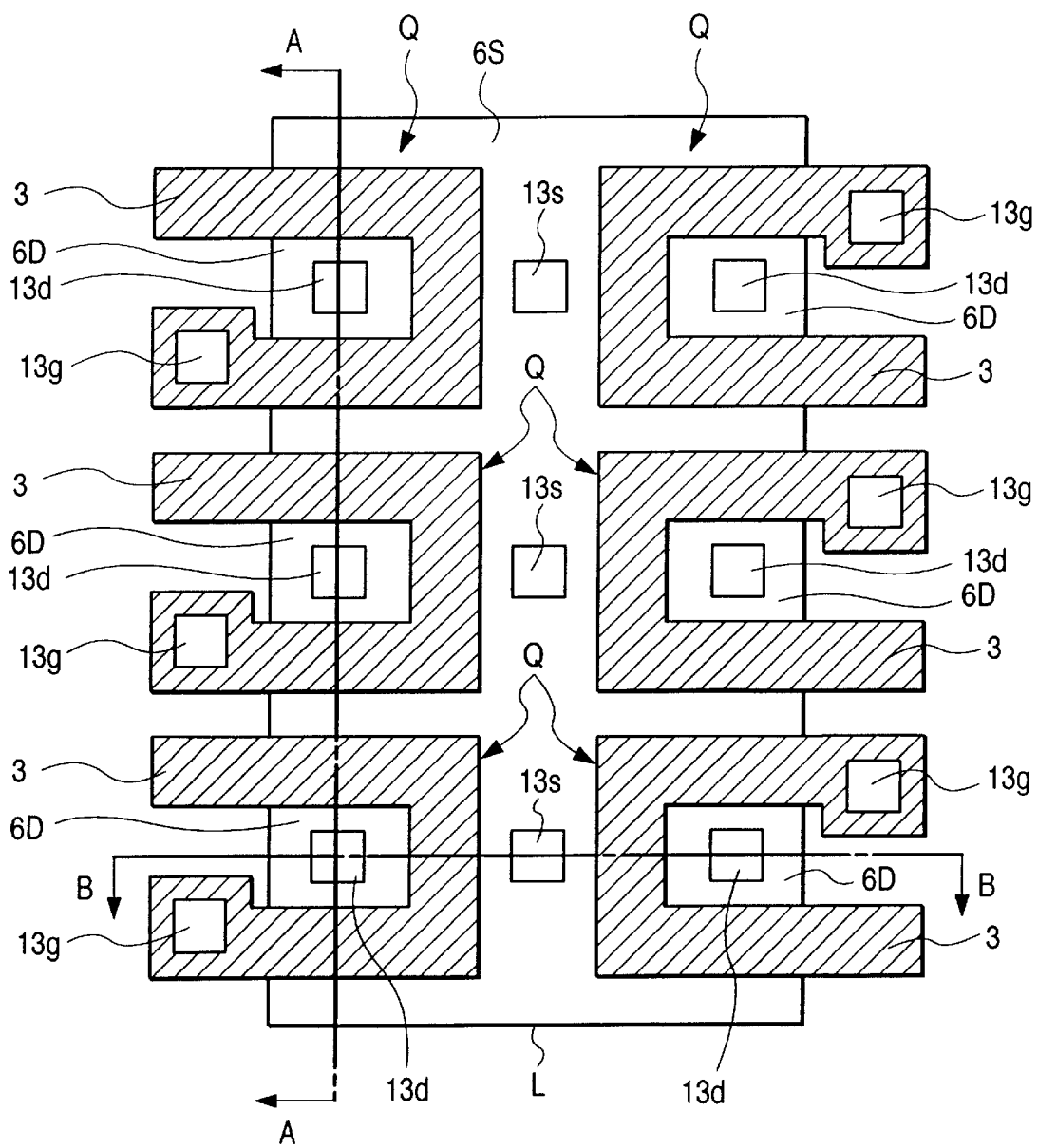
FIG. 19 is a plan view of the essential portions of a semiconductor substrate for elucidating the technical idea of the present invention.

The technical idea of the present invention to be now elucidated is basically the same as the technical idea elucidated in Embodiment 1, and it consists in that an impurty for suppressing the short channel effect is introduced on only the sides of the drains of MISFETs, thereby to enhance the arrangement density of gate electrodes. Here will be explained the arrangement of the gate electrodes in the case where the technical idea is applied to a semiconductor device. FIG. 19 is a plan view showing the arrangement. Each of the gate electrodes 3 is formed in the shape of, for example, letter U when viewed in plan. By way of example, the gate electrodes 3 are so arranged that three of them are arrayed in the vertical direction of FIG. 19, and that two of them are arranged in the lateral direction of the figure. The patterns of the three gate electrodes 3 arrayed vertically in FIG. 19 are respectively located facing in the same direction, and the adjacency intervals thereof are narrower than the "least adjacent gate interval" defined in the description of Embodiment 1. Thus, the high density arrangement of the gate electrodes 3 is realized. Accordingly, a dimension in the vertical direction of FIG. 19 can be reduced.

On the other hand, the patterns of the two gate electrodes 3 arrayed laterally in FIG. 19 are located in bilateral symmetry bordered by a center line in the lateral direction of FIG. 19 in an active area L so that the open sides of the patterns may face in opposite directions. Here, the adjacency interval of the patterns is wider than the least adjacent gate interval. Each of the gate electrodes 3 is located so as to overlap the active area L when viewed in plan. The channel of a MISFET Q is formed in a region where the gate electrode 3 and the active area L lie one over the other when viewed in plan. The reasons why the plane shape of the gate electrode 3 is the shape of letter U by way of example, are as stated below. The first is that, with a smaller occupation area, a larger gate width is gained to attain a higher driving capability. The second is that part of the active area L is isolated in plan by the pattern of the gate electrode 3, whereupon a semiconductor region 6D for the drain of the MISFET Q is formed in the isolated part, thereby to isolate the semiconductor region 6D for the drain. The plane shape of the gate electrode 3 may satisfy such requisites, and it may well be the shape of a plane annulus by way of example. In this manner, in the active area L, the semiconductor region 6D for the drain is formed at a position enclosed with the gate electrode 3. Besides, a semiconductor region 6S for the sources of the MISFETs is formed in the other region. That is, the semiconductor region 6S for the sources is shared by the MISFETs Q. Thus, the occupation area per the MISFET can be made smaller as compared with a case where the respective MISFETs have semiconductor regions for their sources separately. Accordingly, a dimension in the lateral direction of FIG. 19 can be reduced. Symbol 13g denotes a contact hole which connects the gate electrode 3 with a first-layer wiring line. The contact hole 13g is formed in one end part of the gate electrode 3. Also, symbol 13d denotes a contact hole which connects the semiconductor region 6D for the drain and a first-layer wiring line. Further, symbol 13s denotes a contact hole which connects the semiconductor region 6S for the sources and a first-layer wiring line. Such contact holes 13s are arranged in correspondence with the respective gate electrodes 3 (the respective MISFETs). Thus, the potentials of the sources to be supplied to the individual MISFETs Q can be stabilized. Besides, the contact holes 13s are located between the gate electrodes 3 which are adjacent in the lateral direction of FIG. 19. The reason therefor is that each of the spaces between the gate electrodes 3 adjacent in the vertical direction of FIG. 19 is set narrower than the least adjacent gate interval as stated above, so it is difficult of establishing conduction with the semiconductor region 6S for the sources.

There will be described a case where the technical idea of the present invention is applied to such an arrangement.

Figure 20A:
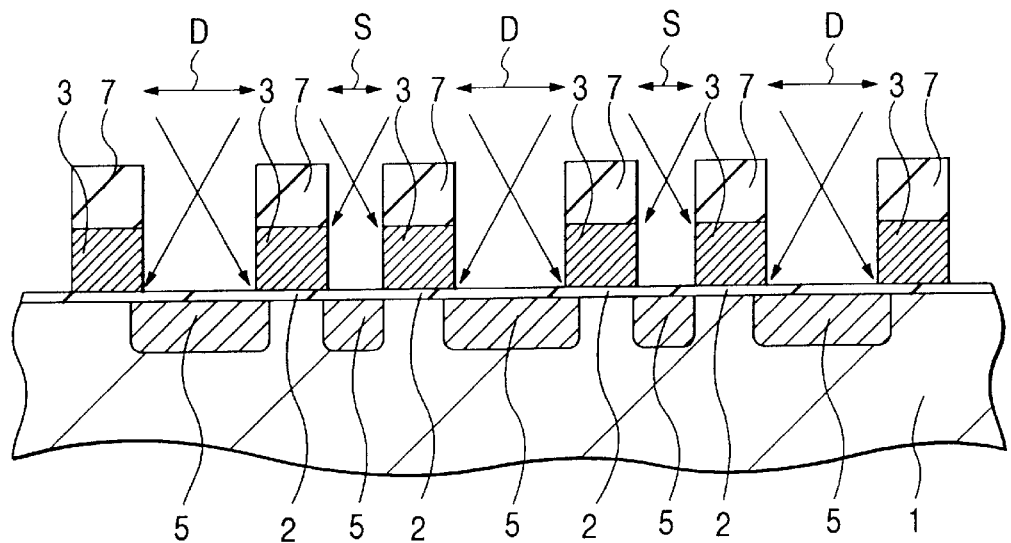
FIG. 20(*a*) is a sectional view taken along line A—A indicated in FIG. 19, for elucidating the technical idea of the present invention, while FIG. 20(*b*) is a sectional view taken along line B—B indicated in FIG. 19, in the same process as in FIG. 20(*a*)
Figure 20B:
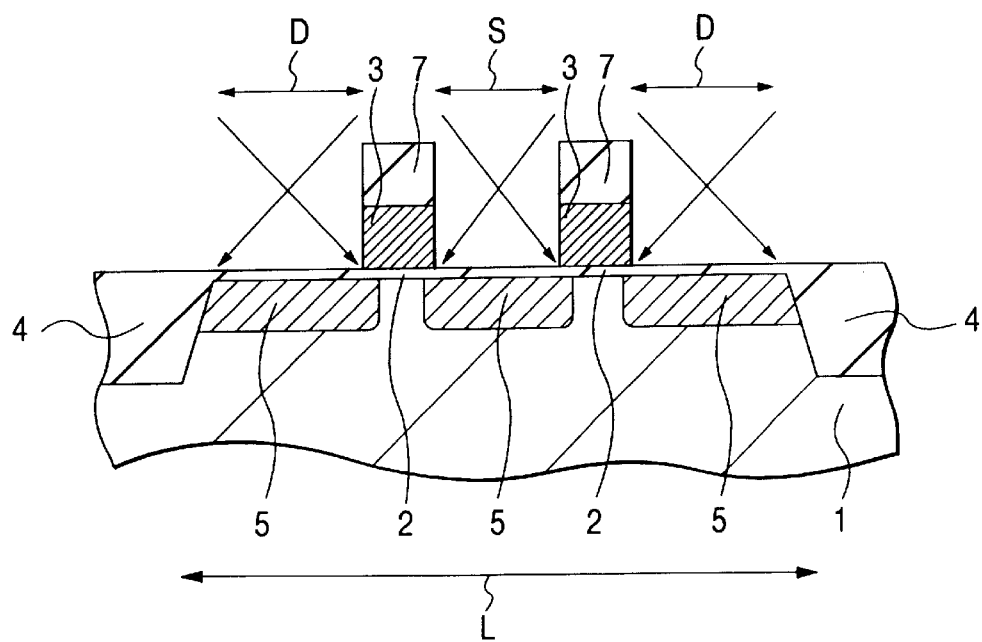

First, FIGS. 20(a) and 20(b) illustrate the step of introducing an impurity for suppressing the short channel effect. Conditions for the introduction are the same as in the technical idea of the present invention elucidated before, and shall be omitted from description. Depicted here is a case where a cap insulator film 7 is formed on the gate electrode 3. As shown in FIG. 20(a), a pocket region 5 which is formed in the drain forming region D of the MISFET is so formed that the end parts thereof underlie the end parts of the gate electrode 3. In contrast, a pocket region 5 which is formed in the source forming region S of the MISFET is so formed that the end parts thereof do not underlie the end parts of the gate electrodes 3 (alternatively, granted that the end parts of the pocket region 5 have come under the end parts of the gate electrodes 3, they underlie these end parts only to the extent of being cancelled by later impurity diffusion from semiconductor regions for the source and drain). As shown in FIG. 20(b), however, the end parts of the pocket region 5 somewhat underlie the end parts of the gate electrodes 3 in the section of line B—B in FIG. 19, even in the source forming region S of the identical MISFET. In other words, even in the semiconductor region for the source of one MISFET, there are a part where the pocket region 5 is formed nearby, and a part where not. Incidentally, the situation of the drain forming region D in FIG. 20(b) is the same as in FIG. 20(a) and shall be omitted from description.

Figure 21A:
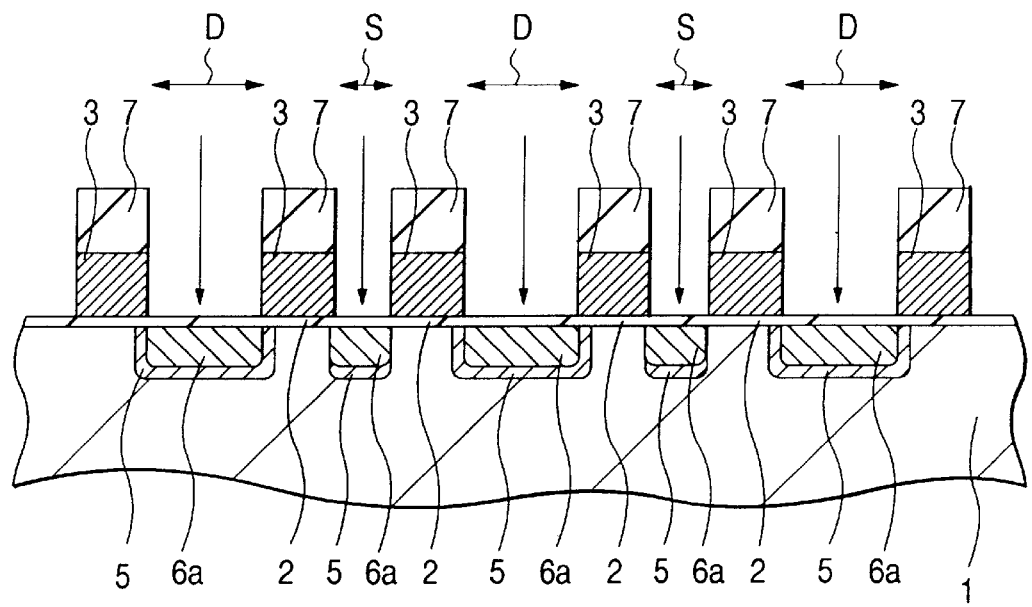
FIG. 21(*a*) is a sectional view taken along line A—A indicated in FIG. 19, in a process which is performed subsequently to the process shown in FIGS. 20(*a*) and 20(*b*) in conformity with the technical idea of the present invention, while FIG. 21(*b*) is a sectional view taken along line B—B indicated in FIG. 19, in the same process as in FIG. 21(*a*)
Figure 21B:
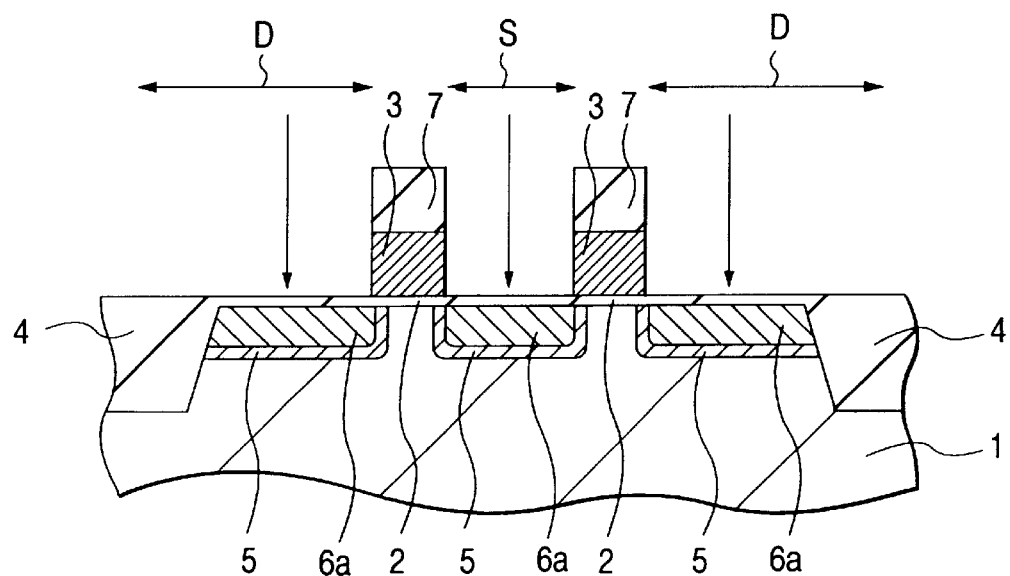

Next, FIGS. 21(a) and 21(b) illustrate the step of introducing an impurity for forming lightly-doped semiconductor regions (which correspond to the semiconductor regions 6na of n⁻-type explained in the foregoing embodiment 1). Conditions for the introduction are the same as explained in Embodiment 1, and shall be omitted from description. The lightly-doped semiconductor regions are effective for suppressing the hot electron effect and for lowering the parasitic resistance. Moreover, they are effective in a case explained below by way of example. As will be stated later, an impurity for forming the sources and drains is implanted into a semiconductor substrate 1 by employing as a mask the gate electrodes 3 and side walls formed on the side surfaces thereof. Consequently, semiconductor regions thus formed are spaced from the gate electrodes 3 when viewed in plan. In this regard, the distances between the gate electrodes 3 and the semiconductor regions for the sources and drains as viewed in plan may be shortened to the extent of posing no problem in the operation of the MISFETs, by impurity diffusion based on a subsequent heat treatment or the like. When the distances are not shortened, the MISFETs might fail to operate. Since the temperature of the heat treatment tends to be set lower in recent years, such failure to operate is liable to occur. The failure to operate can be avoided by the contrivance in which the lightly-doped semiconductor regions of the same conductivity type as that of the semiconductor regions for the sources and drains are interposed between these semiconductor regions and the gate electrodes 3.

As shown in FIG. 21(a), each of the lightly-doped semiconductor regions 6a is formed so as to have an impurity profile which is shallower than that of the corresponding pocket region 5 when viewed in section and which is narrower than the same when viewed in plan. On this occasion, in the drain forming region D, the pocket region 5 is left behind so as to surround the periphery (side surfaces and bottom surface) of the lightly-doped semiconductor region 6a. On the other hand, in the source forming region S of the least adjacent gate interval, the pocket region 5 has its conductivity type cancelled, and it substantially disappears (at this stage, it is left behind on the bottom side of the lightly-doped semiconductor region 6a). As shown in FIG. 21(b), however, the pocket region 5 is left behind on one side surface and the bottom side of the lightly-doped semiconductor region 6a in the section of line B—B in FIG. 19, even in the source forming region S of the identical MISFET. Incidentally, the situation of the side of the drain forming region D in FIG. 21(b) is the same as in FIG. 21(a) and shall be omitted from description.

Figure 22A:
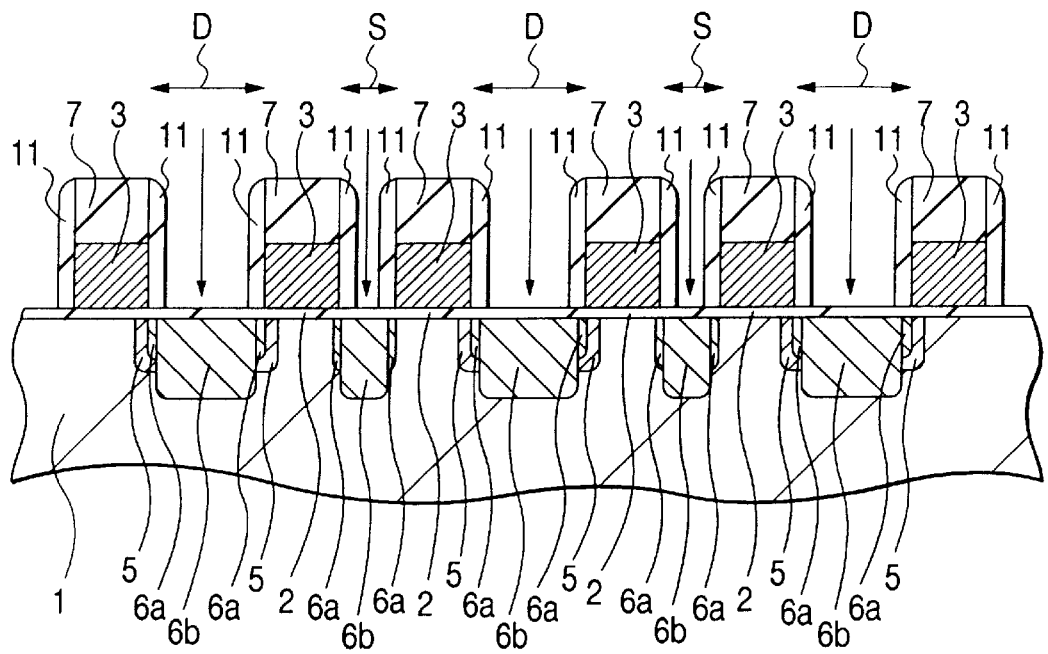
FIG. 22(*a*) is a sectional view taken along line A—A indicated in FIG. 19, in a process which is performed subsequently to the process shown in FIGS. 21(*a*) and 21(*b*) in conformity with the technical idea of the present invention, while FIG. 22(*b*) is a sectional view taken along line B—B indicated in FIG. 19, in the same process as in FIG. 22(*a*)
Figure 22B:
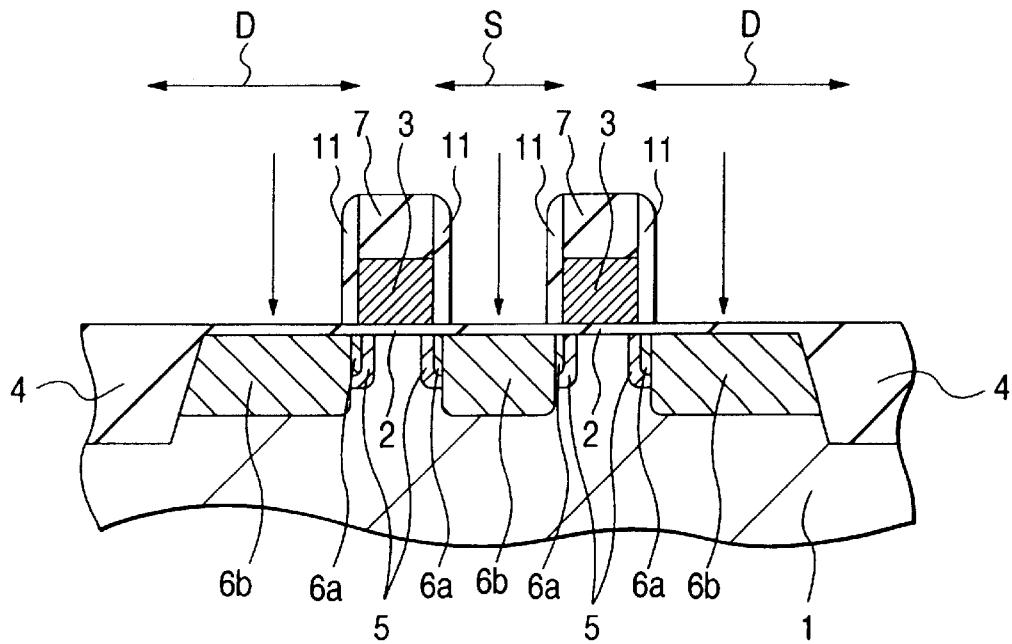

Next, FIGS. 22(a) and 22(b) illustrate the step of introducing an impurity for forming heavily-doped semiconductor regions which have an impurity concentration higher than that of the lightly-doped semiconductor regions 6a and which have the same conductivity type as that of these regions 6a (which correspond to the semiconductor regions 6na of n⁺-type or the semiconductor regions 6p of p⁺-type explained in the foregoing embodiment 1). Conditions for the introduction are the same as explained in Embodiment 1, and shall be omitted from description. Besides, in advance of the impurity introduction, side walls 11 are formed on the side surfaces of the gate electrodes 3 and cap insulator films 7 in the way explained in Embodiment 1.

As shown in FIG. 22(a), each of the heavily-doped semiconductor regions 6b is formed so as to have an impurity profile which is deeper than that of the lightly-doped semiconductor region 6a as well as the pocket region 5 corresponding thereto when viewed in section and which is narrower than the same when viewed in plan. On this occasion, in the drain forming region D, the pocket region 5 is left behind so as to surround the lightly-doped semiconductor region 6a. On the other hand, in the source forming region S of the least adjacent gate interval, the pocket region 5 has its conductivity type cancelled, and it disappears. As shown in FIG. 22(b), however, the pocket region 5 is left behind on one side surface of the lightly-doped semiconductor region 6a so as to surround this region 6a in the section of line B—B in FIG. 19, even in the source forming region S of the identical MISFET. Incidentally, the situation of the side of the drain forming region D in FIG. 22(b) is the same as in FIG. 22(a) and shall be omitted from description.

Now, the technical idea of the present invention will be elucidated in relation to a case where it is applied to, for example, a DRAM (Dynamic Random Access Memory).

Figure 23:
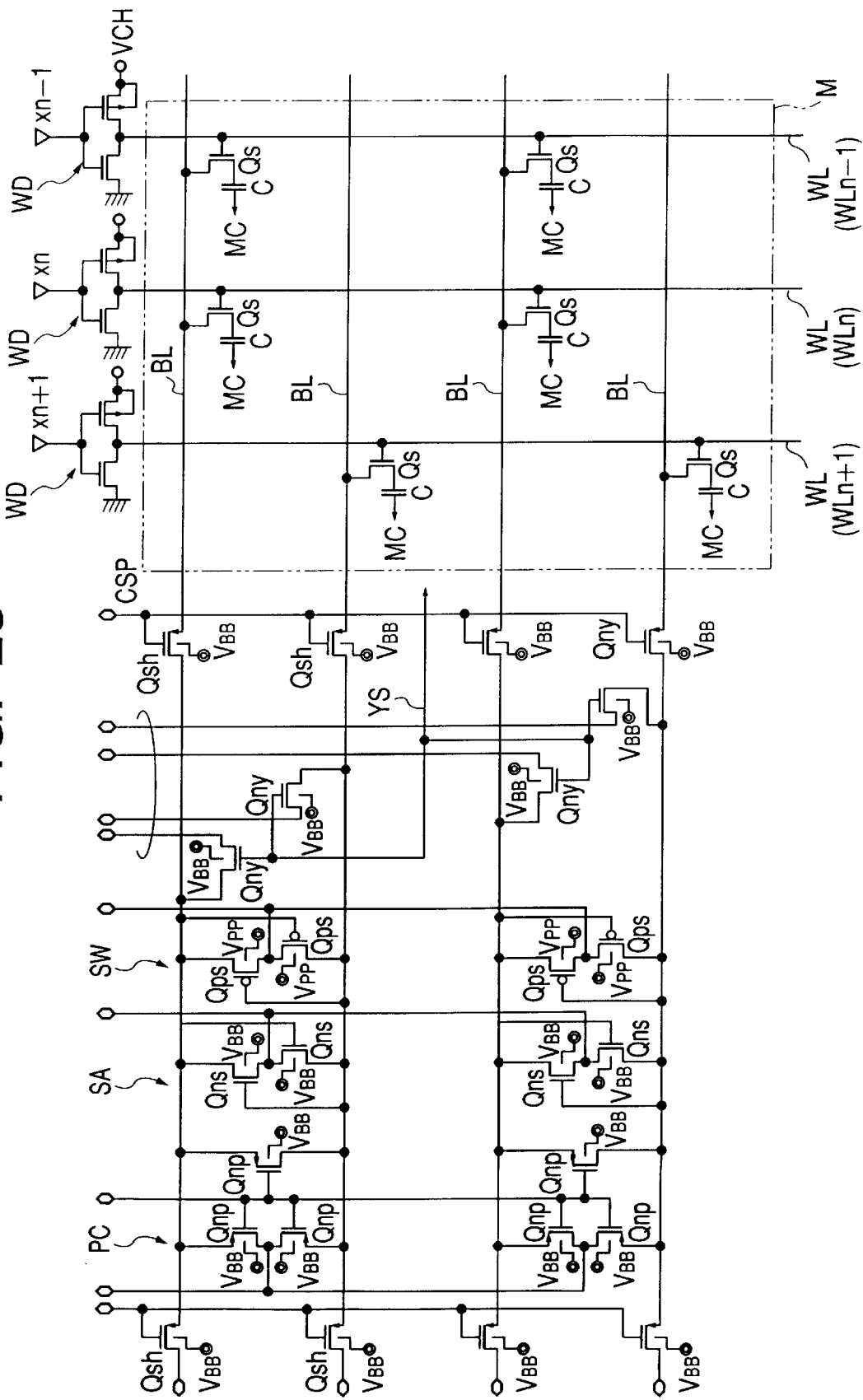
FIG. 23 is an equivalent circuit diagram of essential portions in a semiconductor device in another embodiment in which the technical idea of the present invention is applied.

FIG. 23 illustrates an equivalent circuit diagram of the essential portions of the DRAM. As shown in the figure, the memory area M of the DRAM includes a plurality of word lines WL ($WL_{n-1}$, $WL_n$, $WL_{n+1}$ . . . ) extending in a row direction, a plurality of bit lines BL extending in a column direction, and a plurality of memory cells MC arranged at the intersection points of the word lines WL and bit lines BL. One memory cell MC for storing information of 1 (one) bit includes an information storing capacitor C, and a memory-cell selecting MISFET Qs connected in series with the capacitor C. Either of the source and drain of the memory-cell selecting MISFET Qs is electrically connected with the information storing capacitor C, while the other is electrically connected with the corresponding bit line BL. One end of each word line WL is connected to a word driver WD.

A sense amplifier circuit SA, a precharge circuit PC, an I/O switch circuit SW, etc. in a direct peripheral circuit area (the left side of FIG. 23) are electrically connected to one end of each bit line BL. The sense amplifier circuit SA is a circuit which detects and amplifies the information stored in the memory cell MC, and which transfers the amplified signal to an output circuit. Each sense amplifier circuit SA has a CMIS (Complementary MIS) structure, and it includes two nMISFETs Qns and two pMISFETs Qps. The two nMISFETs Qns and two pMISFETs Qps are electrically connected between the bit lines BL adjoining each other.

The precharge circuit PC is a circuit which sets the potential of the bit line BL at a predetermined potential during the operation of the DRAM. It includes three nMISFETs Qnp, which are electrically connected between the bit lines BL adjoining each other. Further, the I/O switch circuit SW is a circuit by which a signal delivered from the bit line BL as predetermined is transferred to an input/output circuit on the basis of a signal delivered from a column selecting line YS. It includes two nMISFETs Qny. By the way, symbol VBB denotes a substrate potential. Besides, symbol Qsh denotes a shared MISFET.

Figure 24:
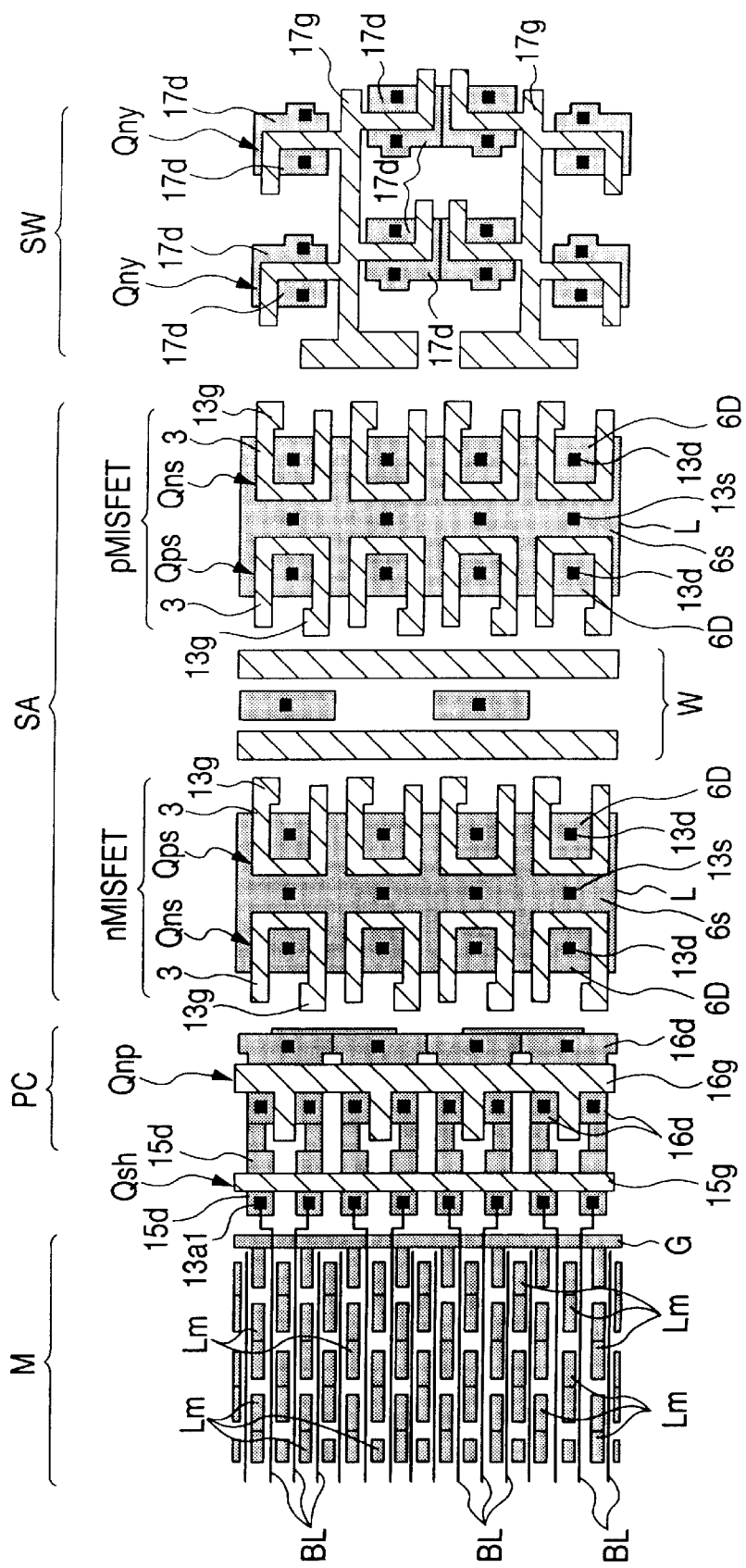
FIG. 24 is a plan view showing that element layout of the semiconductor device which corresponds to a circuit shown in FIG. 23.
Figure 25:
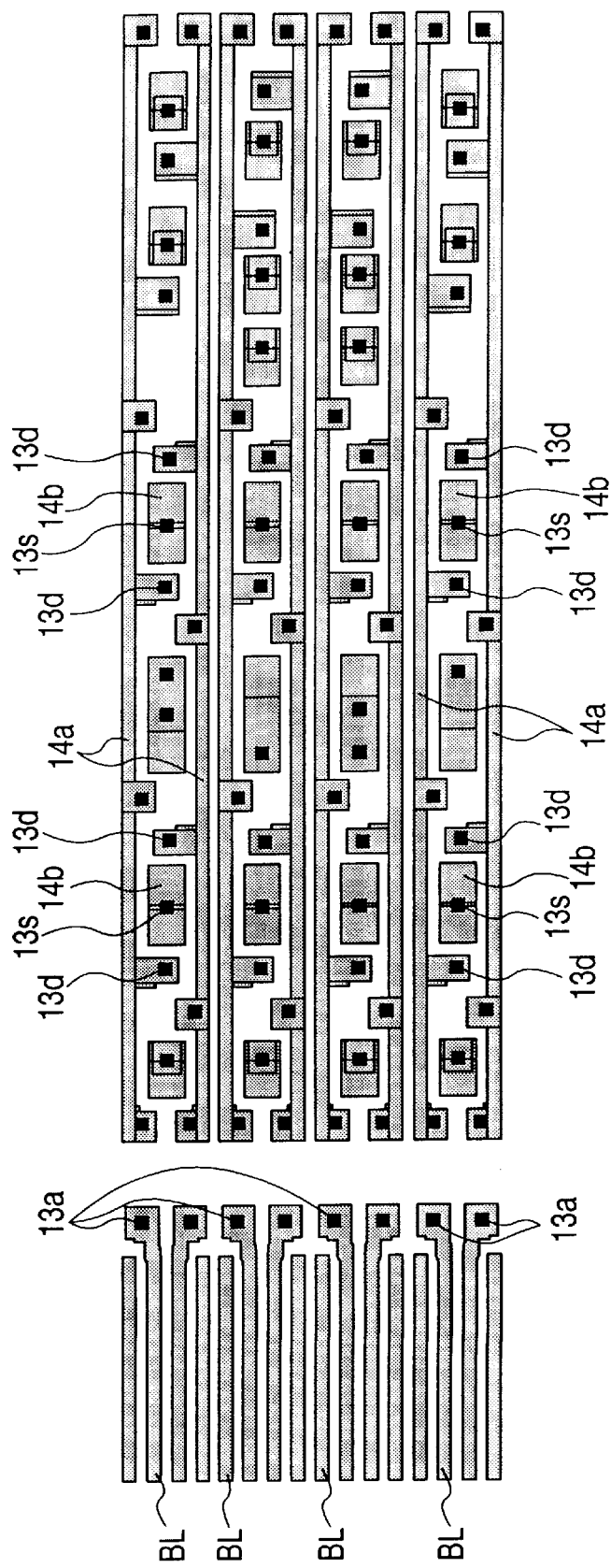
FIG. 25 is a plan view showing a wiring line layout which is taken on the same plane coordinates as in FIG. 24 and which overlies elements shown in FIG. 24.

FIG. 24 illustrates a plan view of the essential portions of circuit parts shown in FIG. 23, while FIG. 25 illustrates a plan view of a layer which is taken on the same plane positional coordinates as in FIG. 24 and which overlies the circuit parts shown in FIG. 24.

A plurality of active areas Lm are arranged in the memory area M. Each active area Lm is formed in, for example, an oblong when viewed in plan. The contour of the active area Lm is defined by an isolation portion 4. Each active area Lm is formed with semiconductor regions for the sources and drains of the memory-cell selecting MISFETs in the number of 2. Incidentally, the memory area M is surrounded with a guard ring G.

A plurality of bit lines BL are arranged in the first wiring layer of the memory area M. The bit lines BL are interposed between the active areas Lm which are respectively adjacent to each other in the vertical direction of FIG. 24 (in a direction intersecting with the bit lines BL). Each bit line BL extends in the lateral direction of each of the FIGS. 24 and 25 (in the extending direction of the active areas Lm). It is electrically connected with a peripheral circuit in such a way that the end part thereof is electrically connected with the semiconductor region 15d of a shared MISFET Qsh through a contact hole 13a1. Incidentally, the bit lines BL are formed in the first wiring layer as shown in FIG. 25, but they are also shown in FIG. 24 in order to facilitate understanding of positional relations.

The plurality of shared MISFETs Qsh are arranged in the vertical direction of FIG. 24 (in the direction intersecting with the bit lines BL). Each shared MISFET Qsh is constructed of an nMISFET, and it includes semiconductor regions 15d for the source and drain thereof and a gate electrode 15g. The gate electrode 15g is common to a plurality of shared MISFETs Qsh. The other semiconductor region 15d of the shared MISFET Qsh is formed integrally with the semiconductor region 16d of a precharge circuit PC.

The plurality of precharge circuits PC are arranged in the vertical direction of FIG. 24. The precharge circuits PC are arranged at a rate of one to four bit lines BL. That is, the arrangement interval of the precharge circuits PC is determined by the interval of the elements in the memory area M. Therefore, the fabricating dimensions of the precharge circuit PC are smaller than the other peripheral circuits. The nMISFET Qnp of the precharge circuit PC includes semiconductor regions 16d for the source and drain thereof and a gate electrode 16g. The gate electrode 16g is used in common within each precharge circuit PC and among the precharge circuits PC.

A plurality of sense amplifier circuits SA are also arranged in the vertical direction of FIG. 24. The constituent nMISFETs Qns and pMISFETs Qps of the sense amplifier circuits SA are located bilaterally in FIG. 24 so as to hold a well feeding (electric power feeding) region W therebetween. Likewise to the precharge circuits PC, the sense amplifier circuits SA are arranged at a rate of one to four bit lines BL. The technical idea of the present invention elucidated before is applied to the sense amplifier circuits SA. The application is grounded on the fact that the sense amplifier circuits SA have its arrangement interval determined by the interval of the elements in the memory area M likewise to the precharge circuits PC and are smaller than the other peripheral circuits in fabricating dimensions, so pocket regions cannot be formed on both the drain sides and source sides of the constituent MISFETs of each sense amplifier circuit SA in the conventional arrangement. In other words, the application is grounded on the fact that, when the pocket regions are intended to be formed, the interval of the sense amplifier circuits SA adjoining each other must be widened, so the interval of the adjacent elements in the memory area M must be enlarged. The technical idea of the present invention (refer to FIG. 19–FIG. 22(b), etc.) is therefore applied, whereby both the requisites of ensuring the reliability of the MISFETs and reducing the arrangement interval can be met without adding any manufacturing process or adopting any complicated technique of high degree. As explained before, when the MISFET has the structure in which the pocket region is provided on only the drain region side, not on the source region side, the threshold voltage thereof is lower as compared with that of the MISFET provided with the pocket regions in both the source and the drain. In the sense amplifier circuit SA, however, the problem of degradation in performance is not especially posed for the reasons that the gate length of the gate electrode 3 in each 9 of the constituent MISFETs Qns and Qps is designed to be greater than in the other circuits, and that the adjustment of the threshold voltage is structurally permitted by applying a back bias voltage from a semiconductor substrate 1.

Each of the nMISFETs Qns and pMISFETs Qps of the sense amplifier circuit SA includes a semiconductor region 6S for the source thereof, a semiconductor region 6D for the drain thereof, and a gate electrode 3. The semiconductor region 6S for the source of the nMISFET Qns and the semiconductor region 6D for the drain thereof are set at the n-type. The semiconductor region 6S for the source of the pMISFET Qps and the semiconductor region 6D for the drain thereof are set at the p-type. Each of the semiconductor regions 6D for the drains of the nMISFET Qns and pMISFET Qps is electrically connected with an overlying first-layer wiring line 14a through a contact hole 13d. Besides, each of the semiconductor regions 6S for the sources of the nMISFET Qns and pMISFET Qps is electrically connected with an overlying first-layer wiring line 14b through a contact hole 13s. The semiconductor region 6S for the sources is common to the respective MISFETs as in the foregoing. Thus, dimensions can be reduced. The length (gate length) of the gate electrode 3 in each of the MISFETs of the sense amplifier circuit SA is set greater than a length (gate length, about 0.32 μm by way of example) in each of the MISFETs of the other logic circuits in order to suppress the discrepancy of the threshold voltages of the MISFETs, and it is about 0.4 μm by way of example. Incidentally, the layout etc. of the nMISFETs Qns and pMISFETs Qps of the sense amplifier circuit SA are the same as explained with reference to FIG. 19 and shall be omitted from description.

A plurality of I/O switch circuits SW are also arranged in the vertical direction of FIG. 24. The nMISFET Qny of each I/O switch circuit SW includes semiconductor regions 17d for the source and drain thereof, and a gate electrode 17g. The gate electrode 17g is used in common within each I/O switch circuit SW. Incidentally, the first-layer wiring lines 14a, 14b shown in FIG. 25 are extended in the same direction as the extending direction of the bit lines BL, and they are formed at the same step as that of the bit lines BL. Second-layer wiring lines overlying the first-layer wiring lines are extended in a direction intersecting with the extending direction of the first-layer wiring lines 14a.

Next, an example will be described concerning a case where the technical idea of the present invention is applied to a method of manufacturing the above DRAM (Dynamic Random Access Memory) or an FRAM (Ferroelectric RAM). By the way, symbol NW in the drawings to be referred to in the ensuing description denotes an n-well feeding region, and symbol PW a p-well feeding region.

Figure 26:
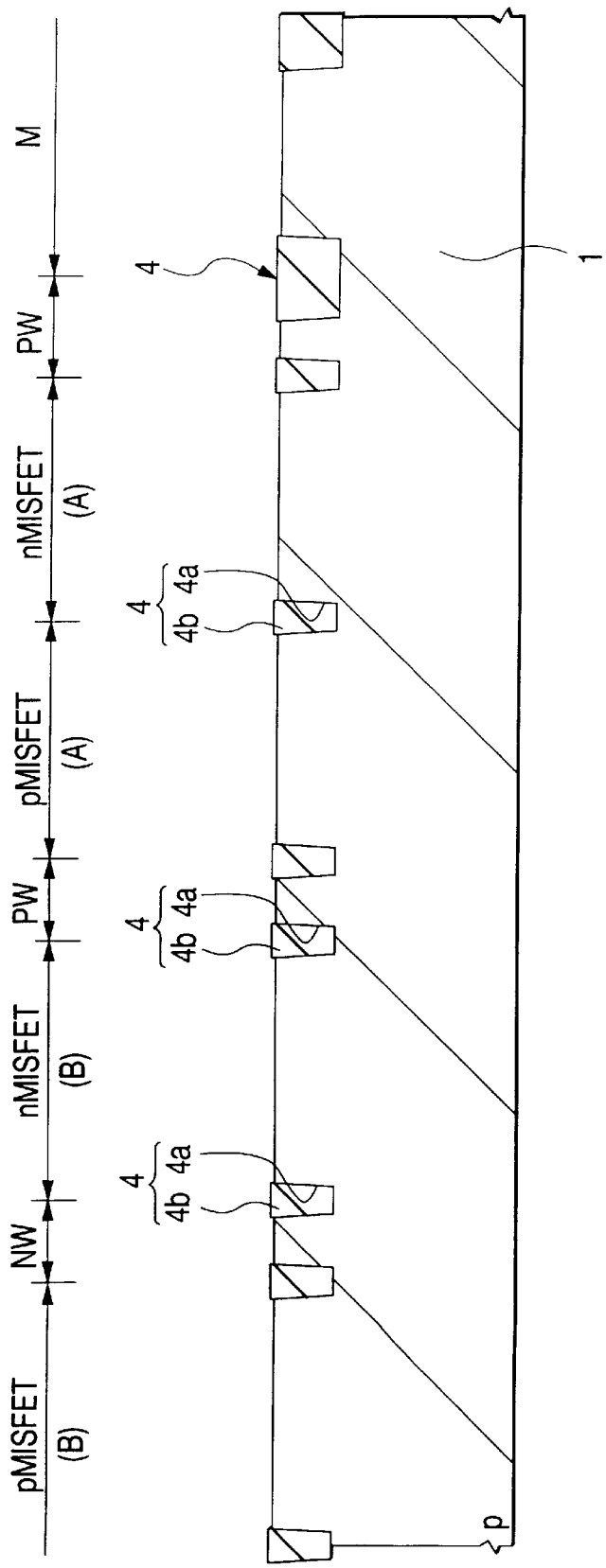
FIG. 26 is a sectional view of essential portions during the manufacturing process of a semiconductor device in another embodiment in which the technical idea of the present invention is applied.

FIG. 26 illustrates a sectional view of the essential portions of a semiconductor substrate during the manufacturing process of the semiconductor device in this embodiment. A semiconductor substrate (at this stage, a semiconductor wafer which integrally has regions for forming a plurality of semiconductor chips) 1 is formed with isolation portions 4 in its principal surface in the same way as in Embodiment 1. Incidentally, the isolation portions 4 have the function of isolating elements and the function of isolating a well feeding portion and element regions within each element.

Figure 27:
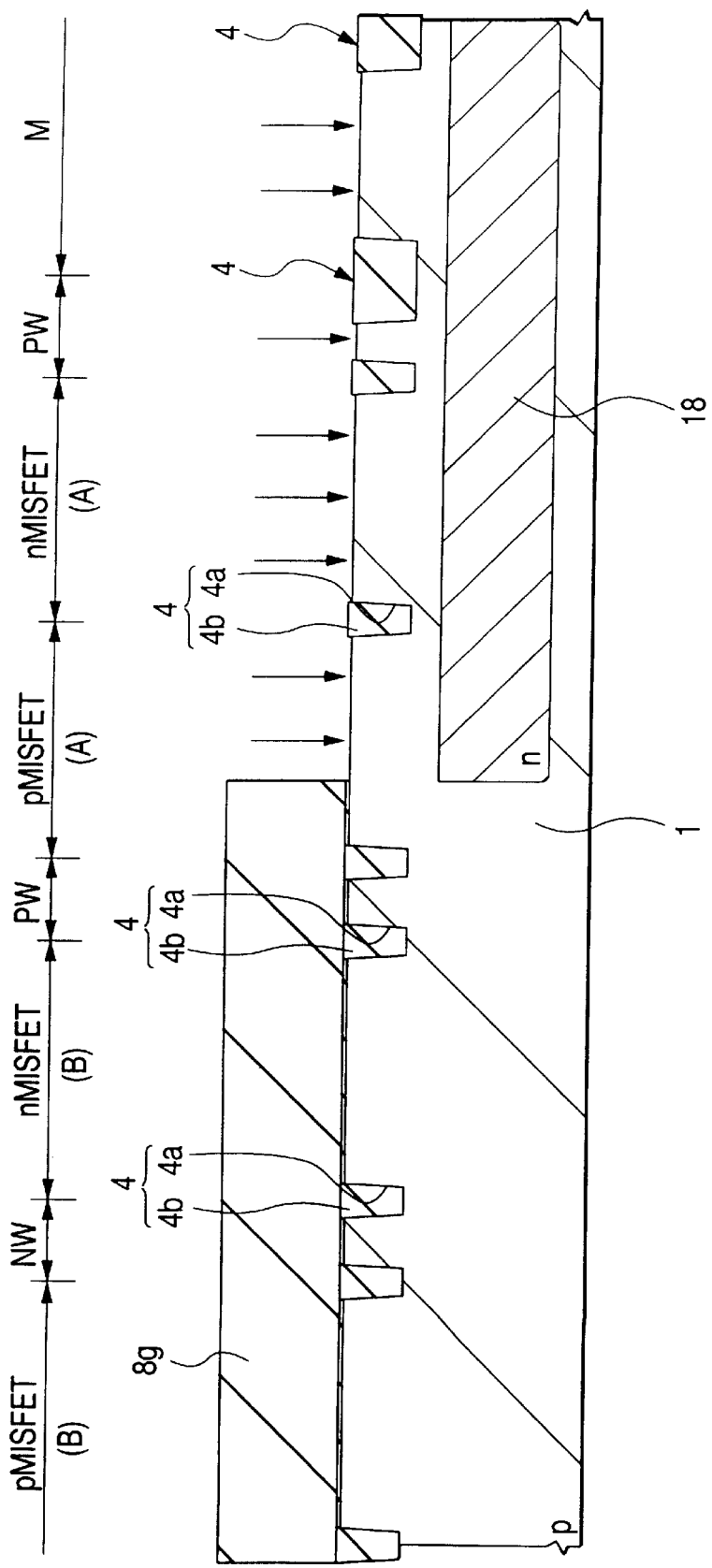
FIG. 27 is a sectional view of essential portions during the manufacturing process of the semiconductor device as succeeds to the process shown in FIG. 26.

First, as shown in FIG. 27, a photoresist film 8g which denudes a buried-well forming region and which covers the other regions is patterned on the principal surface of such a semiconductor substrate 1. Using the photoresist film 8g as a mask, the ions of an impurity, for example, phosphorus or arsenic are implanted into the semiconductor substrate 1. Thus, a buried n-well 18 is formed.

Figure 28:
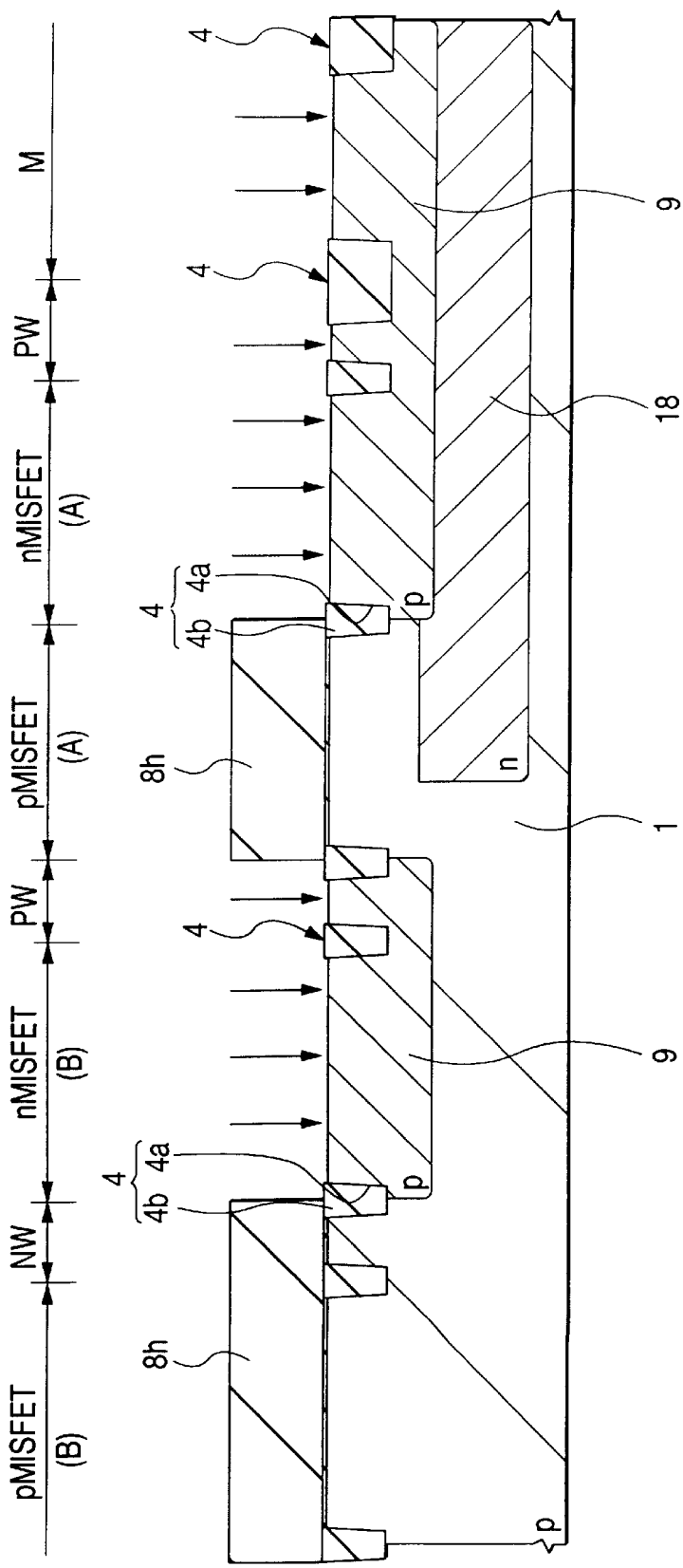
FIG. 28 is a sectional view of essential portions during the manufacturing process of the semiconductor device as succeeds to the process shown in FIG. 27.

Subsequently, the photoresist film 8g is removed, and as shown in FIG. 28, a photoresist film 8h which denudes regions for forming nMISFETs, p-well feeding regions PW and a memory area M and which covers regions for forming pMISFETs is patterned on the principal surface of the semiconductor substrate 1. Thereafter, using the photoresist film 8h as a mask, the ions of an impurity for forming p-wells and an impurity for adjusting the threshold voltages of the nMISFETs are implanted in succession. Thus, the p-wells 9 are formed.

At the step of introducing the impurity for the formation of the p-wells, the ion implantation is carried out in three divided stages for the wells, for the isolation and for the adjustment of a concentration. In all the stages, boron (B) or boron difluoride ($BF_2$), for example, is introduced into the semiconductor substrate 1. In the respective stages, however, the peak depth positions of impurity concentrations are made different by changing the levels of ion implantation energy. The ion implanting substep for the wells is a substep which introduces the impurity into the semiconductor substrate 1 at the highest ion implantation energy, and which determines the basic impurity concentration profile in the depthwise direction of the wells. The ion implanting substep for the isolation is a substep which introduces the impurity into the semiconductor substrate 1 at the second-highest ion implantation energy, and which serves to electrically isolate the adjacent wells from each other. Further, the ion implanting substep for the concentration adjustment is a substep which introduces the impurity into the semiconductor substrate 1 at the lowest ion implantation energy, and which serves to suppress the leakage currents between the sources and drains of the MISFETs to be formed in the wells. In addition, boron (B) or boron difluoride ($BF_2$), for example, is introduced into the semiconductor substrate 1 at the substep of introducing the impurity for the adjustments of the threshold voltages of the nMISFETs.

Subsequently, the photoresist film 8h is removed, and the semiconductor substrate 1 is heat-treated, thereby to activate the impurities introduced into this semiconductor substrate 1 by the above steps of introducing the impurities.

Figure 29:
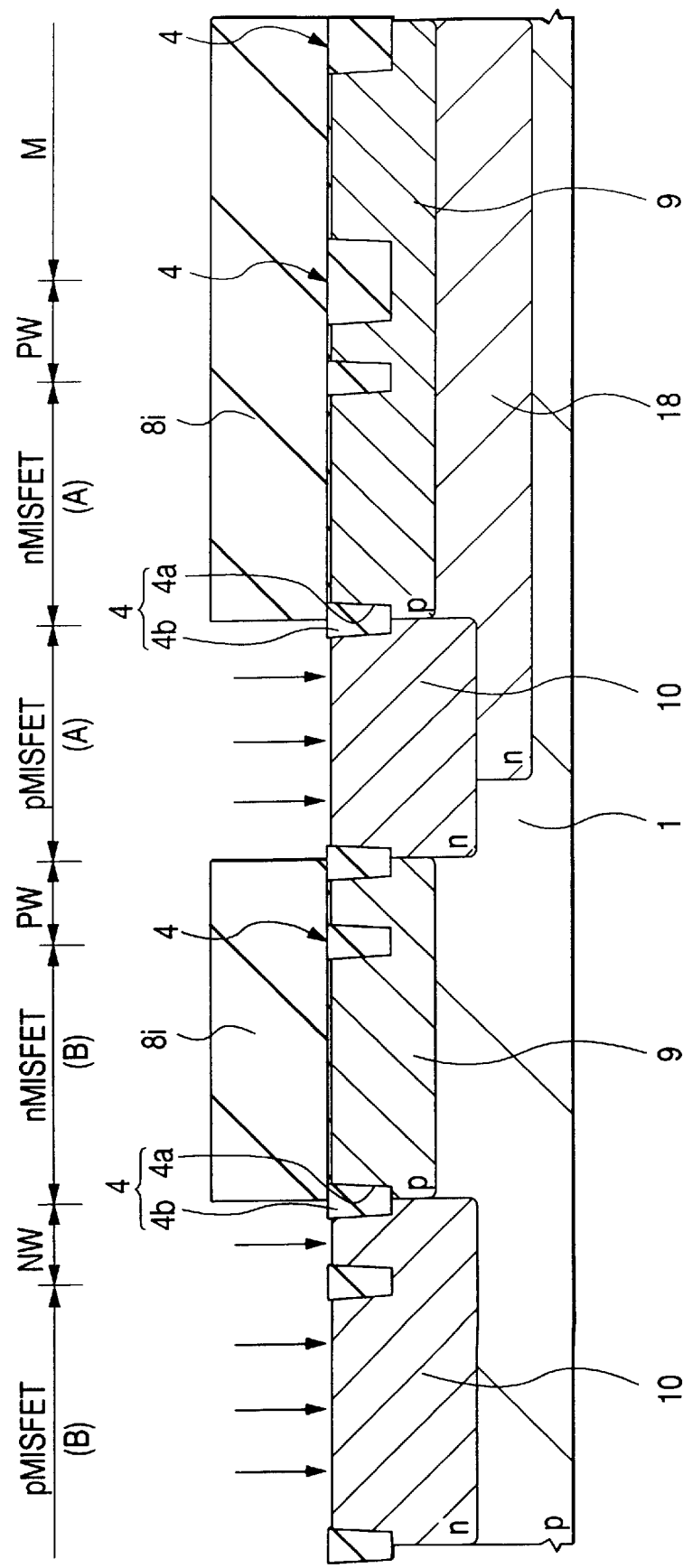
FIG. 29 is a sectional view of essential portions during the manufacturing process of the semiconductor device as succeeds to the process shown in FIG. 28.

Next, as shown in FIG. 29, a photoresist film 8i which denudes the pMISFET forming regions and an n-well feeding region NW and which covers the nMISFET forming regions and the memory area M is patterned on the principal surface of the semiconductor substrate 1. Thereafter, using the photoresist film 8i as a mask, the ions of an impurity for forming n-wells and an impurity for adjusting the threshold voltages of the pMISFETs are implanted in succession. Thus, the n-wells 10 are formed.

At the step of introducing the impurity for the formation of the n-wells, the ion implantation is carried out in three divided stages for the wells, for the isolation and for the adjustment of a concentration, as in the case of the p-wells 9. Phosphorus, for example, is introduced into the semiconductor substrate 1 here. In addition, the sort of the impurity at the substep of introducing the impurity for the adjustments of the threshold voltages of the pMISFETs in a thick film portion is the same as in the foregoing case of the introduction of the impurity for adjusting the threshold voltages of the nMISFETs.

Figure 30:
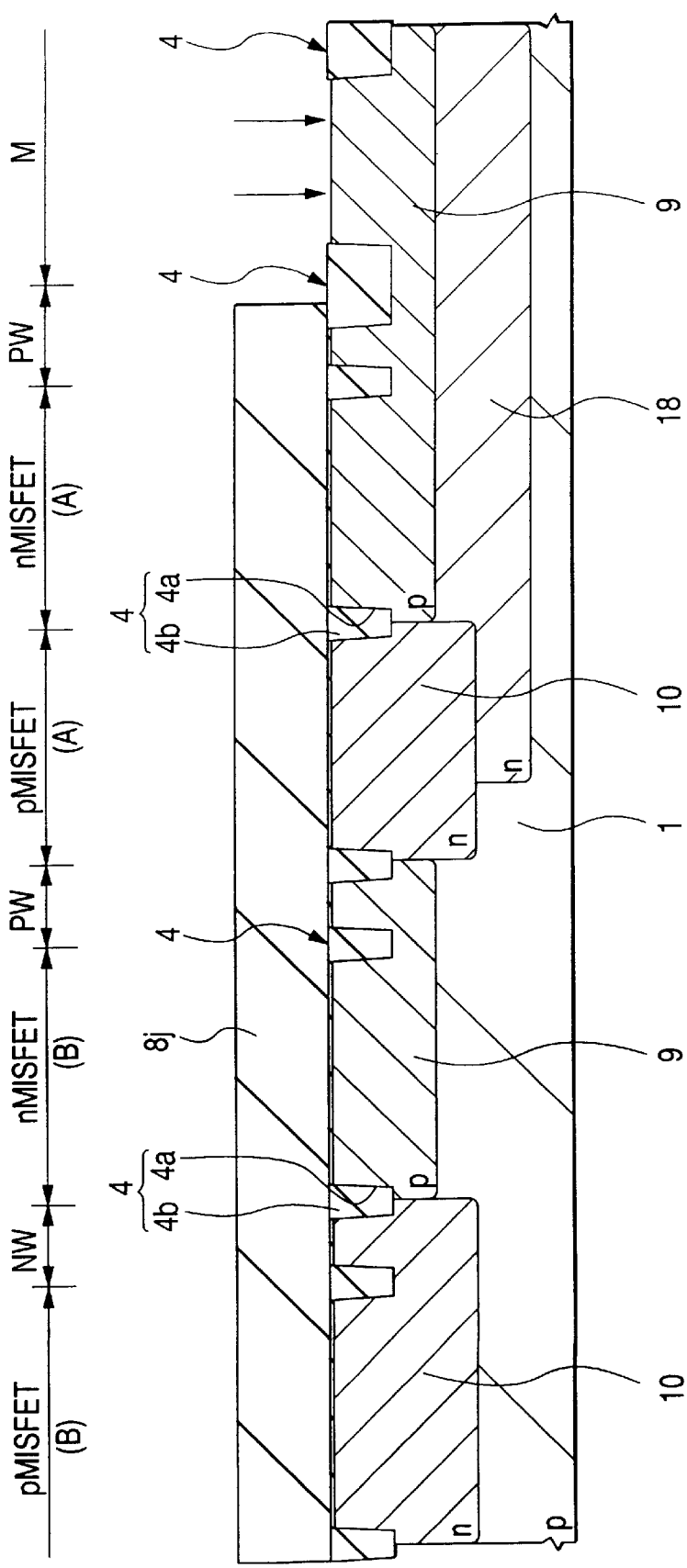
FIG. 30 is a sectional view of essential portions during the manufacturing process of the semiconductor device as succeeds to the process shown in FIG. 29.

Subsequently, the photoresist film 8i is removed, and as shown in FIG. 30, a photoresist film 8j which denudes the memory area M and which covers the other regions is patterned on the principal surface of the semiconductor substrate 1. Next, using the photoresist film 8j as a mask, the ions of an impurity, for example, boron are implanted into the semiconductor substrate 1 in order to adjust the threshold voltages of memory-cell selecting MISFETs in the memory area M. Thus, the threshold voltages of the memory-cell selecting MISFETs can be favorably set.

Figure 31:
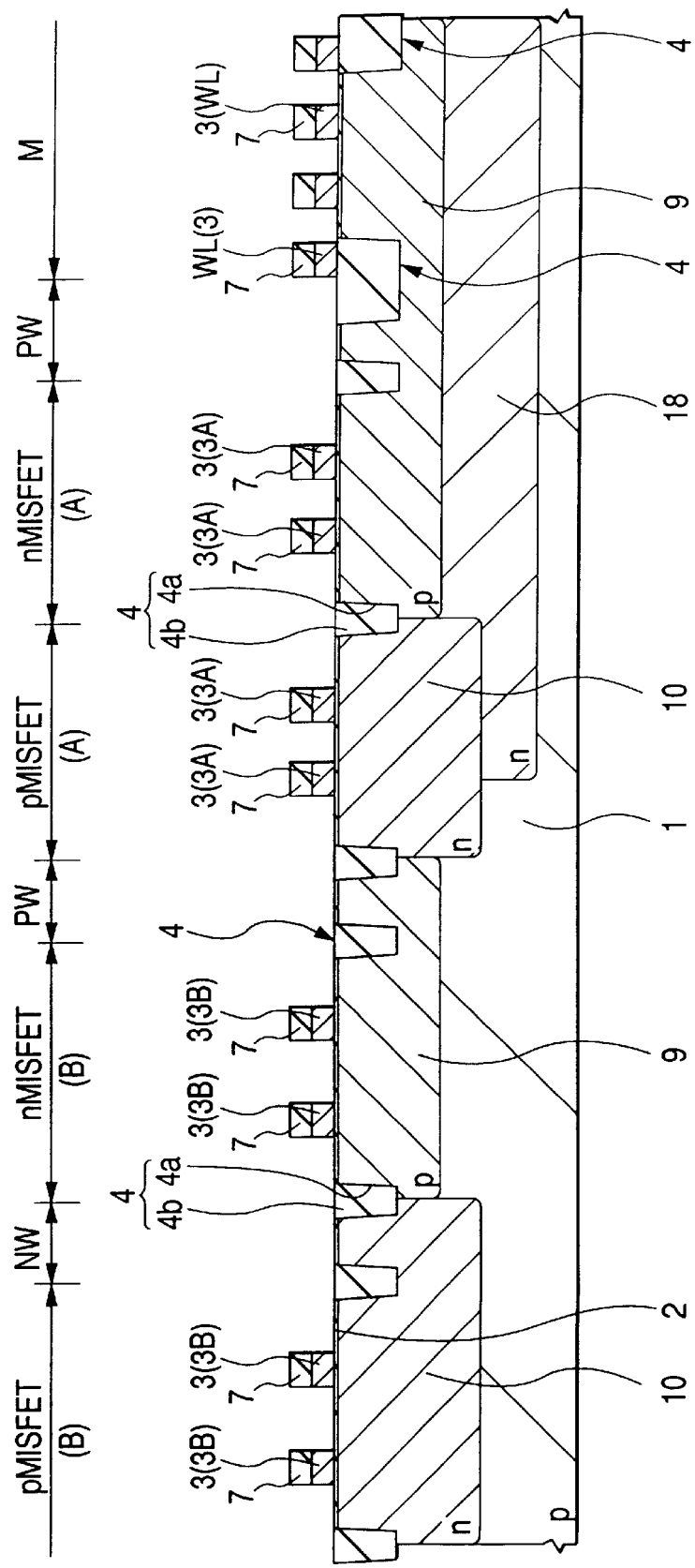
FIG. 31 is a sectional view of essential portions during the manufacturing process of the semiconductor device as succeeds to the process shown in FIG. 30.

Thereafter, the semiconductor substrate 1 is subjected to a thermal oxidation treatment. Thus, as shown in FIG. 31, a gate insulator film 2 made of, for example, a silicon oxide film is formed on the principal surface of the semiconductor substrate 1. By way of example signifying no special restriction, the semiconductor substrate 1 may well be heat-treated in an atmosphere of NO (nitrogen oxide) or $N_2O$ (nitrous oxide) after the formation of the gate insulator film 2, thereby to segregate nitrogen at the interface between the gate insulator film 2 and the semiconductor substrate 1 (as an oxidizing-nitriding treatment). When the gate insulator film 2 is thinned down to about 8 nm, a distortion develops at the interface between the gate insulator film 2 and the semiconductor substrate 1 on account of the difference of the thermal expansion coefficient of the film 2 from that of the substrate 1, and it induces the creation of hot carriers. Since the nitrogen segregated at the interface of the gate insulator film 2 with the semiconductor substrate 1 relieves the distortion, the oxidizing-nitriding treatment can enhance the reliability of the very thin gate insulator film 2 and can restrain the hot carriers, thereby to enhance the reliability of the MISFETs.

Thereafter, a conductor film for forming gate electrodes and an insulator film for forming cap insulator films are successively formed on the semiconductor substrate 1 by CVD or the like, and the films are patterned by a photolithographic technique and a dry etching technique. Thus, the gate electrodes 3 (3A, 3B) are formed together with the cap insulator films 7 overlying them. The gate electrode 3 is made of low-resistance polycrystal silicon of $n^+$-type doped with, for example, phosphorus, but it is variously alterable without being restricted thereto. By way of example, the gate electrode 3 may well be constructed by forming a tungsten silicide film or the like on a low-resistance polycrystal silicon film, or by forming a metal film of tungsten or the like on a low-resistance polycrystal silicon film through a barrier metal film of tungsten nitride, titanium nitride or the like. Besides, the cap insulator film 7 is made of, for example, a silicon nitride film. Incidentally, the method in which the cap insulator films 7 are used as the etching mask as explained in Embodiment 1 may well be adopted for forming the gate electrodes 3.

Also here in FIG. 31, the case is illustrated where two MISFETs are formed in one MISFET forming region. Accordingly, two gate electrodes 3 are arranged in adjacency to each other within one MISFET forming region. In each of the pMISFET and nMISFET forming regions (B) on the left side of FIG. 31, among such MISFET forming regions, the adjacency interval of the gate electrodes 3B, 3B adjacent to each other is set to be larger than the least adjacent gate interval defined before. The pMISFETs and nMISFETs formed in the regions (B) are MISFETs for which the interval of the adjacent elements need not be narrowed or for which the reliability of the elements is preferred to the interval of the adjacent elements, MISFETs whose threshold voltages are to be set relatively high, etc. Such MISFETs include, for example, ones constituting the direct peripheral circuit of the DRAM, and ones constituting a logic circuit if provided on the identical semiconductor substrate 1. As to these MISFETs, the arrangement of source forming regions and drain forming regions is not especially designated.

On the other hand, in each of the pMISFET and nMISFET forming regions (A) on the right side of FIG. 31, the adjacency interval of the gate electrodes 3A, 3A adjacent to each other is smaller than the least adjacent gate interval. The pMISFETs and nMISFETs formed in the regions (A) are MISFETs for which the interval of the adjacent elements needs to be narrowed, or MISFETs whose threshold voltages are set relatively low and which pose no problem even when pocket regions are provided on only the drain sides thereof. Such MISFETs include, for example, ones which constitute the direct peripheral circuit of the DRAM, such as the sense amplifier circuit SA explained before. Also in Embodiment 2, the interval of the gate electrodes 3A, 3A is about 0.3 pm by way of example. Besides, in each of the pMISFET and nMISFET forming regions (A), a source region which is shared by the MISFETs adjoining each other is arranged between the gate electrodes 3A, 3A adjacent to each other. Further, the gate electrodes 3 in the memory area M on the most right side of FIG. 31 form parts of the word lines WL.

Figure 32:
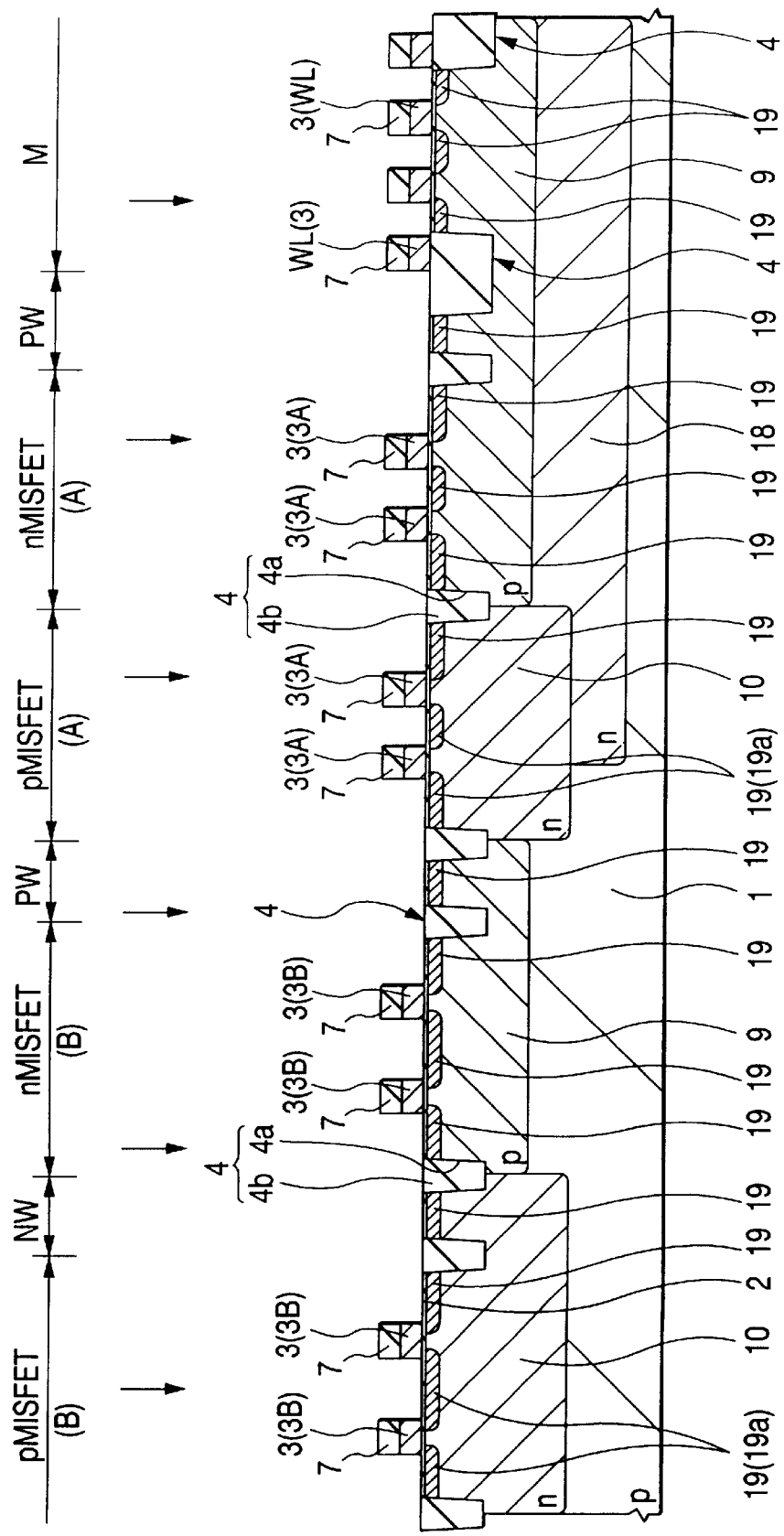
FIG. 32 is a sectional view of essential portions during the manufacturing process of the semiconductor device as succeeds to the process shown in FIG. 31.

At the next step, as shown in FIG. 32, the ions of, for example, phosphorus is implanted into the whole principal surface of the semiconductor substrate 1 perpendicularly thereto by employing the gate electrodes 3 (word lines WL) as a mask. Thus, semiconductor regions 19 of $n^-$-type are formed in the semiconductor substrate 1. This step serves to form $n^-$-type semiconductor regions for the sources and drains of the memory-cell selecting MISFETs in the memory area M. On this occasion, the $n^-$-type semiconductor regions 19a formed in the pMISFET forming regions function as the pocket regions of the pMISFETs.

Figure 33:
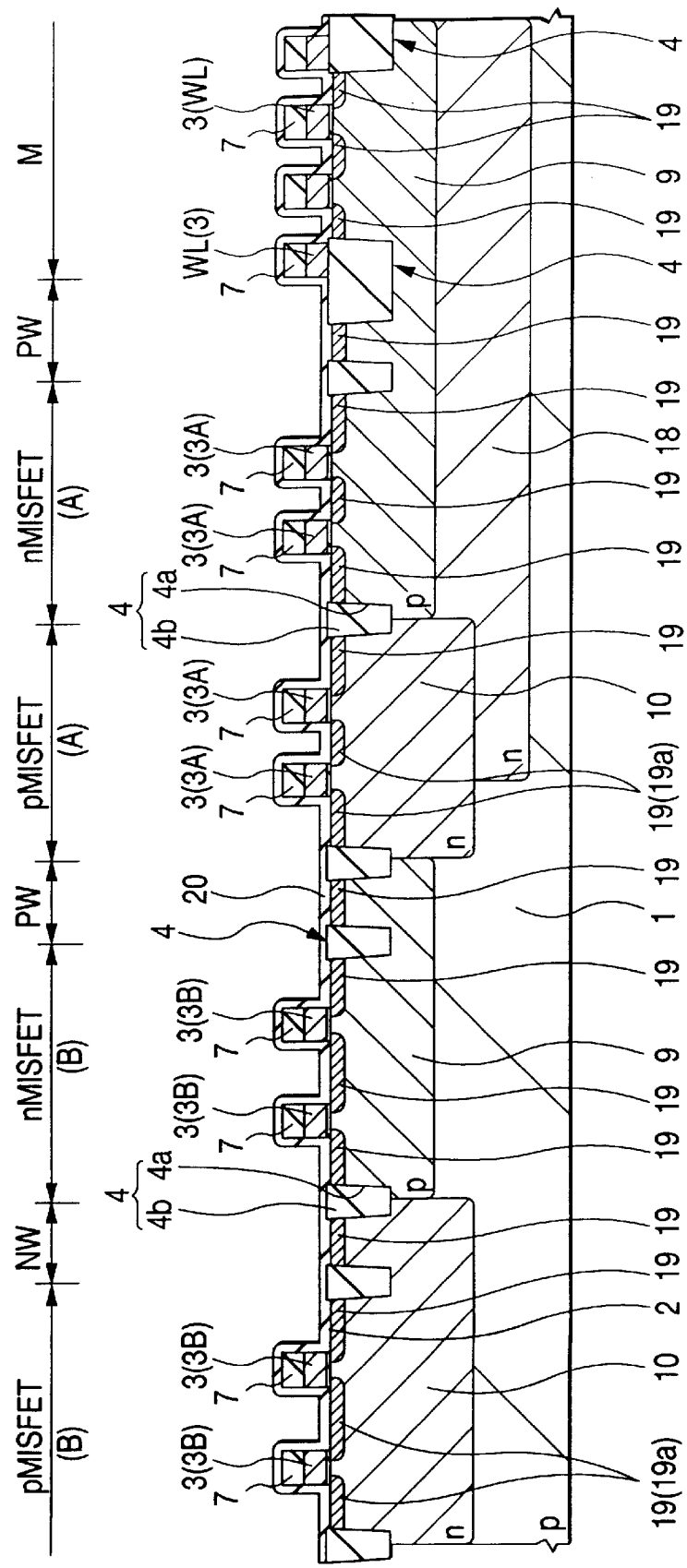
FIG. 33 is a sectional view of essential portions during the manufacturing process of the semiconductor device as succeeds to the process shown in FIG. 32.

Subsequently, as shown in FIG. 33, an insulator film 20 made of, for example, a silicon nitride film is deposited on the principal surface of the semiconductor substrate 1 by the CVD or the like so as to cover the principal surface of the semiconductor substrate 1, the side surfaces of the gate electrodes 3 and the surfaces of the cap insulator films 7. The insulator film 20 is thin enough to reflect underlying level differences.

Figure 34:
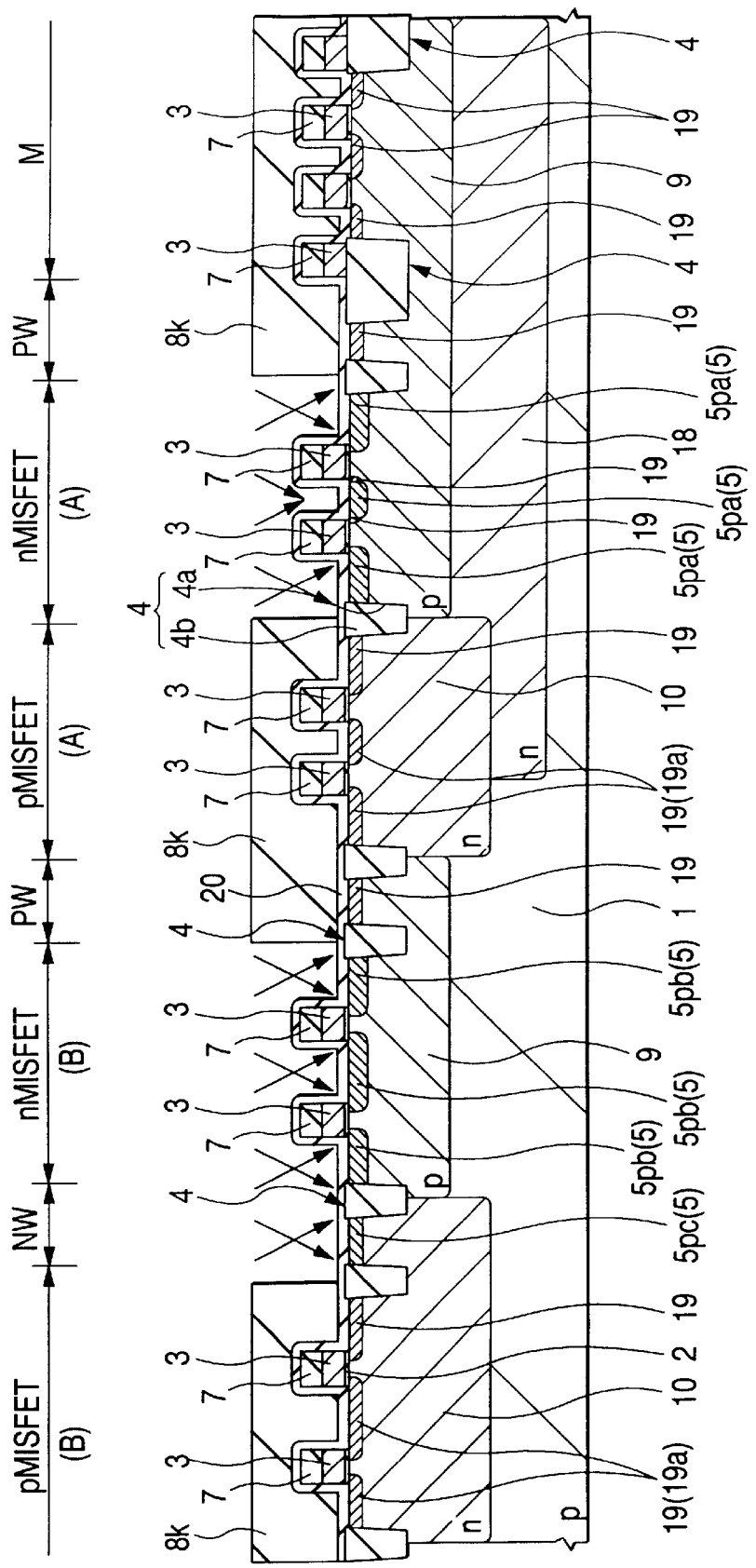
FIG. 34 is a sectional view of essential portions during the manufacturing process of the semiconductor device as succeeds to the process shown in FIG. 33.

Thereafter, as shown in FIG. 34, a photoresist film 8k which denudes the nMISFET forming regions and the n-well feeding region NW and which covers the other regions is formed on the principal surface of the semiconductor substrate 1. Using the photoresist film 8k as a mask, the ions of an impurity, for example, boron for suppressing the short channel effect of the nMISFETs are implanted in the same way as explained with reference to FIG. 9 in Embodiment 1, thereby to form pocket regions 5pa, 5pb, 5pc(5). In Embodiment 2, as in the foregoing case of Embodiment 1, the end parts of the pocket region 5pa between the gate electrodes 3A, 3A do not underlie the end parts of these gate electrodes 3A, 3A, in the area where the gate electrodes 3A, 3A adjacent to each other are arranged (alternatively, granted that the end parts of the pocket region 5pa have come under the end parts of the gate electrodes 3A, 3A, they underlie these end parts only to the extent of being cancelled by later impurity diffusion from semiconductor regions for the source and drain). Besides, the end part of the pocket region 5pa formed on the side of the drain forming region of the MISFET somewhat underlies the end part of the gate electrode 3A, even in the area where the gate electrode 3A is arranged. On the other hand, in the area where the gate electrodes 3B, 3B adjacent to each other are arranged, the end parts of the pocket regions 5pb somewhat underlie those of the gate electrodes 3B, in all of the pocket region 5pb lying between the gate electrodes 3B, 3B and the pocket regions 5pb lying on both the sides of the former pocket region 5pb with the channels intervening therebetween. Owing to this step, most of the $n^-$-type semiconductor regions 19 formed in the nMISFET forming regions and the n-well feeding region NW by the preceding step have their conductivity type cancelled, but the n-type semiconductor regions 19 between the gate electrodes 3A, 3A have their end parts left behind to some extent.

Figure 35:
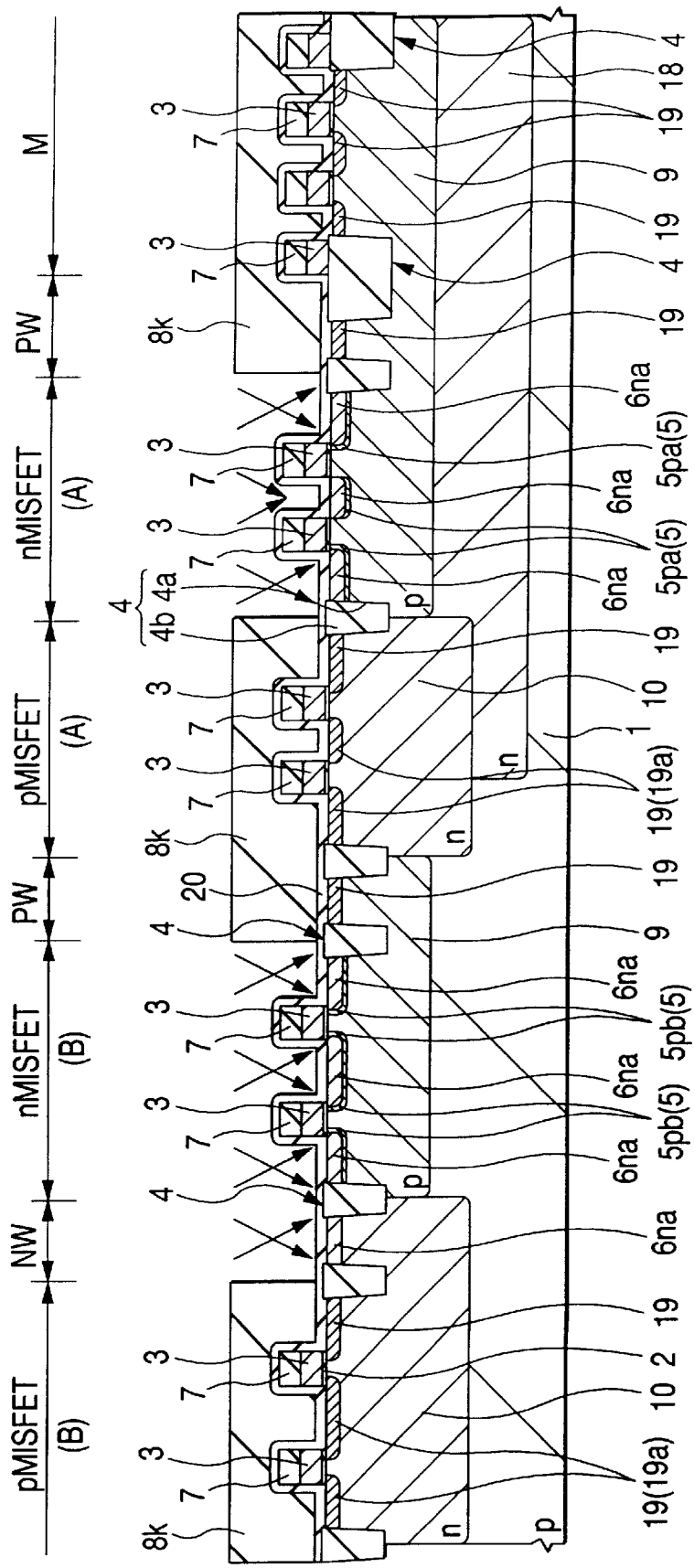
FIG. 35 is a sectional view of essential portions during the manufacturing process of the semiconductor device as succeeds to the process shown in FIG. 34.

Next, as shown in FIG. 35, the ions of, for example, phosphorus or arsenic are implanted into the semiconductor substrate 1 by employing as a mask the photoresist film 8k used at the preceding step. Thus, semiconductor regions 6na, 6na1 of n⁻-type are formed in the semiconductor substrate 1. Here, unlike the ion implantation in Embodiment 1, the ions of the impurity are implanted, for example, in four directions as viewed in plan and obliquely to the principal surface of the semiconductor substrate 1 as viewed in section. The reason for the oblique implantation of the impurity here, is as stated below. In Embodiment 2, the insulator film 20 has been formed on the side surfaces of the gate electrodes 3 at this stage. Therefore, if the impurity is implanted perpendicularly to the semiconductor substrate 1, the profile of the impurity within the semiconductor substrate 1 might fail to reach the positions under the end parts of the gate electrodes 3 and might produce defective elements. This drawback is prevented by the oblique impurity implantation. When such a step is carried out, the pocket regions 5 (refer to FIG. 34) formed between the gate electrodes 3A, 3A and in the n-well feeding region NW have their conductivity type cancelled by the n⁻-type semiconductor regions 6na1, 6na, but the other pocket regions 5pa, 5pb are left behind at the end parts of the n⁻-type semiconductor regions 6na near to the channels and at the lower parts of the n⁻-type semiconductor regions 6na. Incidentally, the impurity concentration of the n⁻-type semiconductor regions 6na is higher than that of the pocket regions 5 and is lower than that of semiconductor regions of n⁺-type to be explained below.

Figure 36:
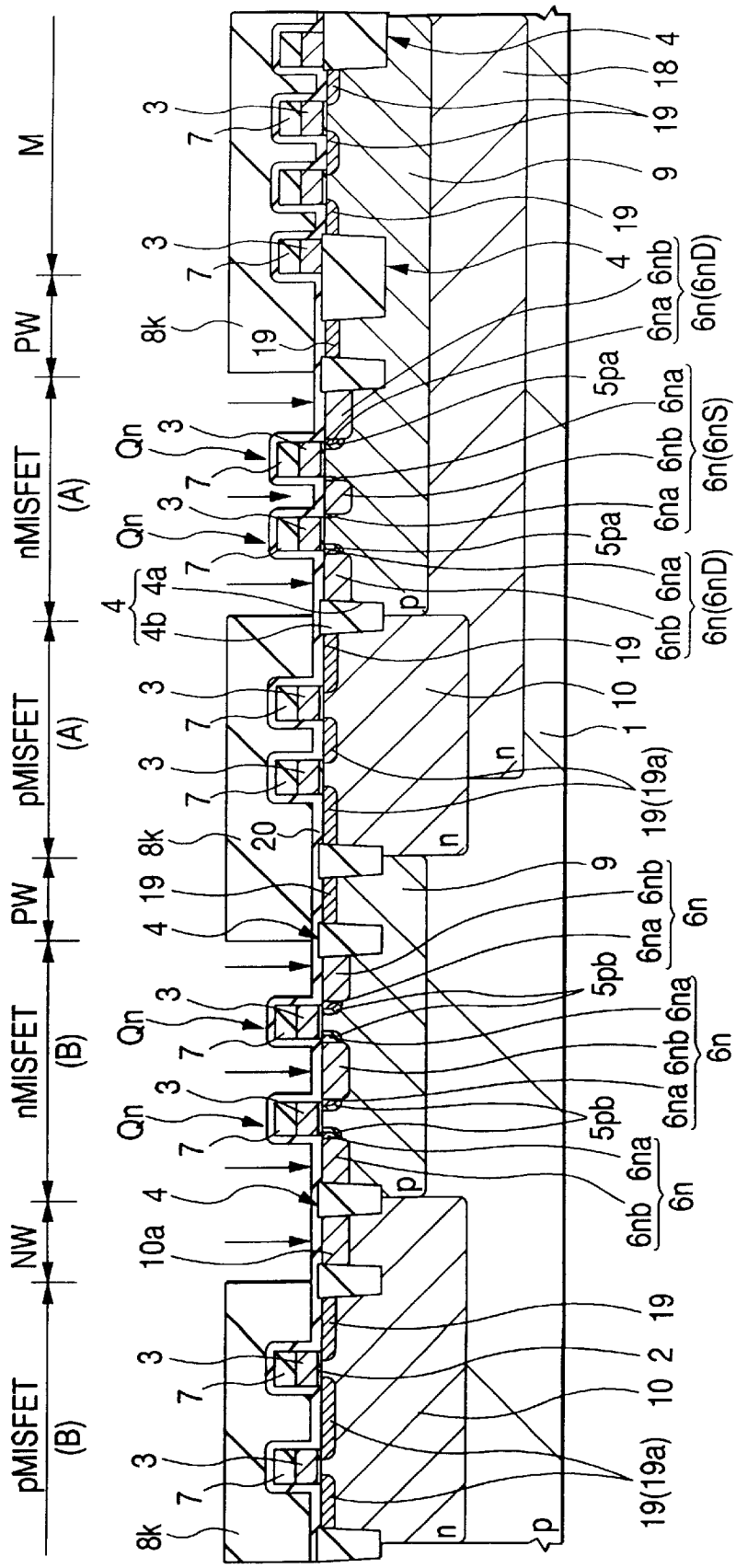
FIG. 36 is a sectional view of essential portions during the manufacturing process of the semiconductor device as succeeds to the process shown in FIG. 35.

Subsequently, as shown in FIG. 36, the ions of, for example, phosphorus or arsenic for forming the sources and drains of the nMISFETs are implanted by employing as a mask the photoresist film 8k used at the preceding step, likewise to the ion implantation in Embodiment 1. Thus, the n⁺-type semiconductor regions 6nb of the nMISFETs Qn and the n⁺-type semiconductor region 10a for n-well feeding are formed in the semiconductor substrate 1. The nMISFETs Qn are formed via such a step. By the way, the structure of the nMISFETs Qn in Embodiment 2 is the same as in Embodiment 1 and shall be omitted from description.

Figure 37:
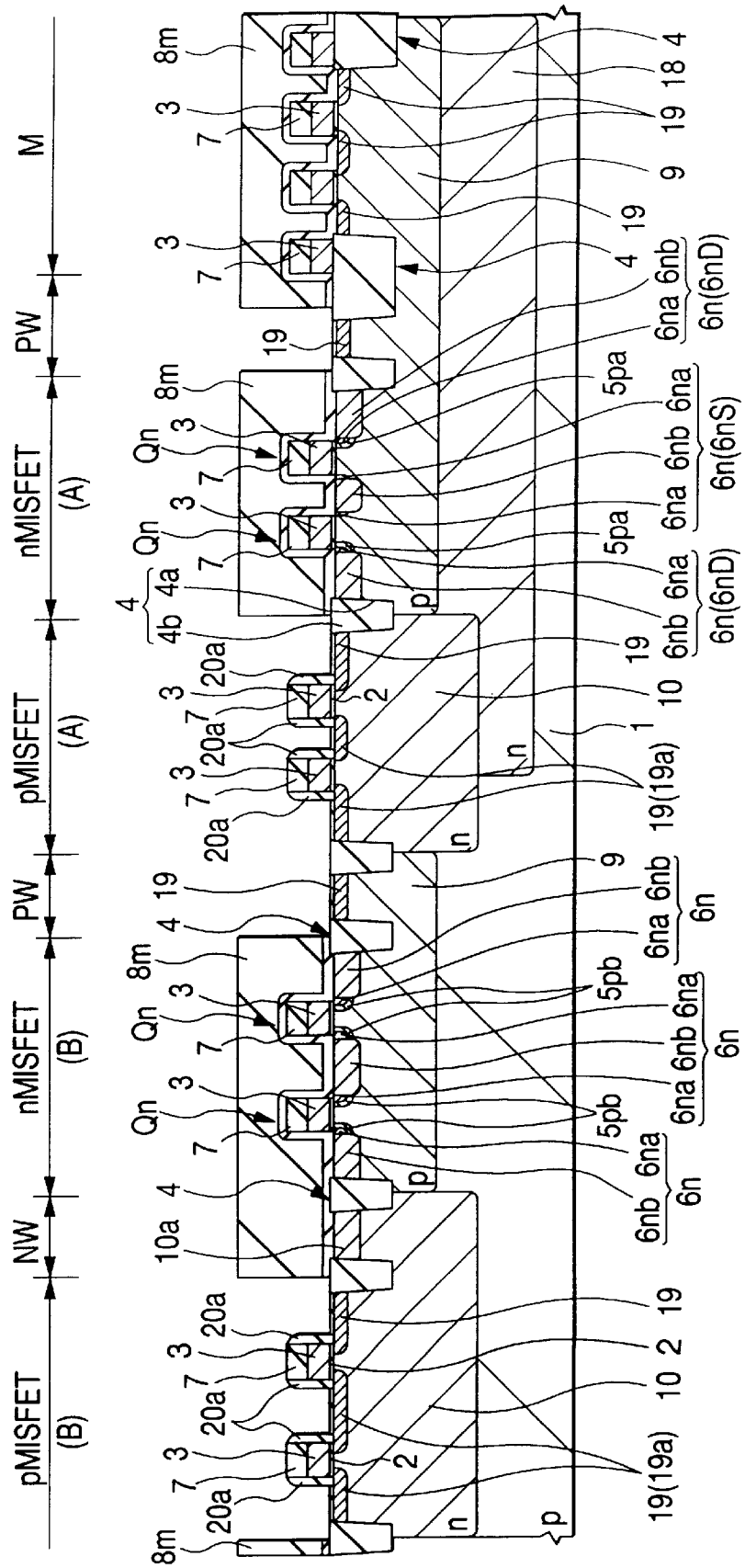
FIG. 37 is a sectional view of essential portions during the manufacturing process of the semiconductor device as succeeds to the process shown in FIG. 36.

Next, as shown in FIG. 37, a photoresist film 8m which denudes the pMISFET forming regions and the p-well feeding regions PW and which covers the other regions is formed on the principal surface of the semiconductor substrate 1. Further, the semiconductor substrate 1 is subjected to an anisotropic etching process so as to etch back those parts of the insulator film 20 which are not covered with the photoresist film 8m. Thus, side walls 20a are formed on the side surfaces of the gate electrodes 3 included in the pMISFET forming regions. This step is carried out for the reason that, if an impurity is introduced into the semiconductor substrate 1 through the insulator film 20 at the subsequent step of introducing the impurity, the impurity concentration of semiconductor regions to be formed in the semiconductor substrate 1 might become insufficient, to degrade the driving capability and reliability of each MISFET. This drawback is prevented by the anisotropic etching step.

Figure 38:
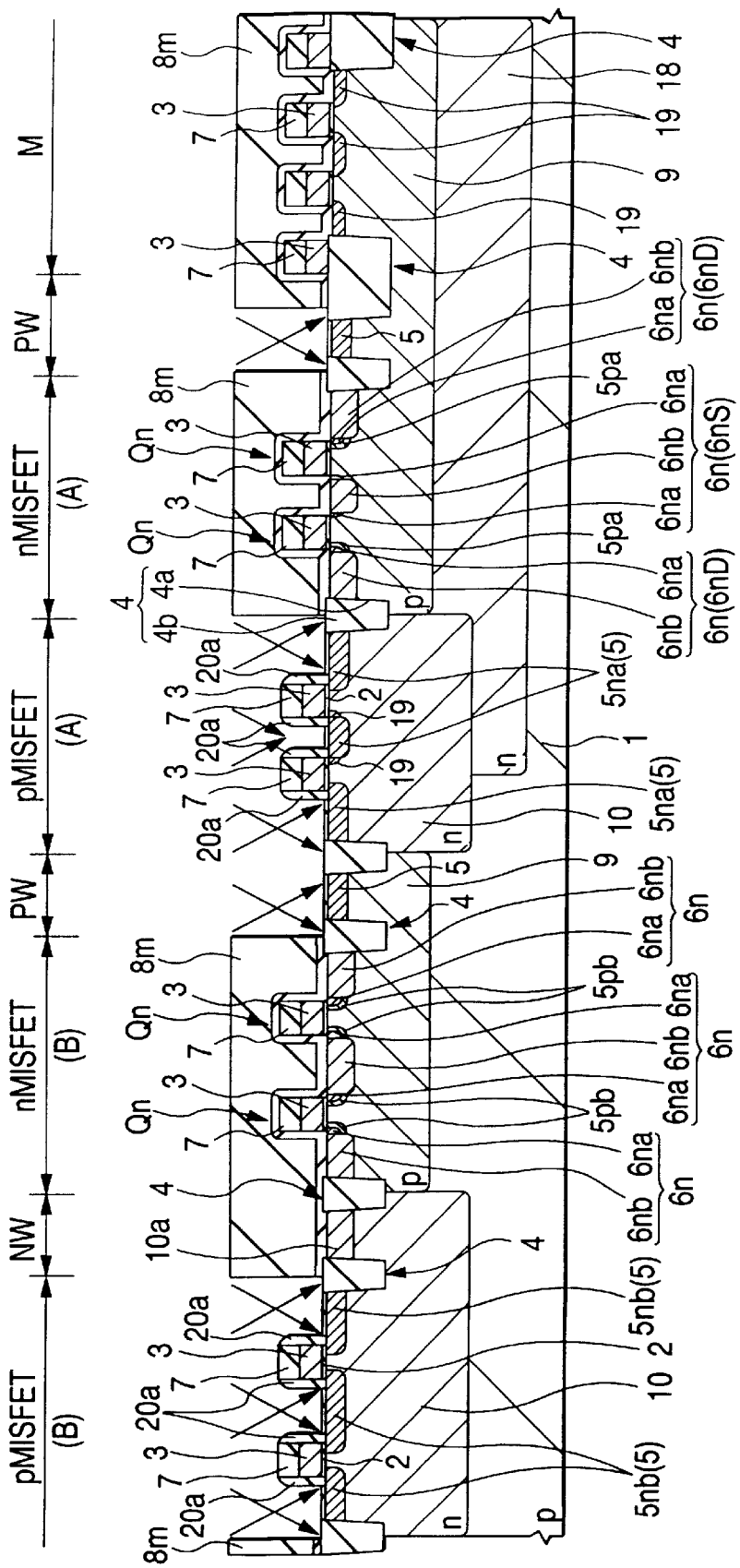
FIG. 38 is a sectional view of essential portions during the manufacturing process of the semiconductor device as succeeds to the process shown in FIG. 37.

Subsequently, as shown in FIG. 38, the ions of an impurity, for example, phosphorus for suppressing the short channel effect of the pMISFETs are implanted in the same way as in Embodiment 1, by employing the photoresist film 8m as a mask. Thus, pocket regions 5na, 5nb (5) are formed. The formed state of each of the pocket regions 5na, 5nb (5) based on this step is the same as explained concerning the introduction of the impurity for suppressing the short channel effect of the pMISFETs in Embodiment 1, and shall be omitted from description. Besides, the conductivity type of the n—type semiconductor regions 19 is cancelled by this step except at the end parts of the n⁻-type semiconductor region 19 between the gate electrodes 3A, 3A.

Figure 39:
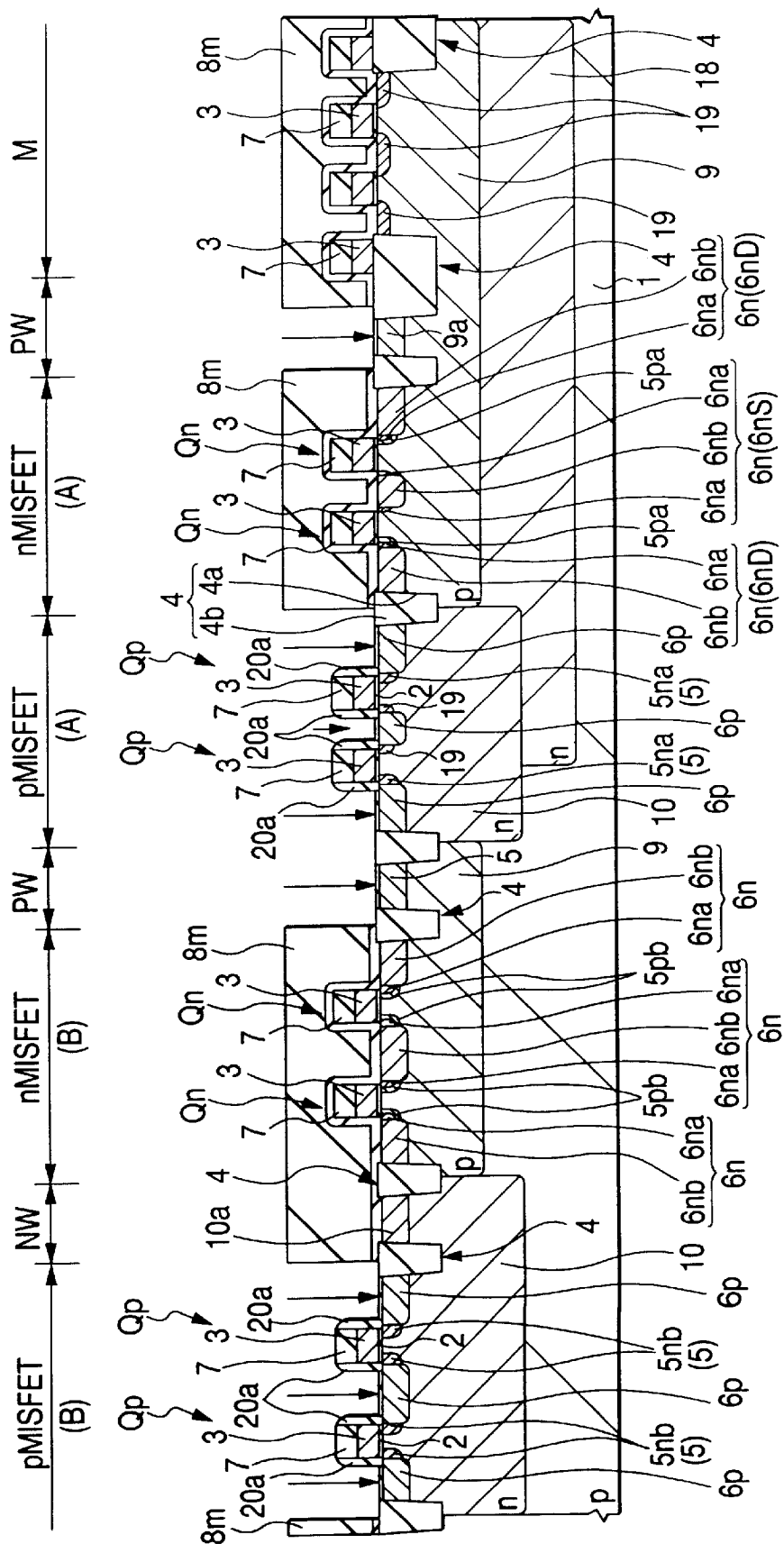
FIG. 39 is a sectional view of essential portions during the manufacturing process of the semiconductor device as succeeds to the process shown in FIG. 38.

Next, as shown in FIG. 39, the ions of, for example, boron for forming the sources and drains of the pMISFETs are implanted into the semiconductor substrate 1 by employing as a mask the photoresist film 8m used at the preceding step, likewise to the ion implantation in Embodiment 1. Thus, the p⁺-type semiconductor regions 6p of the pMISFETs Qp and the p⁺-type semiconductor regions 9a for p-well feeding are formed in the semiconductor substrate 1. In Embodiment 2, the n⁻-type semiconductor regions 19 are left behind at both the end parts (lying in contact with the channel) of the p⁺-type semiconductor region 6p between the gate electrodes 3A, 3A, and they fulfill the same function as that of the pocket regions. The pMISFETs Qp are formed via such a step. By the way, the structure of the pMISFETs Qp in Embodiment 2 is the same as in Embodiment 1 except the formation of the n⁻-type semiconductor regions 19, and it shall therefore be omitted from description.

Figure 40:
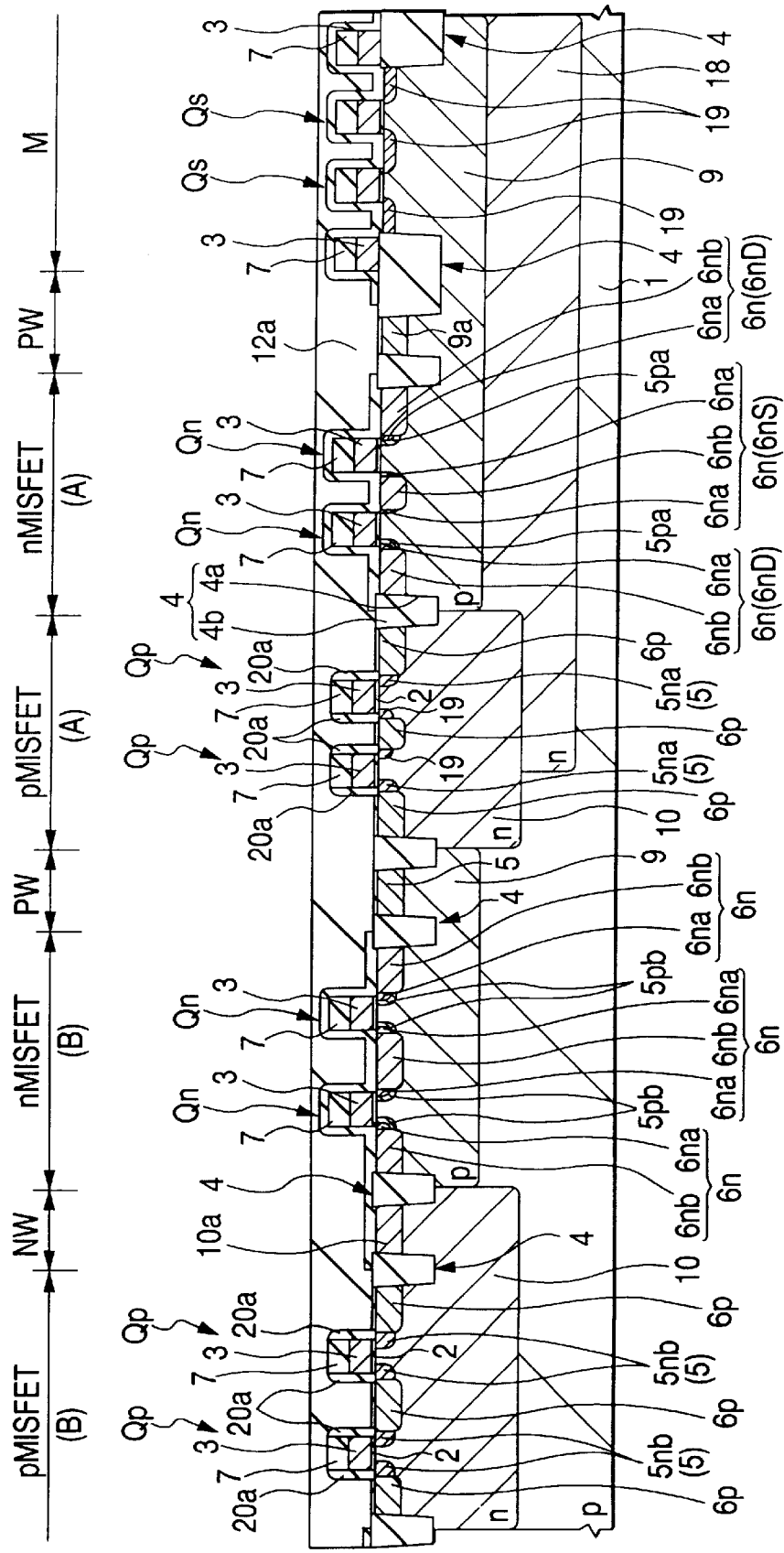
FIG. 40 is a sectional view of essential portions during the manufacturing process of the semiconductor device as succeeds to the process shown in FIG. 39.
Figure 41:
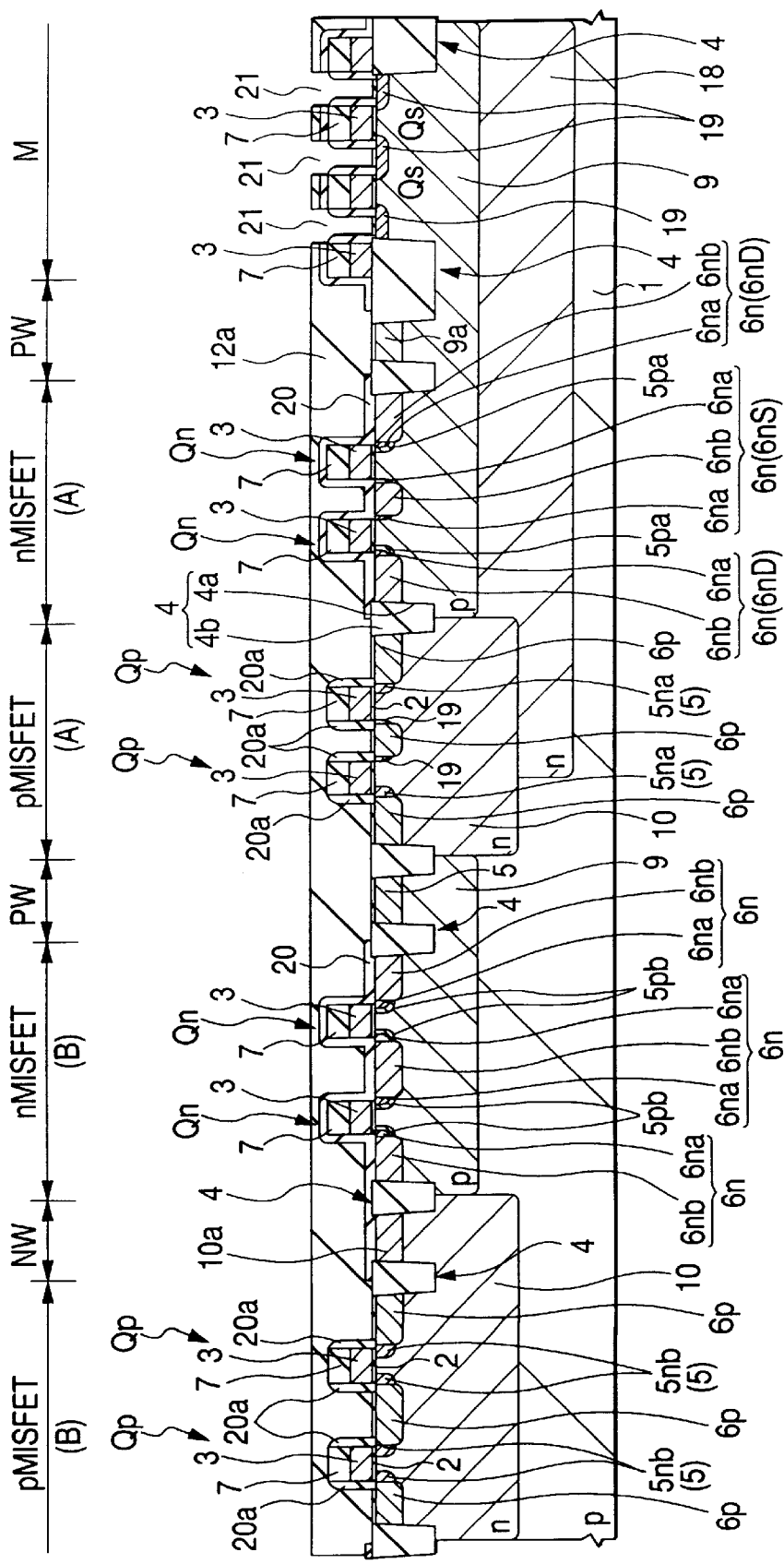
FIG. 41 is a sectional view of essential portions during the manufacturing process of the semiconductor device as succeeds to the process shown in FIG. 40.

Subsequently, the photoresist film 8m is removed, and the nMISFETs Qn, pMISFETs Qp and memory-cell selecting MISFETs Qs are formed on the semiconductor substrate 1 as shown in FIG. 40. Thereafter, an insulator film 12a made of, for example, a silicon oxide film is deposited on the principal surface of the semiconductor substrate 1 by CVD, and the upper surface thereof is polished and flattened by CMP or the like. Besides, a photoresist film for forming contact holes through which the n⁻-type semiconductor regions 19 in the memory area M are exposed, is formed on the insulator film 12a, and an etching process is carried out using the photoresist film as a mask. Thus, the contact holes 21 through which the principal surface of the semiconductor substrate 1 is exposed are formed in the insulator film 12a as shown in FIG. 41. On this occasion, the etching selection ratio between the silicon oxide film 12a and the silicon nitride film 20 is set large so as to perform the etching process under the condition that the silicon oxide film 12a is easier of etching removal. Thus, the contact holes 21 are formed in self-alignment with the gate electrodes 3 of the memory-cell selecting MISFETs Qs.

Figure 42:
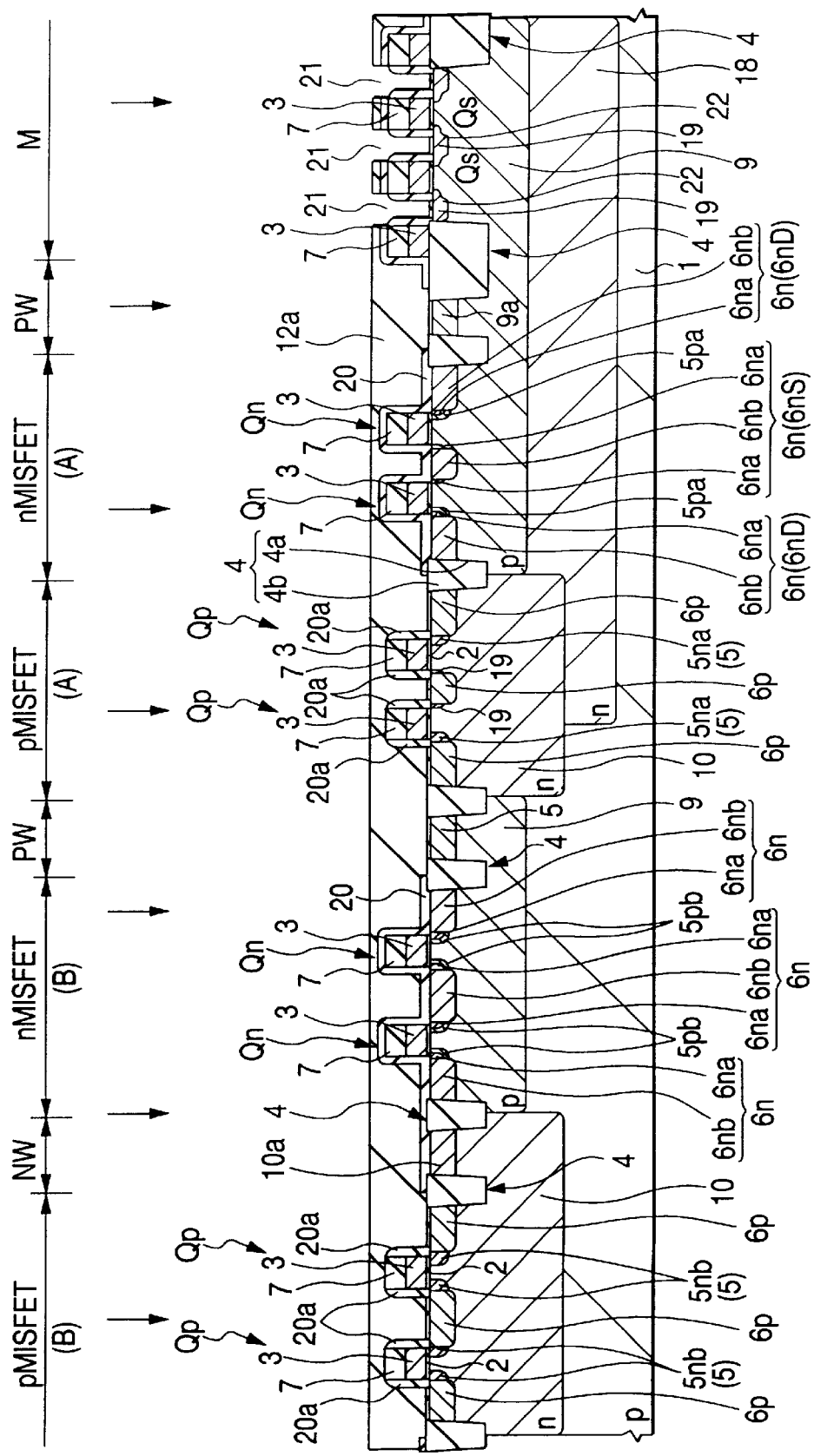
FIG. 42 is a sectional view of essential portions during the manufacturing process of the semiconductor device as succeeds to the process shown in FIG. 41.
Figure 43:
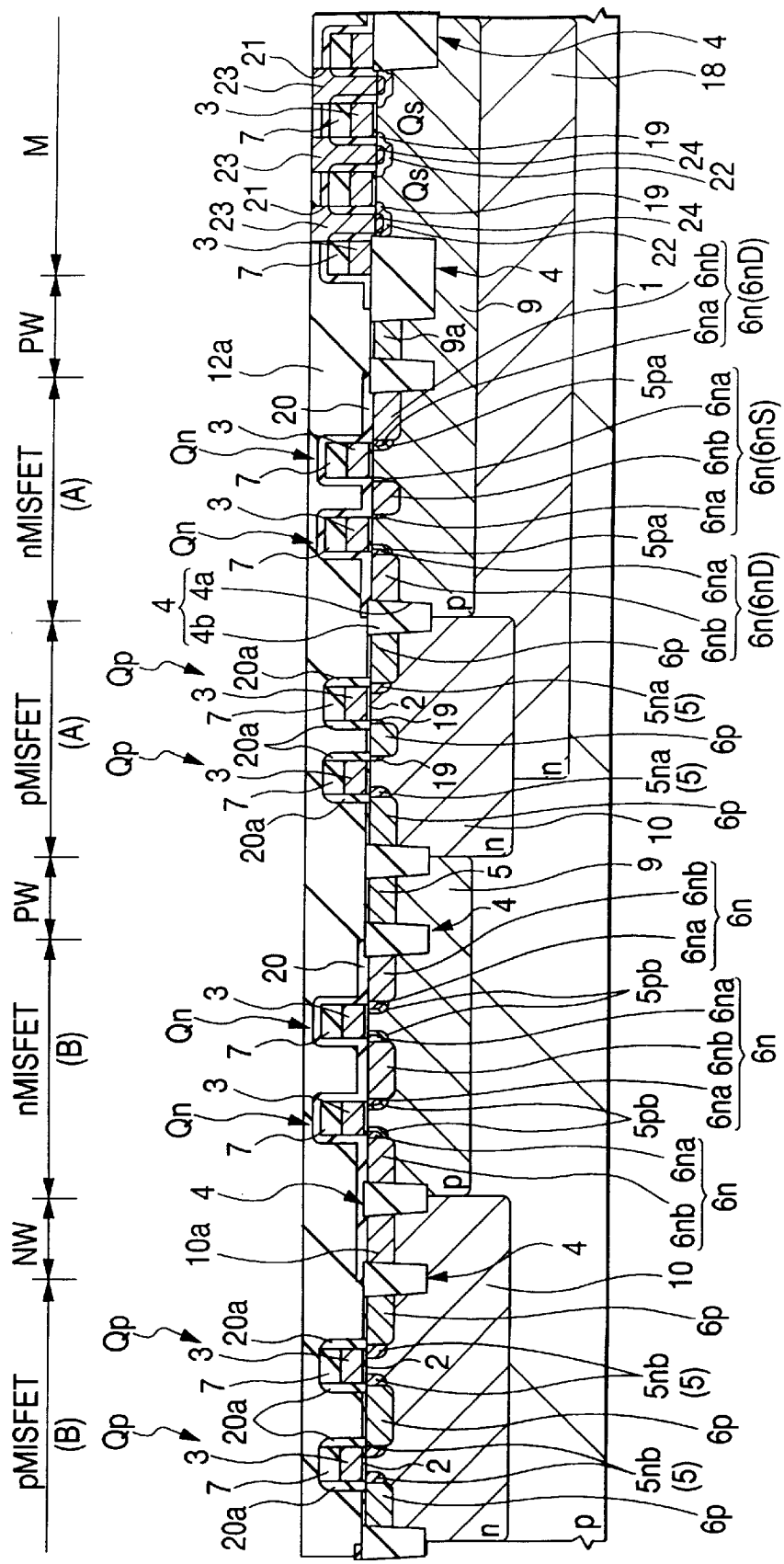
FIG. 43 is a sectional view of essential portions during the manufacturing process of the semiconductor device as succeeds to the process shown in FIG. 42.

At the next step, as shown in FIG. 42, the ions of an impurity, for example, phosphorus are implanted into the semiconductor substrate 1 through the contact holes 21. Thus, semiconductor regions 22 of n⁻-type are formed under the n⁻-type semiconductor regions 19. The n⁻-type semiconductor regions 22 are formed for a purpose stated below. Semiconductor regions of n⁺-type to be explained later are formed in those parts of the semiconductor substrate 1 which are exposed through the contact holes 21. When the n⁺-type semiconductor regions come into direct touch with the p-well 9, high electric fields are applied to cause defective elements. Such electric fields are relaxed by the n-type semiconductor regions 22. Subsequently, low-resistance polycrystal silicon, for example, is deposited on the insulator film 12a by CVD so as to be buried in the contact holes 21, and it is shaved by CMP or the like so as to be left behind in the contact holes 21 only. Thus, plugs 23 are formed as shown in FIG. 43. Thereafter, the n⁺-type semiconductor regions 24 are formed in the semiconductor substrate 1 by impurity diffusion from the plugs 23.

Figure 44:
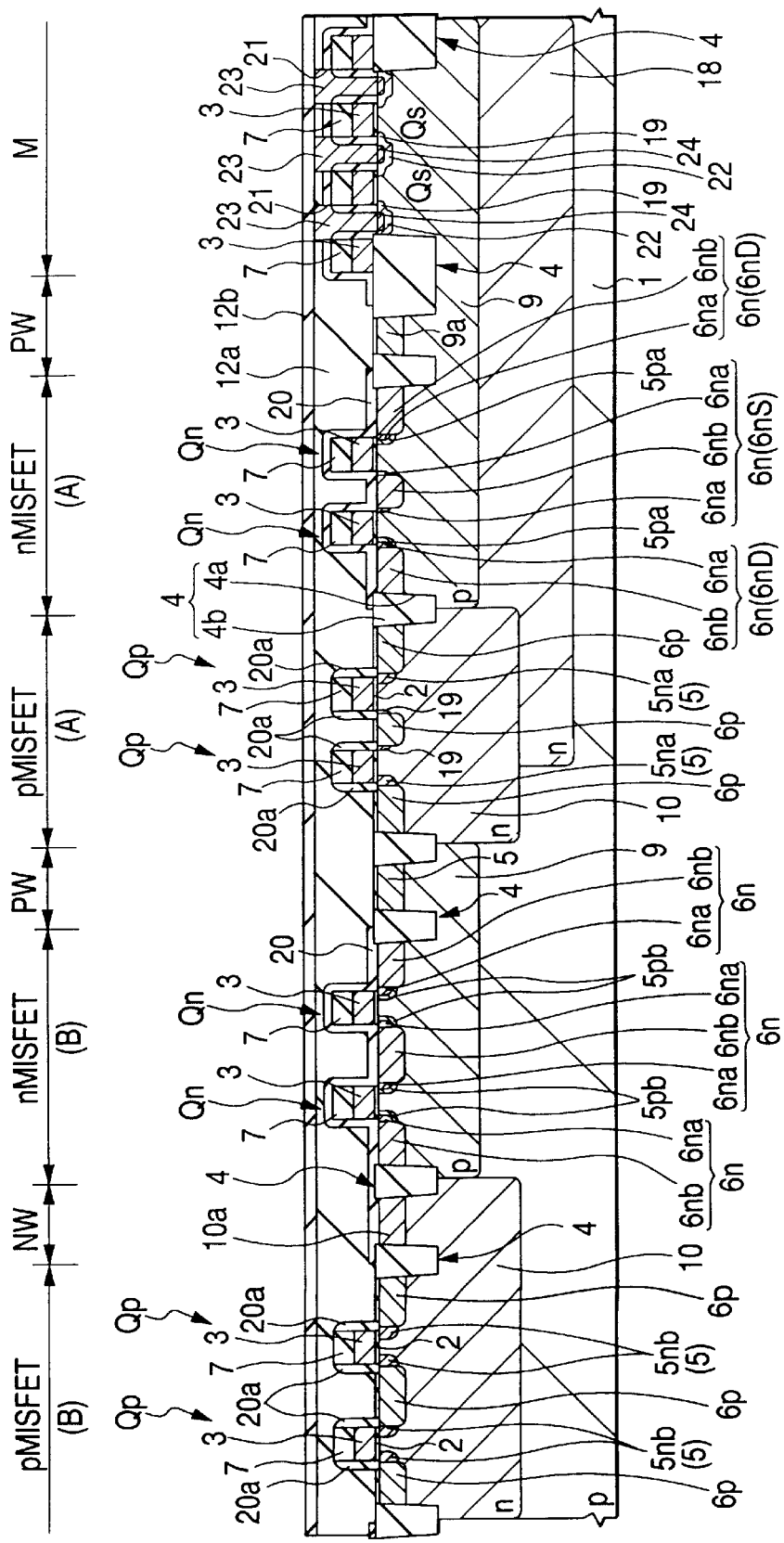
FIG. 44 is a sectional view of essential portions during the manufacturing process of the semiconductor device as succeeds to the process shown in FIG. 43.
Figure 45:
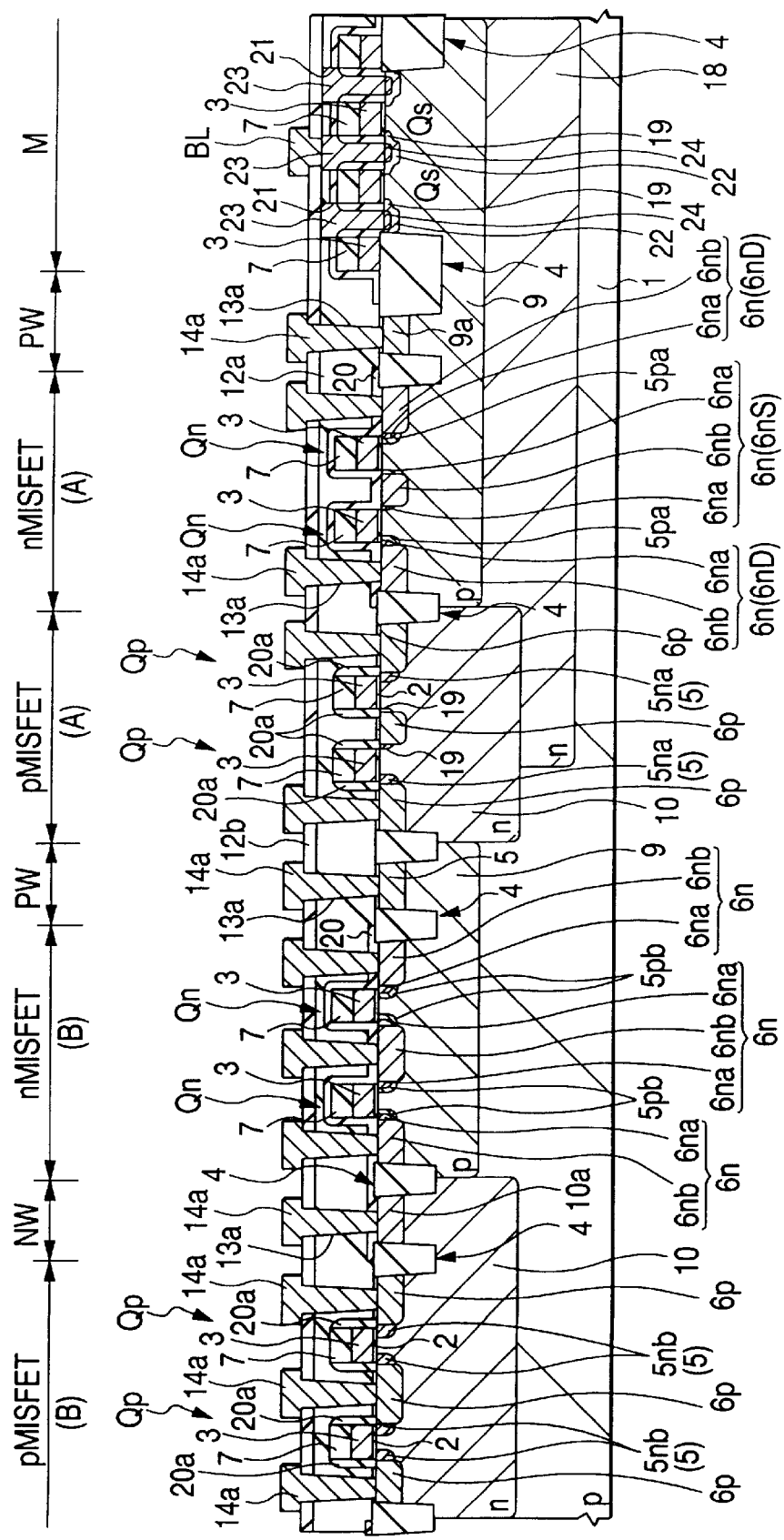
FIG. 45 is a sectional view of essential portions during the manufacturing process of the semiconductor device as succeeds to the process shown in FIG. 44.

Next, as shown in FIG. 44, an insulator film 12b made of, for example, a silicon nitride film is deposited on the insulator film 12a and the plugs 23 by CVD or the like. Besides, as shown in FIG. 45, the insulator films 12a, 12b are formed with contact holes 13a through which the upper surfaces of the semiconductor substrate 1 and plugs 23 are exposed. Further, first-layer wiring lines 14a and bit lines BL are formed by a photolithographic technique and a dry etching technique. The first-layer wiring lines 14a and bit lines BL in this case are made of, tungsten or a tungsten alloy.

Figure 46:
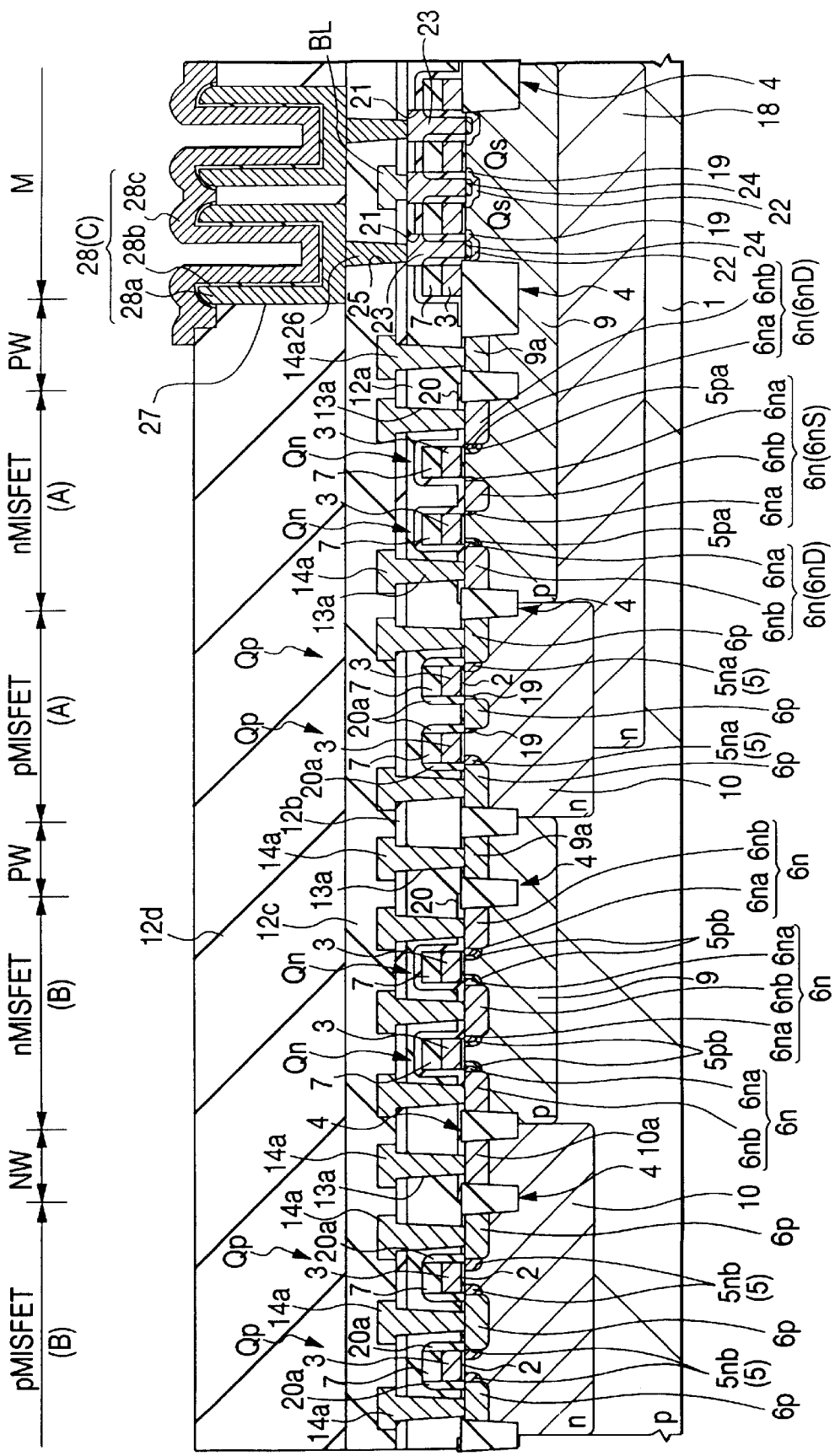
FIG. 46 is a sectional view of essential portions during the manufacturing process of the semiconductor device as succeeds to the process shown in FIG. 45.

Next, as shown in FIG. 46, an insulator film 12c made of, for example, a silicon oxide film is deposited on the insulator film 12b by CVD or the like so as to cover the first-layer wiring lines 14a and bit lines BL, and the upper surface thereof is flattened. Contact holes 25 through which the upper surfaces of the plugs 23 for capacitors are exposed, are provided in the insulator films 12b, 12c by a photolithographic technique and a dry etching technique. Subsequently, a conductor film is deposited on the insulator film 12c by CVD, sputtering or the like so as to fill up the contact holes 25, and it is shaved by CMP or the like so as to be left behind in the contact holes 25 only. Thus, plugs 26 are formed in the contact holes 25. Thereafter, an insulator film 12d is deposited on the insulator film 12c by CVD or the like so as to conceal the upper surfaces of the plugs 26. Capacitor holes 27 through which the upper surfaces of the underlying plugs 26 are exposed, are formed in the insulator film 12d by a photolithographic technique and a dry etching technique or the like. Thereafter, a capacitor 28(C) in the shape of, for example, a crown (cylinders) is formed in the capacitor holes 27. The capacitor 28 is the capacitance element of the DRAM for storing information, and it includes a lower electrode 28a, a capacitance insulator film 28b and an upper electrode 28c. The lower electrode 28a is made of, for example, a low-resistance polycrystal silicon film, and it is electrically connected with one semiconductor region 24 of the memory-cell selecting MISFET Qs through the plugs 26, 23. The capacitance insulator film 28b is constructed of, for example, a stacked film which consists of a tantalum pentoxide ($Ta_2O_5$) or silicon oxide film and a silicon nitride film, and which is formed so as to be held between the lower electrode 28a and the upper electrode 28b. By the way, in the case of an FRAM (Ferroelectric RAM) structure, the material of the capacitance insulator film 28b to be employed is, for example, a ferroelectric substance of lead-based oxide represented by Pb(Zr, Ti) or the like, or a ferroelectric substance of laminated bismuth structure represented by $Bi_2SrTa_2O$, or the like. In that case, a metal material such as Pt, Ru, $RuO_x$, Ir or $IrO_x$ is employed for the lower electrode 28a. Thenceforth, conventional processes for manufacturing a semiconductor device are performed to produce the DRAM or the FRAM.

As thus far described, in Embodiment 2, the intervals of the elements adjoining each other can be reduced without spoiling the operating reliability of the pMISFETs, in the same manner as in the foregoing embodiment 1. In particular, Embodiment 2 is effective for, for example, a circuit area in which an arrangement interval is determined by the interval of the elements in the memory area M, such as the area of direct peripheral circuits represented by the sense amplifier circuits SA. In other words, according to Embodiment 2, the circuit layout of peripheral circuits conforming to the adjacent element interval of the memory area M, the size of which is being rapidly made smaller and smaller, is realized without spoiling the operating reliability of the peripheral circuits in the DRAM or the FRAM. It is therefore possible to promote the microfabrication of the DRAM of high reliability.

(Embodiment 3)

Embodiment 3 is substantially the same as the foregoing embodiment 2, but the former differs from the latter in that the sources and drains of pMISFETs are especially formed with lightly-doped semiconductor regions.

Figure 47:
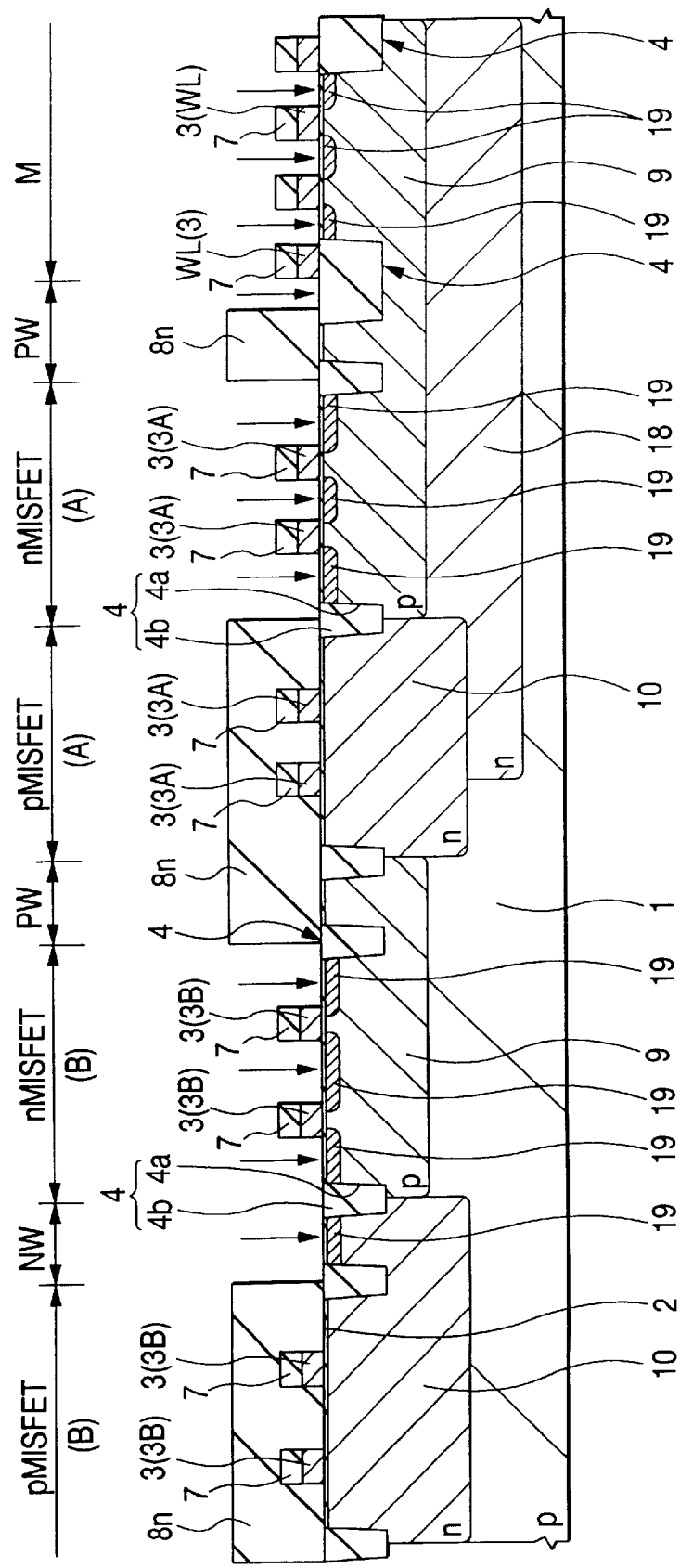
FIG. 47 is a sectional view of essential portions during the manufacturing process of a semiconductor device in another embodiment of the present invention.

First, the same steps as explained with reference to FIG. 26–FIG. 31 in Embodiment 2 are carried out. Thereafter, as shown in FIG. 47, a photoresist film 8n which denudes the nMISFET forming regions, n-well feeding region NW and memory area M and which covers the other regions is formed on the semiconductor substrate 1. Subsequently, using the photoresist film 8n as a mask, the ions of, for example, phosphorus are implanted into the semiconductor substrate 1 perpendicularly or substantially perpendicularly to the principal surface of this substrate 1. This step corresponds to the step performed in Embodiment 2 in order to form the $n^-$-type semiconductor regions 19 for the sources and drains of the memory-cell selecting MISFETs included in the memory area M. In the foregoing embodiment 2, the impurity is ion-implanted into the entire surface of the semiconductor substrate 1, whereas in this embodiment 3, the impurity is not introduced into the pMISFET forming regions and the p-well feeding regions PW. This serves to suppress the discrepancy of the threshold voltages of the pMISFETs. Moreover, the states of feeding in the p-well feeding regions PW are bettered by forming no $n^-$-type semiconductor regions 19 in these p-well feeding regions PW.

Figure 48:
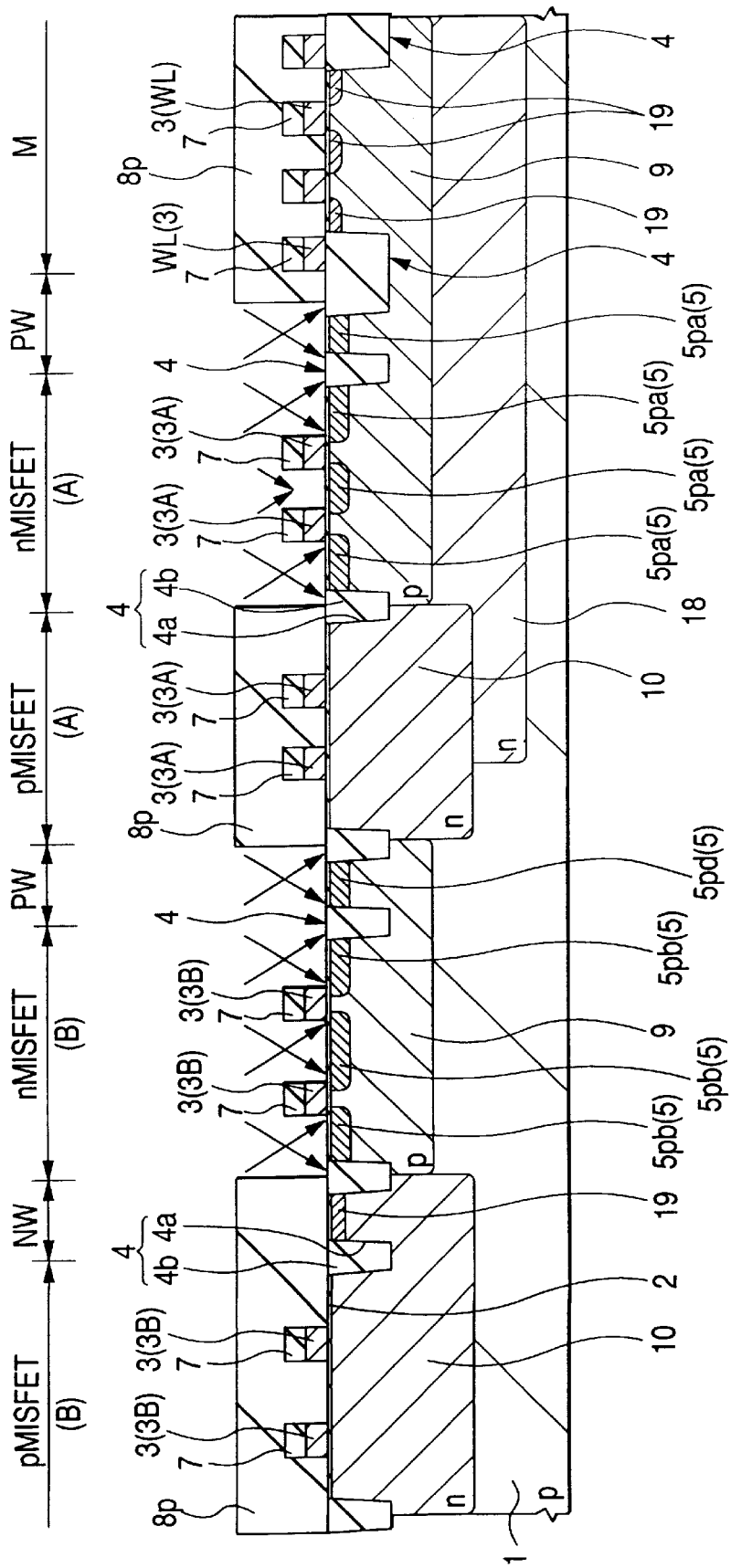
FIG. 48 is a sectional view of essential portions during the manufacturing process of the 'semiconductor device as succeeds to the process shown in FIG. 47.

Next, the photoresist film 8n is removed. As shown in FIG. 48, a photoresist film 8p which denudes the nMISFET forming regions and the p-well feeding regions PW and which covers the other regions is formed on the principal surface of the semiconductor substrate 1. Using the photoresist film 8p as a mask, the ions of an impurity, for example, boron for suppressing the short channel effect of the nMISFETs are implanted in the same way as in Embodiment 1 or 2, thereby to form pocket regions 5pa, 5pb, 5pd(5). The formed states of the pocket regions 5pa, 5pb(5) are the same as in Embodiments 1 and 2, and shall be omitted from description. Here, Embodiment 3 differs from Embodiment 2 as stated below. In the first place, at this stage, the pocket regions 5pd of p-type are formed also in the p-well feeding regions PW. secondly, in Embodiment 2, the semiconductor regions 19 of ne-type are formed in the vicinities of both the ends of the pocket region 5pa between the gate electrodes 3A, 3A, whereas in Embodiment 3, they are not formed.

Figure 49:
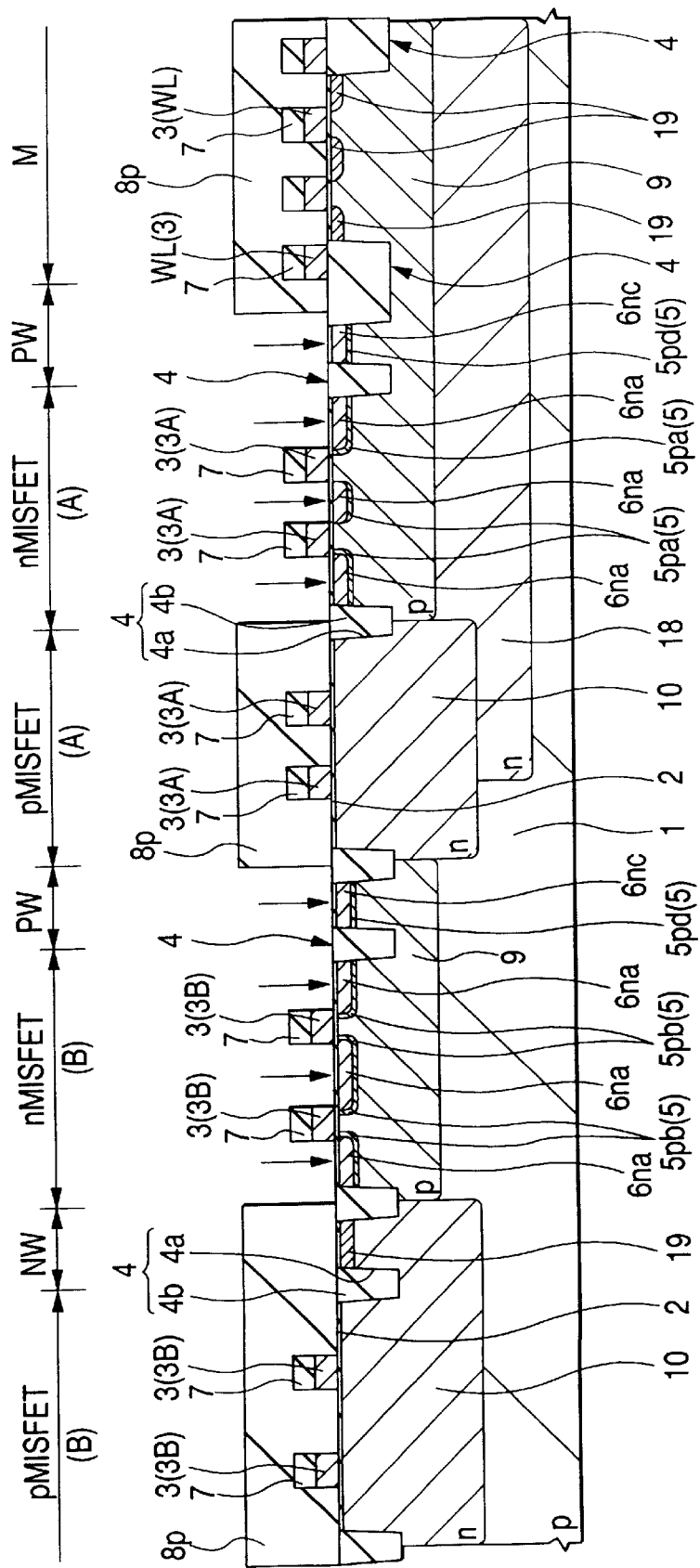
FIG. 49 is a sectional view of essential portions during the manufacturing process of the semiconductor device as succeeds to the process shown in FIG. 48.

Subsequently, as shown in FIG. 49, the ions of, for example, phosphorus or arsenic are implanted into the semiconductor substrate 1 by employing as a mask the photoresist film 8p used at the preceding step, likewise to the ion implantation in Embodiment 1. Thus, semiconductor regions 6na, 6na1, 6nc of $n^-$-type are formed in the semiconductor substrate 1. In Embodiment 2, the impurity is introduced obliquely to the principal surface of the semiconductor substrate 1, whereas in Embodiment 3, the impurity is introduced perpendicularly to the principal surface of the semiconductor substrate 1. The reason therefor is that, in Embodiment 3, side walls are not formed on the side surfaces of the gate electrodes 3 yet at this 3h[] stage.

Thus, the impurity concentration of the $n^-$-type semiconductor regions 6na, 6na1 can be made higher than in the case of Embodiment 2, so that the driving capability of each nMISFET can be enhanced. Unlike in Embodiment 2, the $n^-$-type semiconductor regions 6nc are formed also in the p-well feeding regions PW. The formed states of the $n^-$-type semiconductor regions 6na are the same as in Embodiments 1 and 2, and shall be omitted from description.

Figure 50:
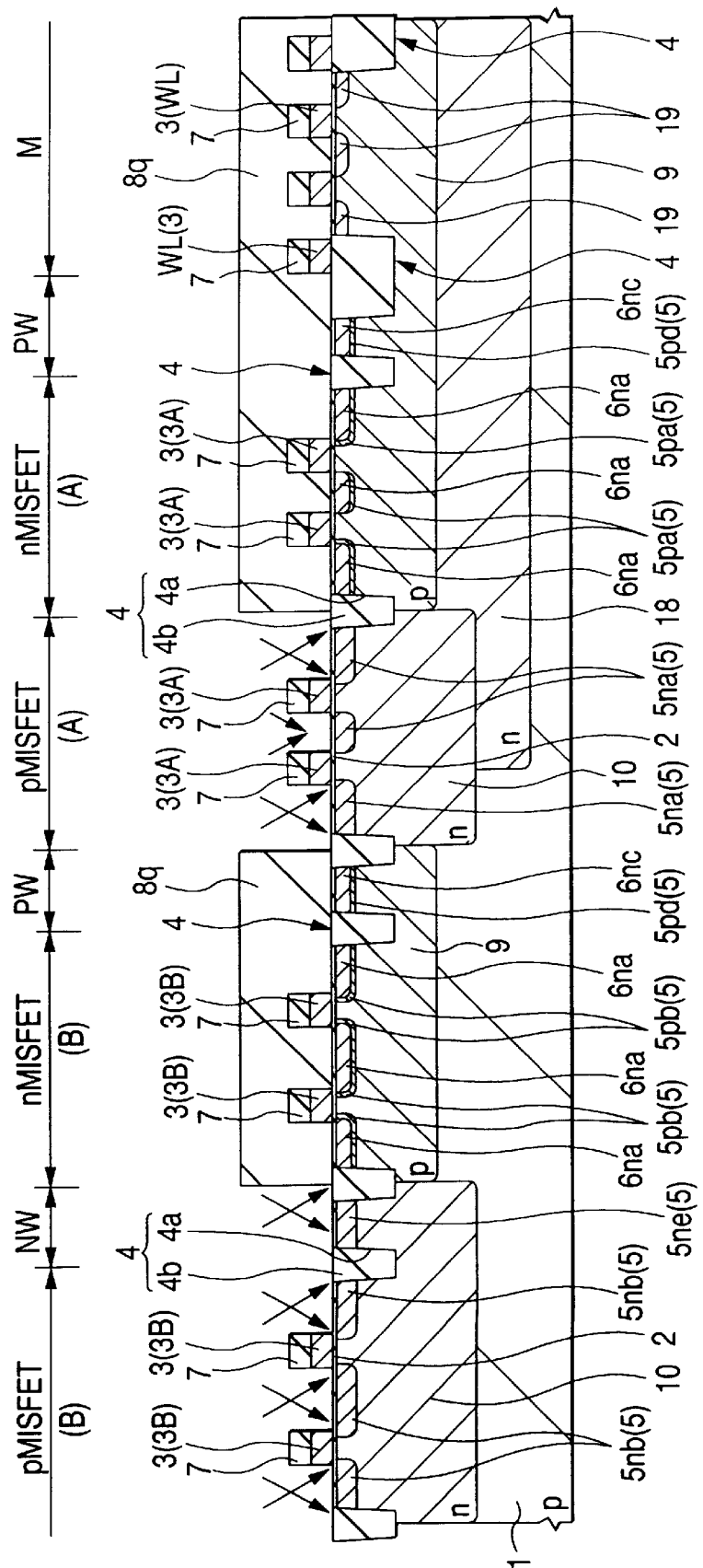
FIG. 50 is a sectional view of essential portions during the manufacturing process of the semiconductor device as succeeds to the process shown in FIG. 49.

Thereafter, the photoresist film 8p is removed. As shown in FIG. 50, a photoresist film 8q which denudes the pMISFET forming regions and the n-well feeding region NW and which covers the other regions is formed on the semiconductor substrate 1. Subsequently, using the photoresist film 8q as a mask, the ions of an impurity, for example, phosphorus for suppressing the short channel effect of the pMISFETs are implanted in the same way as in Embodiment 1 or 2, thereby to form pocket regions 5na, 5nb, 5ne (5). The formed states of the pocket regions 5na, 5nb (5) based on this step are the same as explained concerning the introduction of the impurity for the suppression of the short channel effect of the pMISFETs in Embodiments 1 and 2, and they shall therefore be omitted from description. Here, Embodiment 3 differs from Embodiment 2 in that the pocket region 5ne of n-type is formed in the n-well feeding region NW, but that it is not formed in either of the p-well feeding regions PW.

Figure 51:
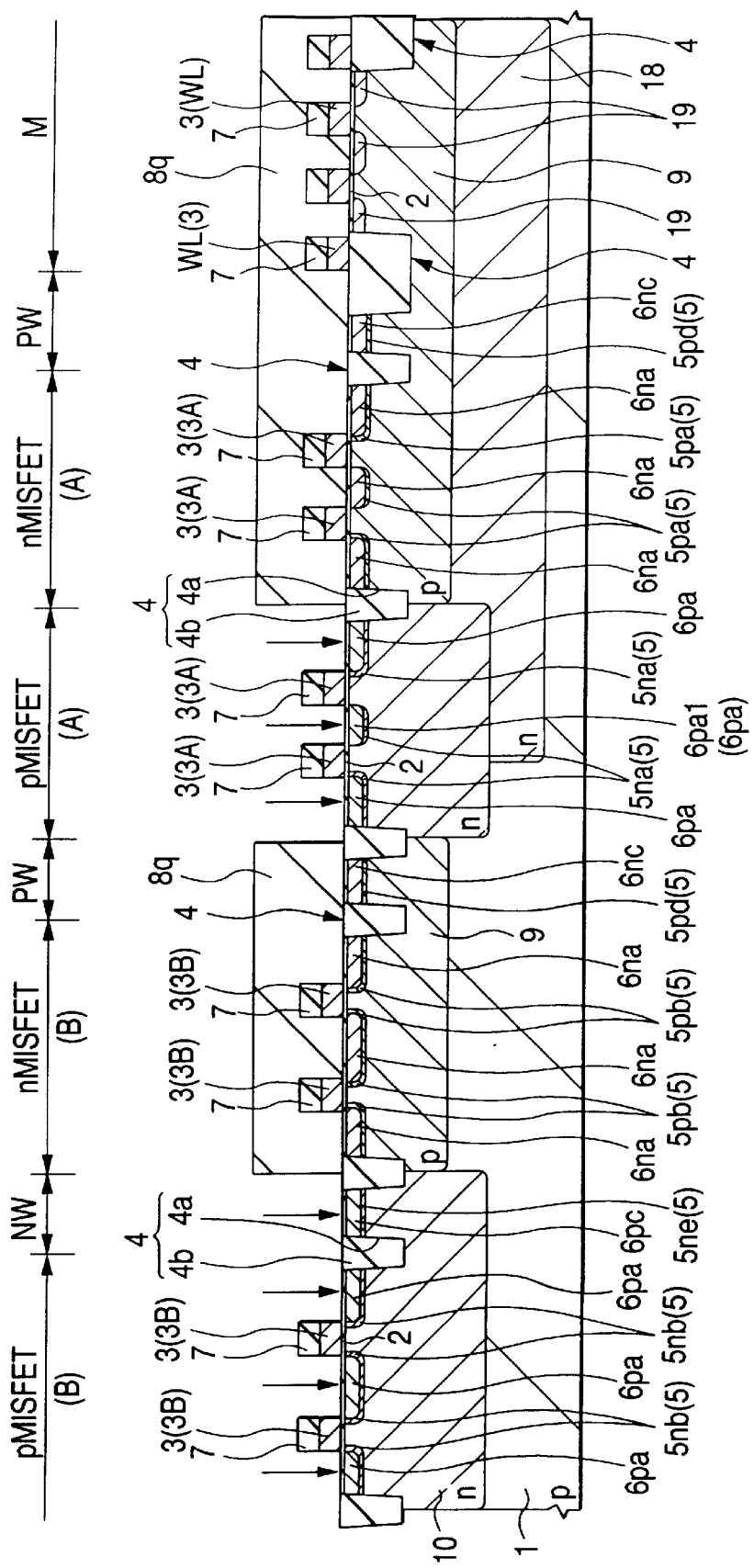
FIG. 51 is a sectional view of essential portions during the manufacturing process of the semiconductor device as succeeds to the process shown in FIG. 50.

Next, as shown in FIG. 51, the ions of, for example, boron difluoride are implanted perpendicularly to the principal surface of the semiconductor substrate 1 by employing as a mask the photoresist film 8q used at the preceding step. Thus, semiconductor regions 6pa, 6pa1, 6pc of p$^-$-type are formed in the semiconductor substrate 1. This step of introducing the impurity is not carried out in Embodiment 2. Owing to this step, the stability of the threshold voltage of each pMISFET can be enhanced. Besides, since the impurity ions are introduced perpendicularly to the principal surface of the semiconductor substrate 1, the impurity concentration of the p$^-$-type semiconductor regions 6pa, 6pa1 can be heightened, and the driving capability of each pMISFET can be enhanced.

At this step, the p$^-$-type semiconductor regions 6pa, 6pa1 are formed in states similar to those of the n-type semiconductor regions 6na of the nMISFETs in this embodiment 3, and the formed states shall therefore be omitted from description. The conductivity type of the pocket region 5na formed between the gate electrodes 3A, 3A adjacent to each other is mostly cancelled by this step (in FIG. 51, the pocket region 5na is slightly left behind at the bottom part of the p$^-$-type semiconductor region 6pa), but the other pocket regions 5na, 5nb are left behind at the side parts and bottom parts of the p$^-$-type semiconductor regions 6pa.

Figure 52:
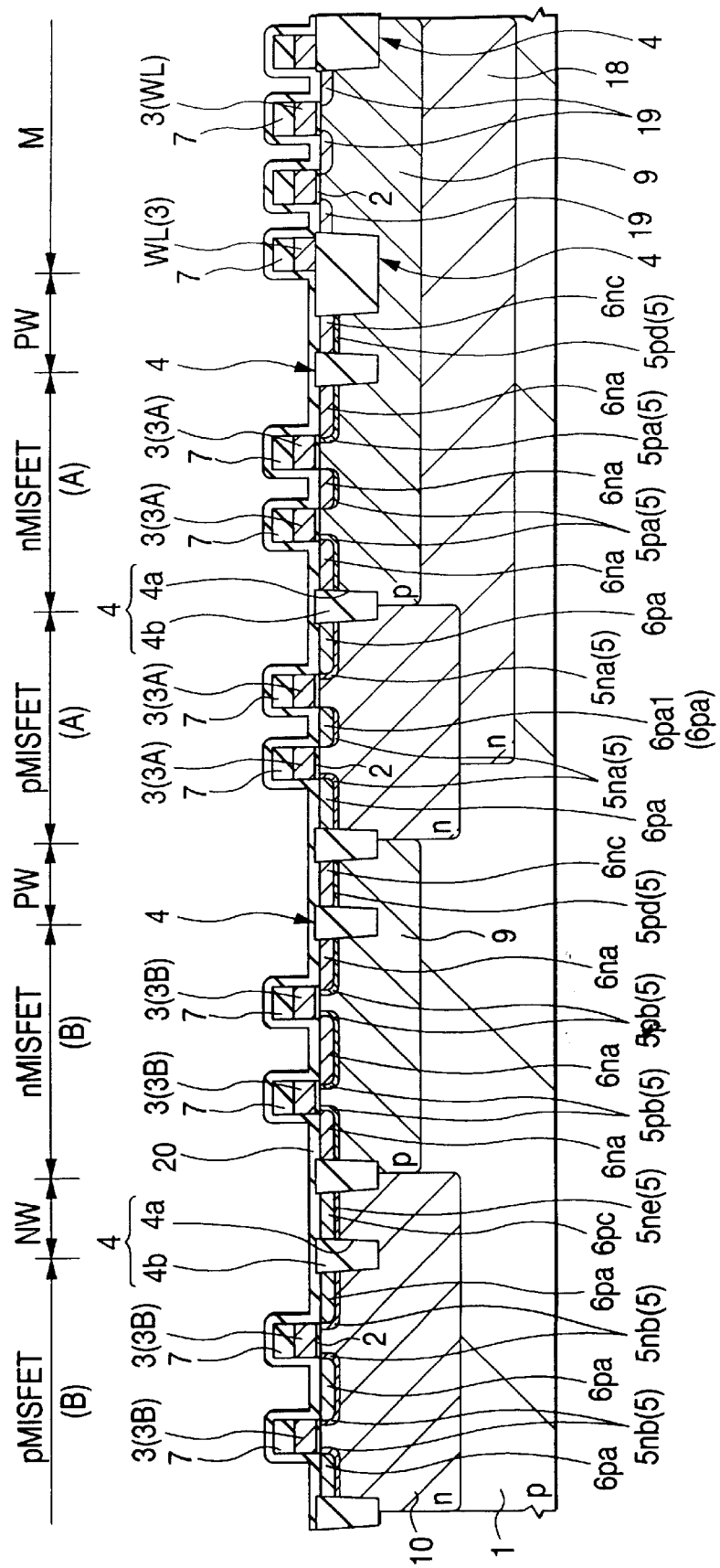
FIG. 52 is a sectional view of essential portions during the manufacturing process of the semiconductor device as succeeds to the process shown in FIG. 51.
Figure 53:
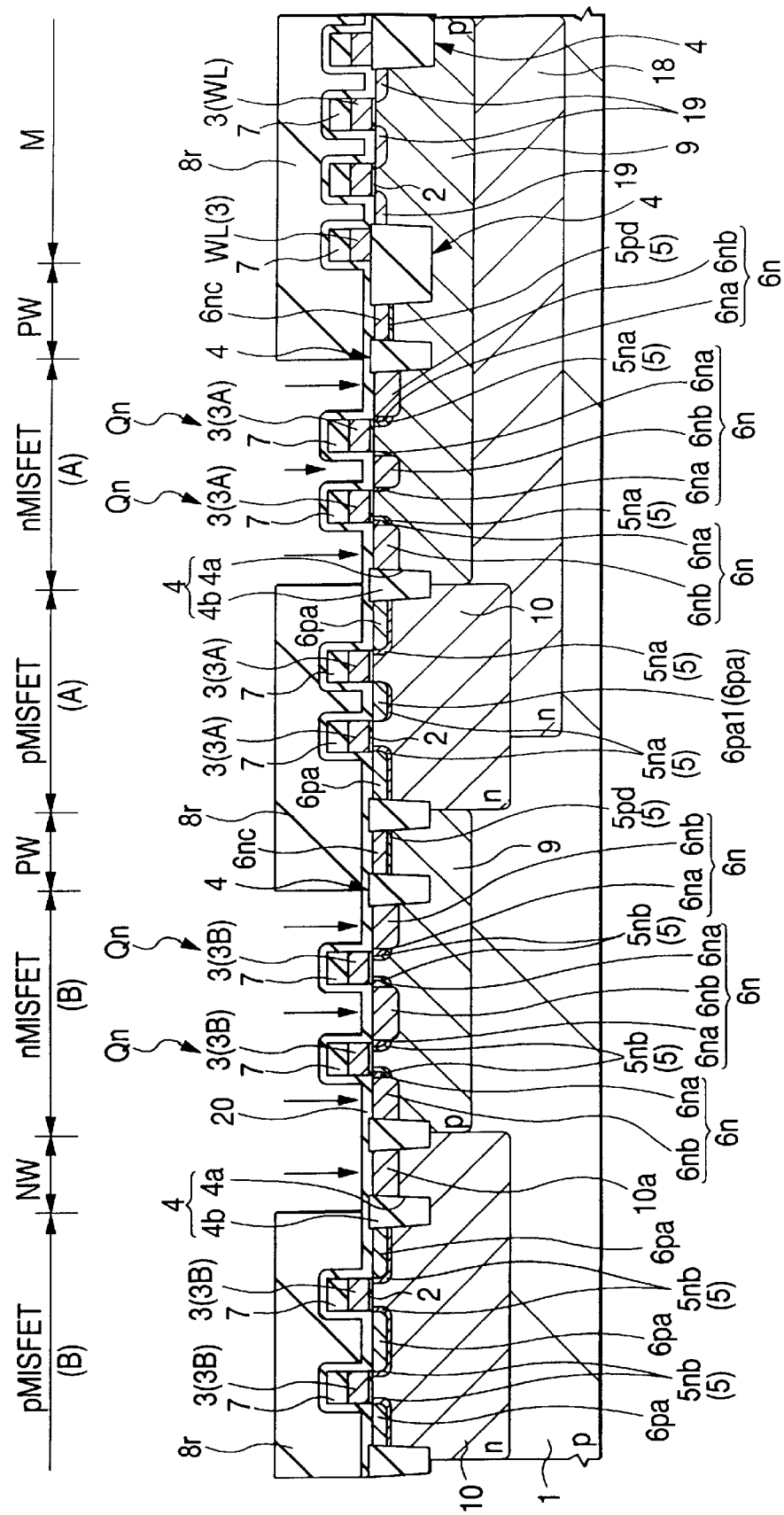
FIG. 53 is a sectional view of essential portions during the manufacturing process of the semiconductor device as succeeds to the process shown in FIG. 52.

Subsequently, as shown in FIG. 52, an insulator film 20 is deposited on the principal surface of the semiconductor substrate 1 by CVD or the like in the same way as in Embodiment 2. Further, as shown in FIG. 53, a photoresist film 8r which denudes the nMISFET forming regions and the n-well feeding region NW and which covers the other regions is formed on the insulator film 20. Thereafter, using the photoresist film 8r as a mask, the ions of, for example, phosphorus or arsenic for forming the sources and drains of the nMISFETs are implanted in the same way as in Embodiment 2. Thus, the n$^+$-type semiconductor regions 6nb of the nMISFETs Qn and the n$^+$-type semiconductor regions 10a for n-well feeding are formed in the semiconductor substrate 1. The nMISFETs Qn are formed via such a step. By the way, the structure of the nMISFETs Qn in Embodiment 3 is the same as in Embodiment 1 or 2 and shall be omitted from description.

Figure 54:
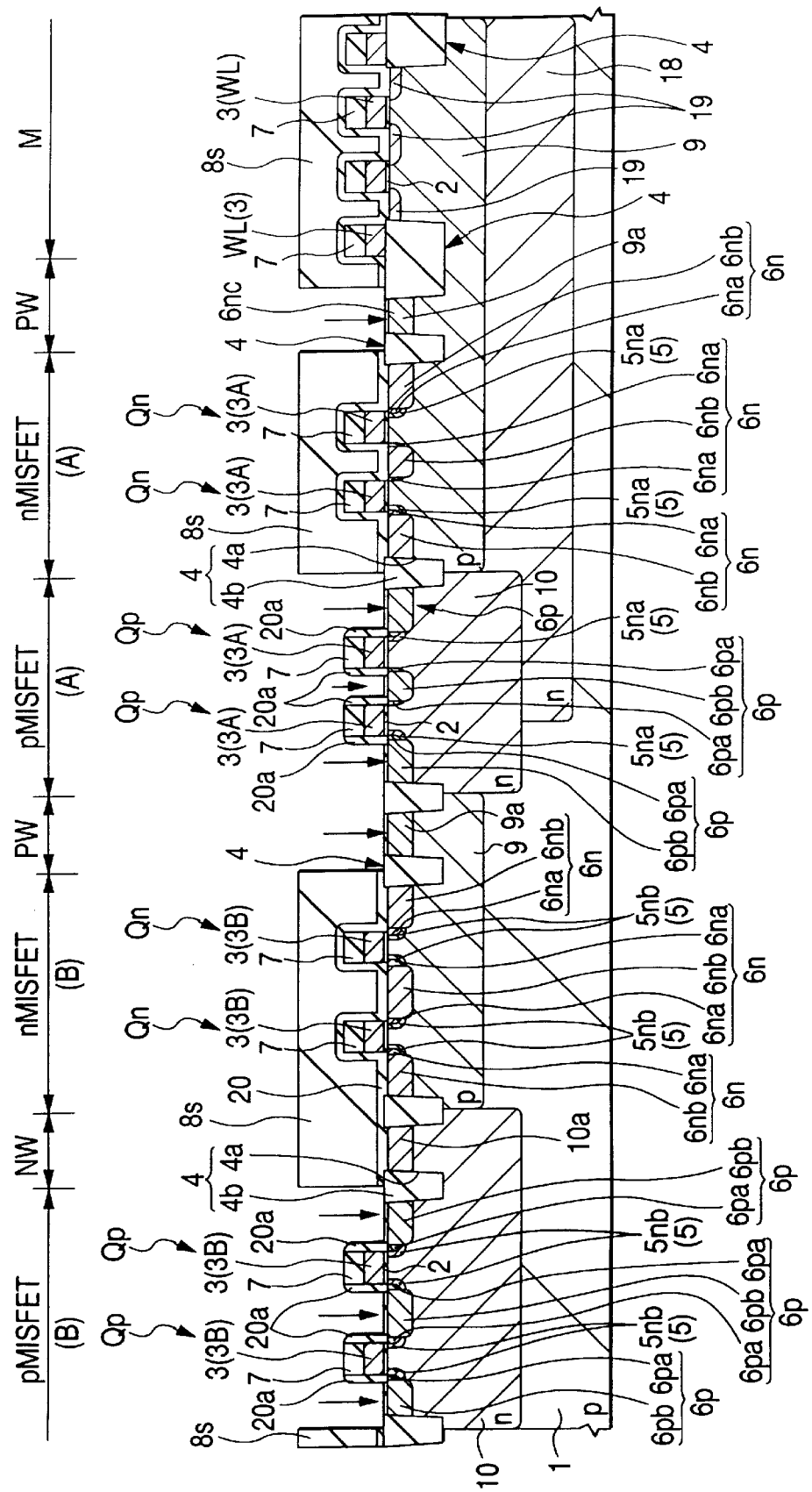
FIG. 54 is a sectional view of essential portions during the manufacturing process of the semiconductor device as succeeds to the process shown in FIG. 53.

Thereafter, the photoresist film 8r is removed. As shown in FIG. 54, a photoresist film 8s which denudes the pMISFET forming regions and the p-well feeding regions PW and which covers the other regions is formed on the principal surface of the semiconductor substrate 1. Subsequently, side walls 20a are formed on the side surfaces of the gate electrodes 3 in the same way as in Embodiment 2. Using the photoresist film 8s as a mask, the ions of, for example, boron for forming the sources and drains of the pMISFETs are implanted into the semiconductor substrate 1 in the same way as in Embodiment 1 or 2, thereby to form the p+-type semiconductor regions 6pb of the pMISFETs Qp and the p-type semiconductor regions 9a for p-well feeding. Thus, the semiconductor regions 6p for the sources and drains, each of which is constituted by the p$^-$-type semiconductor region 6pa and the p$^+$-type semiconductor region 6pb, are formed in the semiconductor substrate 1. The pMISFETs Qp are formed via such a step. In Embodiment 2, the pMISFETs Qp do not have the semiconductor regions 6pa of p—type, whereas in Embodiment 3, each pMISFET Qp is formed with the semiconductor regions 6pa of p$^-$-type. Each of the p$^-$-type semiconductor regions 6pa is formed so as to lie in touch with the end part of the semiconductor region 6pb of p$^+$-type near to the channel and to somewhat underlie the end part of the gate electrode 3. Besides, in Embodiment 2, the semiconductor regions 19 of ne-type are formed in the vicinities of both the ends of the p-type semiconductor region 6pb between the gate electrodes 3A, 3A, in the pMISFETs Qp having the gate electrodes 3A, and they function as the pocket region. In contrast, in Embodiment 3, the n$^-$-type semiconductor regions 19 are not formed. In Embodiment 3, the p$^+$-type semiconductor region 6pb and the p$^-$-type semiconductor regions 6pa, which touch both the ends of the region 6pb and which somewhat underlie the end parts of the gate electrodes 3A, are formed between the gate electrodes 3A, 3A.

Figure 55:
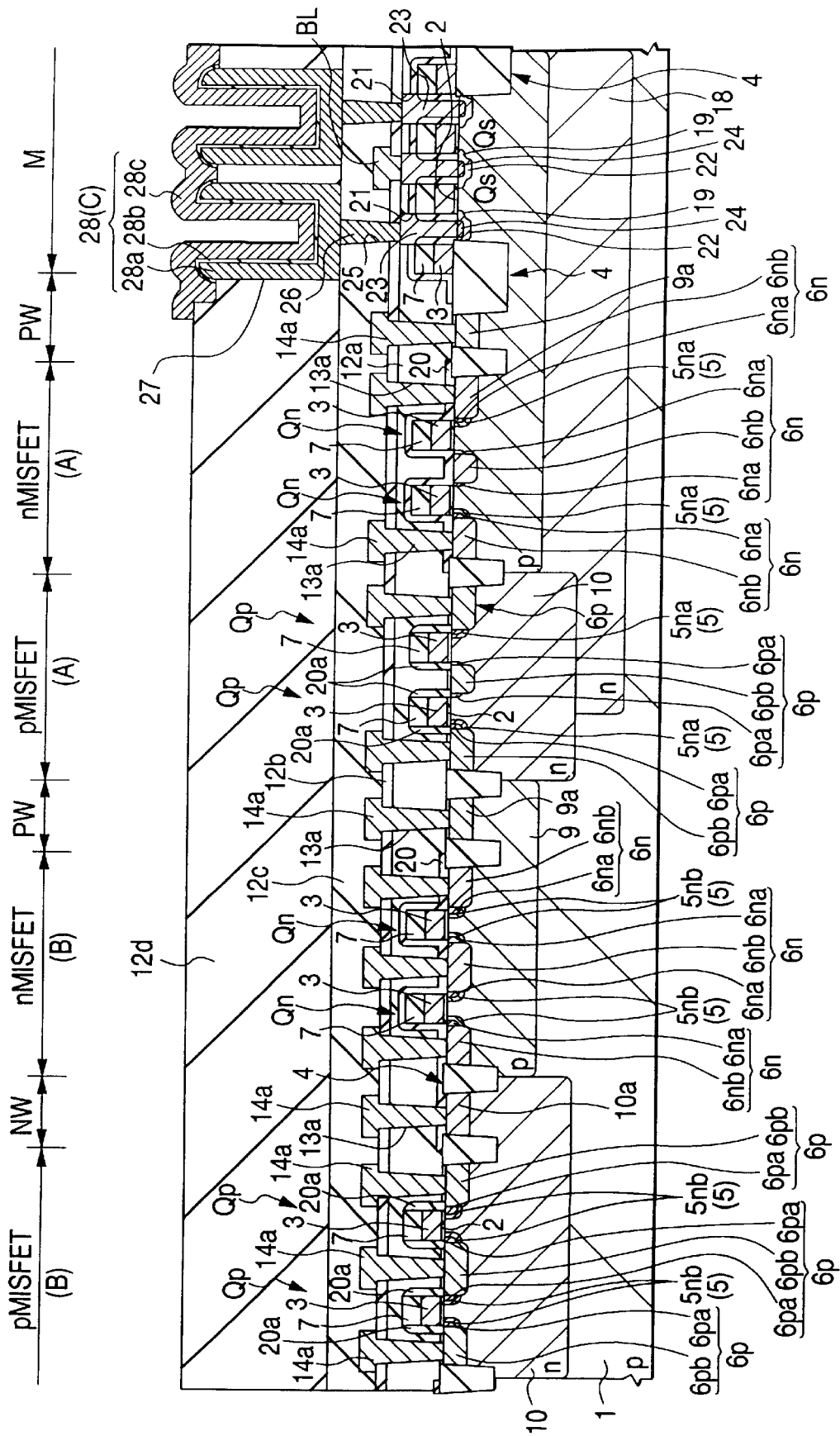
FIG. 55 is a sectional view of essential portions during the manufacturing process of the semiconductor device as succeeds to the process shown in FIG. 54.

Thenceforth, steps which are similar to those explained with reference to FIG. 40–FIG. 45 in Embodiment 2 are performed to produce a DRAM shown in FIG. 55.

According to Embodiment 3, the operating reliability of the MISFETs (particularly, pMISFETs Qp) can be enhanced more than in the case of Embodiment 2, in addition to bringing forth the effects attained by Embodiments 1 and 2.

(Embodiment 4)

Each of the foregoing embodiments 1–3 has been described concerning the case where the MISFETs each having the pocket regions in both the source and drain thereof, and the MISFETs each having the pocket region on only the drain side thereof, are formed on the identical semiconductor substrate. However, MISFETs to be formed on a semiconductor substrate include one which, when provided with a pocket region, has its threshold voltage raised and fails to operate as designed. Such a MISFET is used in, for example, a power source circuit for generating a reference potential.

Embodiment 4 therefore deals with a case where the MISFET, which does not require the pocket region or should preferably be provided with no pocket region by way of example, is formed on the identical semiconductor substrate.

Figure 56:
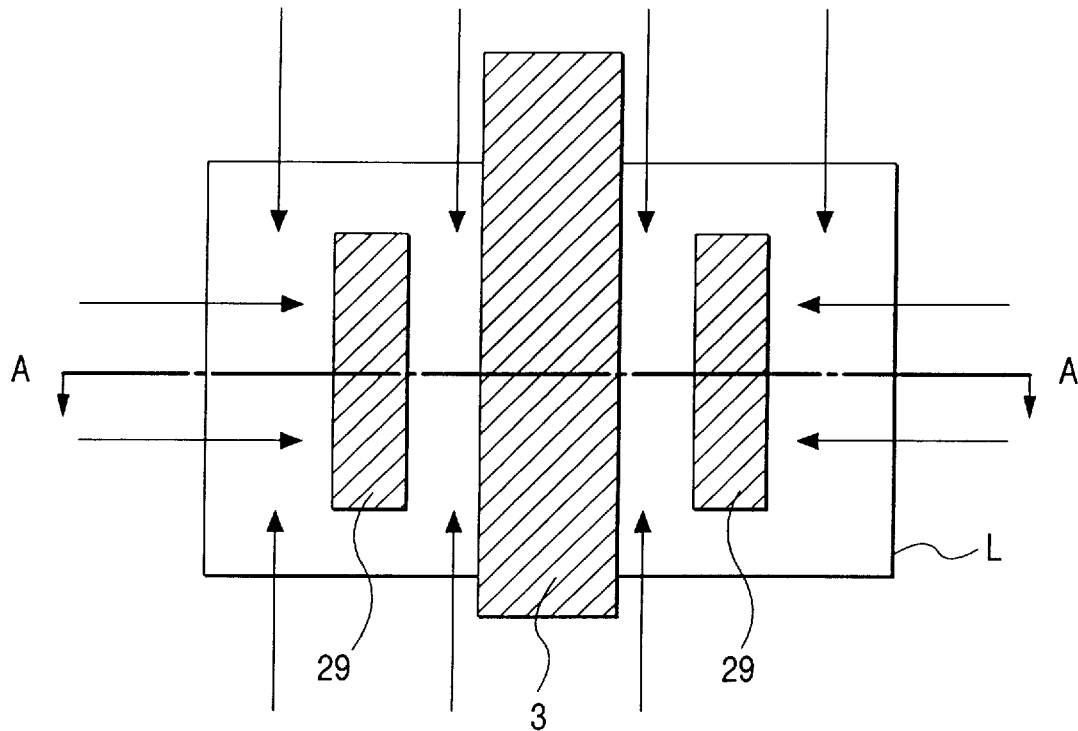
FIG. 56 is a plan view of essential portions during the manufacturing process of a semiconductor device in still another embodiment of the present invention.
Figure 57:
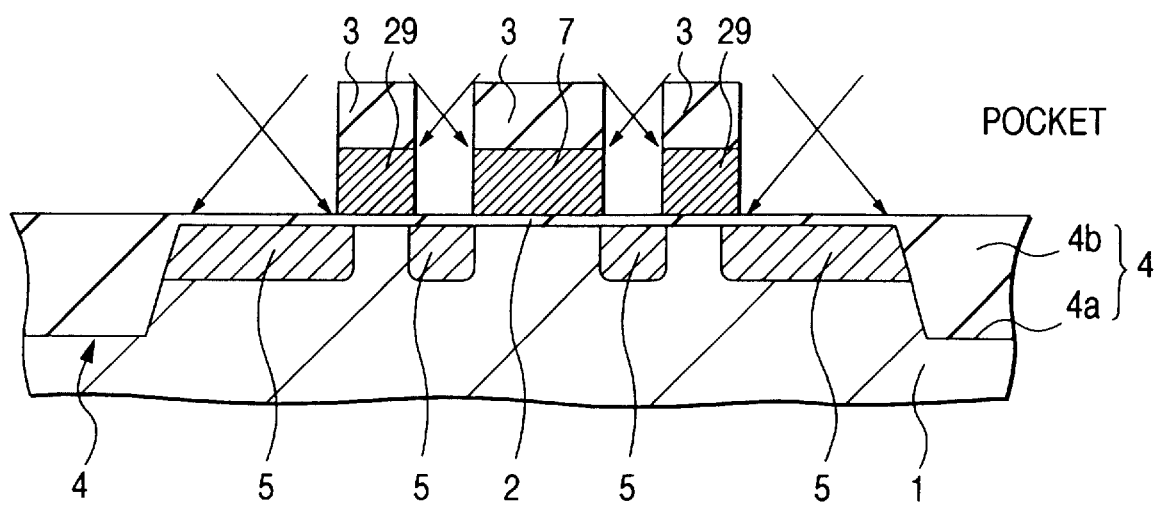
FIG. 57 is a sectional view of essential portions during the manufacturing process of the semiconductor device shown in FIG. 56.

FIG. 56 and FIG. 57 illustrate a plan view of a MISFET forming region in Embodiment 4, at the step of introducing the impurity for the suppression of the short channel effect in each of Embodiments 1–3, and a sectional view taken along line A—A indicated in FIG. 56, respectively. A gate electrode 3 is located overlying the central part of an oblong active area L so as to cross the active area L. Semiconductor regions for the source and drain of the MISFET are formed on both the sides of the gate electrode 3. Here in Embodiment 4, dummy patterns 29 are disposed in the vicinities of the gate electrode 3 and at a predetermined distance therefrom so as to extend in parallel with the gate electrode 3. The dummy patterns 29 are formed by the same step as that of patterning the gate electrode 3. For this reason, the number of manufacturing steps is not increased by the provision of the dummy patterns 29. Cap insulator films 7 are respectively formed on the gate electrode 3 and dummy patterns 29. By the way, arrows in FIGS. 56 and 57 indicate the directions of introducing the impurity as in each of Embodiments 1–3.

In such a MISFET forming region, at the step of introducing the impurity for the suppression of the short channel effect in each of Embodiments 1–3, the short-channel-effect suppressing impurity is intercepted by the dummy patterns 29 and is not introduced under the end parts of the gate electrode 3, as shown in FIG. 57. Accordingly, the end parts of pocket regions 5 do not come under the end parts of the gate electrode 3 (alternatively, granted that the end parts of the pocket regions 5 have come under the end parts of the gate electrode 3, they underlie these end parts only to the extent of being cancelled by later impurity diffusion from semiconductor regions for the source and drain).

Figure 58:
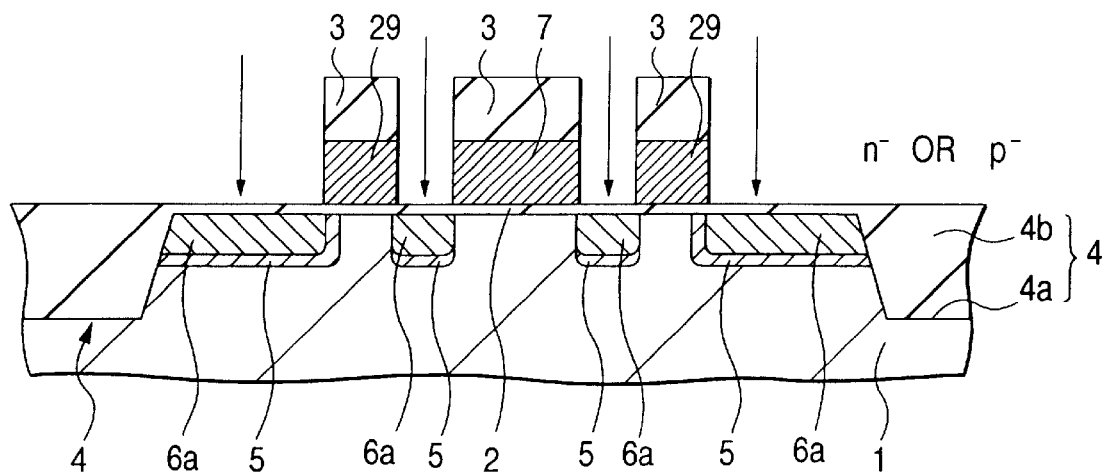
FIG. 58 is a sectional view of essential portions during the manufacturing process of the semiconductor device as succeeds to the process shown in FIG. 57.

FIG. 58 illustrates a sectional view of the semiconductor substrate 1 in the MISFET forming region in Embodiment 4, at the step of introducing the impurity for the formation of the lightly-doped semiconductor regions in each of Embodiments 1–3. The lightly-doped semiconductor regions 6a are formed by this step. At this step of introducing the impurity, the conductivity type of the pocket regions formed between the gate electrode 3 and the respective dummy patterns 29 is cancelled by the lightly-doped semiconductor regions 6a as in each of Embodiments 1–3. In other words, the pocket regions 5 disappear in places near the channel of the MISFET. By the way, in Embodiment 2, the impurity is introduced obliquely to the principal surface of the semiconductor substrate 1. Since, however, the impurity is introduced in the four directions, the pocket regions 5 result in the same state.

Figure 59:
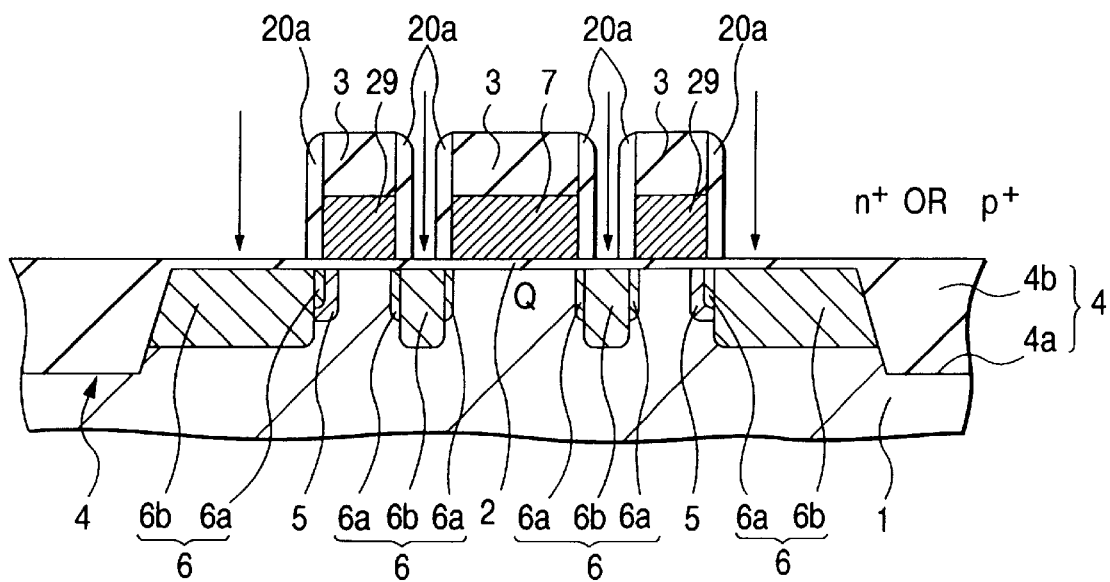
FIG. 59 is a sectional view of essential portions during the manufacturing process of the semiconductor device as succeeds to the process shown in FIG. 58.

Further, FIG. 59 illustrates a sectional view of the semiconductor substrate 1 in the MISFET forming region in Embodiment 4, at the step of introducing the impurity for the formation of the semiconductor regions for the sources and drains of the MISFETs in each of Embodiments 1–3. The heavily-doped semiconductor regions 6b are formed by this step, thereby to form the semiconductor regions 6 for the source and drain each being constituted by the lightly-doped semiconductor region 6a and the heavily-doped semiconductor region 6b. Here, the pocket regions 5 are not formed in the places which are near to the channel of the MISFET Q. Accordingly, the threshold voltage of the MISFET Q can be held low (as designed).

In this manner, according to Embodiment 4, the MISFET in which neither of the source and drain is provided with the pocket region can be formed on the identical semiconductor substrate without increasing the number of manufacturing steps.

Thus far, the invention made by the inventors has been concretely described on the basis of the embodiments thereof. Needless to say, however, the present invention is not restricted to the foregoing embodiments, but it is variously alterable within a scope not departing from the purport thereof.

By way of example, the capacitance element for storing information has been explained as one of crown type in the foregoing embodiments 2 and 3, However, the capacitance element is not restricted to the crown type, but it may well be of any of various types including a fin type.

Besides, the isolation portions have been explained as ones of trench type in the foregoing embodiments 1–4. However, the isolation portions are not restricted to the trench type, but they may well be made of, for example, a field insulator film formed by LOCOS (Local Oxidization of Silicon).

Effects which are attained by a typical exemplary aspect of performance of the present invention are briefly explained as follows:

According to the present invention, the common source region of field effect transistors is arranged between a first gate electrode and a second gate electrode which are adjacent to each other, the drain regions of the field effect transistors are respectively arranged in second and third regions, and a semiconductor region which is formed by introducing an impurity for the suppression of a short channel effect into a semiconductor substrate is not disposed on the source region side and is disposed on each drain region side. Thus, the spread of a depletion layer from the drain region side can be suppressed to restrain degradation in the performance of the field effect transistor, and the interval between the first and second gate electrodes adjacent to each other can be narrowed to enhance the packaging density of the elements.

What is claimed is:

1. A method of manufacturing a semiconductor device having a semiconductor substrate and a plurality of field effect transistors provided thereon, comprising the steps of:

(a) forming gate electrodes of the plurality of field effect transistors on the semiconductor substrate, the gate electrodes including a first gate electrode which has a first side as well as a second side crossing the first side, and a second gate electrode which has a third side as well as a fourth side crossing the third side; and (b) thereafter introducing an impurity into and aslant said semiconductor substrate, the impurity serving to suppress a short channel effect of said field effect transistors;

said first gate electrode and said second gate electrode being formed in a state where they are adjacent to each other with the first side and the third side confronting each other, in order that said impurity for suppressing the short channel effect, which is introduced into said semiconductor substrate in first directions crossing said first side and said third side when viewed in plan, may be hindered by said first gate electrode and said second gate electrode from being introduced into that first region of said semiconductor substrate which lies between said first gate electrode and said second gate electrode.

2. A method of manufacturing a semiconductor device having a semiconductor substrate and a plurality of field effect transistors provided thereon, comprising the steps of:

(a) forming gate electrodes of the plurality of field effect transistors on the semiconductor substrate, the gate electrodes including a first gate electrode which has a first side as well as a second side crossing the first side, and a second gate electrode which has a third side as well as a fourth side crossing the third side; and (b) thereafter introducing an impurity into and aslant said semiconductor substrate, the impurity serving to suppress a short channel effect of said field effect transistors;

said first gate electrode and said second gate electrode being formed in a state where they are adjacent to each other with said first side and said third side confronting each other, in order that said impurity, for suppressing the short channel effect, which is introduced into said semiconductor substrate in first directions crossing said first side and said third side when viewed in plan, may be hindered by said first gate electrode and said second gate electrode from being introduced into a first region of said semiconductor substrate which lies between said first gate electrode and said second gate electrode, and that said impurity may be introduced into a second region of said semiconductor substrate which has said first gate electrode interposed between it and said first region when viewed in plan, and a third region of said semiconductor substrate which has said second gate electrode interposed between it and said first region when viewed in plan.

3. A method of manufacturing a semiconductor device according to claim 2, wherein said impurity for suppressing said short channel effect-is introduced into said semiconductor substrate in both the first directions and second directions crossing said first directions.

4. A method of manufacturing a semiconductor device according to claim 2, wherein gate lengths which are respectively defined by said first gate electrode and said second gate electrode are relatively greater than a gate length which is defined by another predetermined gate electrode formed on said semiconductor substrate.

5. A method of manufacturing a semiconductor device according to claim 2, wherein the first field effect transistor having said first gate electrode, and the second field effect transistor having said second gate electrode are provided in regions which are formed in said semiconductor substrate, and to which voltages of predetermined potentials can be applied independently or which fall into a state equivalent to such voltage application.

6. A method of manufacturing a semiconductor device according to claim 2, comprising the step of introducing an impurity after the step (a) by employing said first gate electrode and said second gate electrode as a mask, the impurity serving to form a source region and drain regions of said field effect transistors.

7. A method of manufacturing a semiconductor device according to claim 6, wherein said step of introducing said impurity for forming the source region and the drain regions of said field effect transistors, comprises the substeps of:

introducing a first impurity into said semiconductor substrate, thereby to form first semiconductor regions of relatively low impurity concentration; and introducing a second impurity into said semiconductor substrate, thereby to form second semiconductor regions whose impurity concentration is relatively higher than that of the first semiconductor regions and which has the same conductivity as that of said first semiconductor regions.

8. A method of manufacturing a semiconductor device according to claim 6, wherein the source region of said first field effect transistor having said first gate electrode and said second field effect transistor having said second gate electrode is formed in the first region lying between said first gate electrode and said second gate electrode, the drain region of said first field effect transistor is formed in the second region, and the drain region of said second field effect transistor is formed in the third region.

9. A method of manufacturing a semiconductor device according to claim 8, wherein a semiconductor region in which said impurity for suppressing said short channel effect is introduced is not formed between said source region and each of channels of said first field effect transistor and said second field effect transistor, and it is formed between each of said drain regions and the corresponding one of the channels of said first field effect transistor and said second field effect transistor.

10. A method of manufacturing a semiconductor device having a semiconductor substrate with a first field effect transistor, a second field effect transistor which is adjacent to the first field effect transistor, and a third field effect transistor which lies at a position distant from the first and second field effect transistors, comprising the steps of:

(a) forming on the semiconductor substrate a first gate electrode of said first field effect transistor which has a first side as well as a second side crossing the first side, a second gate electrode of the second field effect transistor which has a third side as well as a fourth side crossing the third side, and a third gate electrode of the third field effect transistor which has a fifth side as well as a sixth side crossing the fifth side; and (b) thereafter introducing an impurity into and aslant said semiconductor substrate, the impurity serving to suppress a short channel effect of the field effect transistors;

said first gate electrode and said second gate electrode being formed in a state where they are adjacent to each other with said first side and said third side confronting each other, in a region for forming said first field effect transistor and said second field effect transistor, in order that said impurity for suppressing the short channel effect, which is introduced into said semiconductor substrate in first directions crossing said first side and said third side when viewed in plan, may be hindered by said first gate electrode and said second gate electrode from being introduced into a first region of said semiconductor substrate which lies between said first gate electrode and said second gate electrode, and that said impurity may be introduced into a second region of said semiconductor substrate which has said first gate electrode interposed between it and said first region when viewed in plan, and a third region of said semiconductor substrate which has said second gate electrode interposed between it and said first region when viewed in plan;

said third gate electrode being formed in a region for forming said third field effect transistor, in order that said impurity for suppressing said short channel effect, which is introduced into said semiconductor substrate in the first directions, may be introduced into a fourth region and a fifth region of said semiconductor substrate which has said third gate electrode therebetween when viewed in plan.

11. A method of manufacturing a semiconductor device according to claim 10, wherein said impurity for suppressing said short channel effect is introduced into said semiconductor substrate in both the first directions and second directions crossing said first directions.

12. A method of manufacturing a semiconductor device according to claim 10, wherein gate lengths which are respectively defined by said first gate electrode and said second gate electrode are relatively greater than a gate length which is defined by said third gate electrode.

13. A method of manufacturing a semiconductor device according to claim 10, wherein said first field effect transistor and said second field effect transistor are provided in regions which are formed in said semiconductor substrate, and to which voltages of predetermined potentials can be applied independently or which fall into a state equivalent to such voltage application.

14. A method of manufacturing a semiconductor device according to claim 10, comprising the steps of:

forming a gate electrode of a field effect transistor for selecting a memory cell, on said semiconductor substrate, in performing the step (a);

forming a mask on a region for forming the memory-cell selecting field effect transistor, before the step (b);

introducing an impurity for forming a pair of semiconductor regions of said memory-cell selecting field effect transistor, into the whole surface of said semiconductor substrate without forming a mask on said semiconductor substrate, after said step (a) and before said step (b); and forming an information storing capacitance element which is electrically connected with the pair of semiconductor regions of said memory-cell selecting field effect transistor, after the step of introducing the impurity forming said pair of semiconductor regions of said memory-cell selecting field effect transistor.

15. A method of manufacturing a semiconductor device according to claim 10, comprising the step of introducing an impurity after the step (a) by employing said first gate electrode, said second gate electrode and said third gate electrode as a mask, the impurity serving to form source regions and drain regions of said first field effect transistor, said second field effect transistor and said third field effect transistor.

16. A method of manufacturing a semiconductor device according to claim 15, wherein said step of introducing said impurity for forming the source regions and the drain regions of said field effect transistors, comprises the substeps of:

introducing a first impurity into said semiconductor substrate, thereby to form first semiconductor regions of relatively low impurity concentration; and introducing a second impurity into said semiconductor substrate, thereby to form second semiconductor regions whose impurity concentration is relatively higher than that of the first semiconductor regions and which has the same conductivity as that of said first semiconductor regions.

17. A method of manufacturing a semiconductor device according to claim 16, wherein the source region of said first field effect transistor and said second field effect transistor is formed in the first region lying between said first gate electrode and said second gate electrode, the drain region of said first field effect transistor is formed in the second region, and the drain region of said second field effect transistor is formed in the third region.

18. A method of manufacturing a semiconductor device according to claim 17, wherein a semiconductor region in which said impurity for suppressing said short channel effect is introduced is not formed between said source region and each of channels of said first field effect transistor and said second field effect transistor, it is formed between each of said drain regions and the corresponding one of the channels of said first field effect transistor and said second field effect transistor, and it is formed between a channel of said third field effect transistor and each of the fourth region and the fifth region.

19. A method of manufacturing a semiconductor device having a semiconductor substrate with a first field effect transistor, a second field effect transistor which is adjacent to the first field effect transistor, and a third field effect transistor which is spaced from the first and second field effect transistors, comprising the steps of:

(a) forming on the semiconductor substrate a first gate electrode of said first field effect transistor which has a first side as well as a second side crossing the first side, a second gate electrode of the second field effect transistor which has a third side as well as a fourth side crossing the third side, a third gate electrode of the third field effect transistor which has a fifth side as well as a sixth side crossing the fifth side, and dummy patterns which hold said third gate electrode therebetween; and (b) thereafter introducing an impurity into and aslant said semiconductor substrate, the impurity serving to suppress a short channel effect of the field effect transistors;

said first gate electrode and said second gate electrode being formed in a state where they are adjacent to each other with said first side and said third side confronting each other, in a region for forming said first field effect transistor and said second field effect transistor, in order that said impurity for suppressing the short channel effect, which is introduced into said semiconductor substrate in first directions crossing said first side and said third side when viewed in plan, may be hindered by said first gate electrode and said second gate electrode from being introduced into a first region of said semiconductor substrate which lies between said first gate electrode and said second gate electrode, and such that said impurity may be introduced into a second region of said semiconductor substrate which has said first gate electrode interposed between it and said first region when viewed in plan, and a third region of said semiconductor substrate which has said second gate electrode interposed between it and said first region when viewed in plan;

said third gate electrode and the dummy patterns being formed in a state where they are adjacent to one another, in a region for forming said third field effect transistor, in order that said impurity for suppressing said short channel effect, which is introduced into said semiconductor substrate in said first directions, may be hindered by said third gate electrode and said dummy patterns from being introduced into respective regions of said semiconductor substrate which lie between said third gate electrode and said dummy patterns.

20. A method of manufacturing a semiconductor device according to claim 19, wherein a semiconductor region in which said impurity for suppressing said short channel effect is introduced is formed neither between a source region of said first field effect transistor and said second field effect transistor and each of channels of the first and second transistors, nor between a channel of said third field effect transistor and each of a source region and a drain region of the third transistor, and it is formed between each of drain regions of said first field effect transistor and said second field effect transistor and the corresponding one of the channels of said first and second transistors.

21. A method of manufacturing a semiconductor device having a semiconductor substrate with a first field effect transistor, a second field effect transistor which is adjacent to the first field effect transistor, and a third field effect transistor which lies at a position distant from the first and second field effect transistors, comprising the steps of:

(a) forming on the semiconductor substrate a first gate electrode of said first field effect transistor which has a first side as well as a second side crossing the first side, a second gate electrode of the second field effect transistor which has a third side as well as a fourth side crossing the third side, and a third gate electrode of the third field effect transistor which has a fifth side as well as a sixth side crossing the fifth side; and (b) thereafter introducing an impurity into and aslant said semiconductor substrate, the impurity serving to suppress a short channel effect of the field effect transistors;

said first gate electrode and said second gate electrode being formed at the step (a) in a state where they are adjacent to each other with said first side and said third side confronting each other, in a region for forming said first field effect transistor and said second field effect transistor, in order that said impurity for suppressing the short channel effect, which is introduced into said semiconductor substrate in first directions crossing said first side and said third side when viewed in plan, may be hindered by said first gate electrode and said second gate electrode from being introduced into a first region of said semiconductor substrate which lies between said first gate electrode and said second gate electrode;

said third gate electrode being formed in a region for forming said third field effect transistor, in order that said impurity for suppressing said short channel effect, which is introduced into said semiconductor substrate in the first directions, may be introduced into a fourth region and a fifth region of said semiconductor substrate which hold said third gate electrode therebetween when viewed in plan;

whereby a threshold voltage of said first field effect transistor as well as said second field effect transistor is made different from that of said third field effect transistor.

22. A semiconductor device comprising a semiconductor substrate with a first field effect transistor which includes a first gate electrode having a first side and a second side crossing the first side, and a second field effect transistor which includes a second gate electrode having a third side and a fourth side crossing the third side, the first and second field effect transistors adjoining each other, wherein:

said first field effect transistor includes a first region which is formed in said semiconductor substrate between said first gate electrode and said second gate electrode, and a second region which has said first gate electrode interposed between it and said first region when viewed in plan;

said second field effect transistor includes said first region, and a third region which has said second gate electrode interposed between it and said first region when viewed in plan; and said first gate electrode and said second gate electrode are disposed in a state where they are adjacent to each other with said first side and said third side confronting each other, in order that an impurity for suppressing a short channel effect of said field effect transistors, which is introduced into said semiconductor substrate in first directions crossing said first side and said third side when viewed in plan, may be hindered by said first gate electrode and said second gate electrode from being introduced into said first region of said semiconductor substrate, and that the impurity may be introduced into said second region and said third region of said semiconductor substrate.

23. A semiconductor device according to claim 22, wherein gate lengths which are respectively defined by said first gate electrode and said second gate electrode are relatively greater than a gate length which is defined by another predetermined gate electrode formed on said semiconductor substrate.

24. A semiconductor device according to claim 22, wherein said first field effect transistor and said second field effect transistor are provided in regions which are formed in said semiconductor substrate, and to which voltages of predetermined potentials can be applied independently or which fall into a state equivalent to such voltage application.

25. A semiconductor device according to claim 22, wherein a source region of said first field effect transistor and said second field effect transistor is provided in said first region, a drain region of said first field effect transistor is provided in said second region, and a drain region of said second field effect transistor is provided in said third region.

26. A semiconductor device according to claim 25, wherein a semiconductor region in which said impurity for suppressing said short channel effect is introduced is not formed between said source region and each of channels of said first field effect transistor and said second field effect transistor, and it is formed between each of said drain regions and the corresponding one of the channels of said first field effect transistor and said second field effect transistor.

* * * * *